(12) United States Patent
Arai

(10) Patent No.: US 11,849,580 B2
(45) Date of Patent: Dec. 19, 2023

(54) MEMORY DEVICE AND METHOD OF CONTROLLING MEMORY DEVICE

(71) Applicant: Kioxia Corporation, Tokyo (JP)

(72) Inventor: Fumitaka Arai, Mie (JP)

(73) Assignee: Kioxia Corporation, Tokyo (JP)

( * ) Notice: Subject to any disclaimer, the term of this patent is extended or adjusted under 35 U.S.C. 154(b) by 204 days.

(21) Appl. No.: 17/477,117

(22) Filed: Sep. 16, 2021

(65) Prior Publication Data
US 2022/0246633 A1 Aug. 4, 2022

(30) Foreign Application Priority Data

Feb. 2, 2021 (JP) .................................. 2021-015252

(51) Int. Cl.
*G11C 7/12* (2006.01)
*G11C 7/14* (2006.01)
(Continued)

(52) U.S. Cl.
CPC .......... *H10B 43/20* (2023.02); *G11C 11/5628* (2013.01); *G11C 11/5642* (2013.01); *G11C 11/5671* (2013.01); *G11C 16/0483* (2013.01); *G11C 16/08* (2013.01); *G11C 16/10* (2013.01); *G11C 16/24* (2013.01); *G11C 16/26* (2013.01); *G11C 16/3459* (2013.01); *H10B 41/20* (2023.02); *H10B 41/41* (2023.02); *H10B 43/40* (2023.02)

(58) Field of Classification Search
CPC ........ H10B 43/20; H10B 41/20; H10B 41/41; H10B 43/40; H10B 41/40; G11C 11/5628; G11C 11/5642; G11C 11/5671; G11C 16/0483; G11C 16/08; G11C 16/10; G11C 16/24; G11C 16/26; G11C 16/3459; G11C 16/32; G11C 2211/5648; G11C 29/021; G11C 29/028; G11C 5/025; G11C 11/00; G11C 16/06; G11C 16/34
See application file for complete search history.

(56) References Cited

U.S. PATENT DOCUMENTS 10,056,433 B2 8/2018 Kiyotoshi et al.
2008/0006885 A1 1/2008 Arai et al.
(Continued)

FOREIGN PATENT DOCUMENTS

JP 2006-253461 A 9/2006
JP 2008-078404 A 4/2008
(Continued)

*Primary Examiner* — Hien N Nguyen
(74) *Attorney, Agent, or Firm* — Foley & Lardner LLP

(57) ABSTRACT

According to one embodiment, a memory device includes: first and second stacks each including a first semiconductor layers arranged in a first direction perpendicular to a surface of a substrate, the first and second stacks arranged in a second direction parallel to the surface of the substrate; a second semiconductor layer above the first stack in the first direction; a third semiconductor layer above the second stack in the first direction; memory cells between the first semiconductor layers and the word lines; a first transistor on the second semiconductor layer; and a second transistor on the third semiconductor layer. The first and second stacks are arranged at a first pitch, the first and second semiconductor layers are arranged at a second pitch equal to the first pitch.

12 Claims, 49 Drawing Sheets

(51) Int. Cl.

| | |
|---|---|
| *H10B 43/20* | (2023.01) |
| *G11C 16/04* | (2006.01) |
| *G11C 16/08* | (2006.01) |
| *G11C 11/56* | (2006.01) |
| *G11C 16/24* | (2006.01) |
| *G11C 16/26* | (2006.01) |
| *G11C 16/34* | (2006.01) |
| *G11C 16/10* | (2006.01) |
| *H10B 41/20* | (2023.01) |
| *H10B 41/41* | (2023.01) |
| *H10B 43/40* | (2023.01) |

(56) References Cited

U.S. PATENT DOCUMENTS

| | | | |
|---|---|---|---|
| 2019/0067321 A1* | 2/2019 | Song | H10B 43/35 |
| 2020/0176033 A1 | 6/2020 | Hosotani et al. | |
| 2020/0303300 A1* | 9/2020 | Kato | H01L 23/5283 |
| 2021/0013088 A1* | 1/2021 | Chen | H01L 24/94 |
| 2021/0091044 A1* | 3/2021 | Yamashita | H10B 43/50 |
| 2022/0216228 A1* | 7/2022 | Yamashita | H10B 43/27 |

FOREIGN PATENT DOCUMENTS

| | | |
|---|---|---|
| JP | 2011-134416 A | 7/2011 |
| JP | 2020-092141 A | 6/2020 |

\* cited by examiner

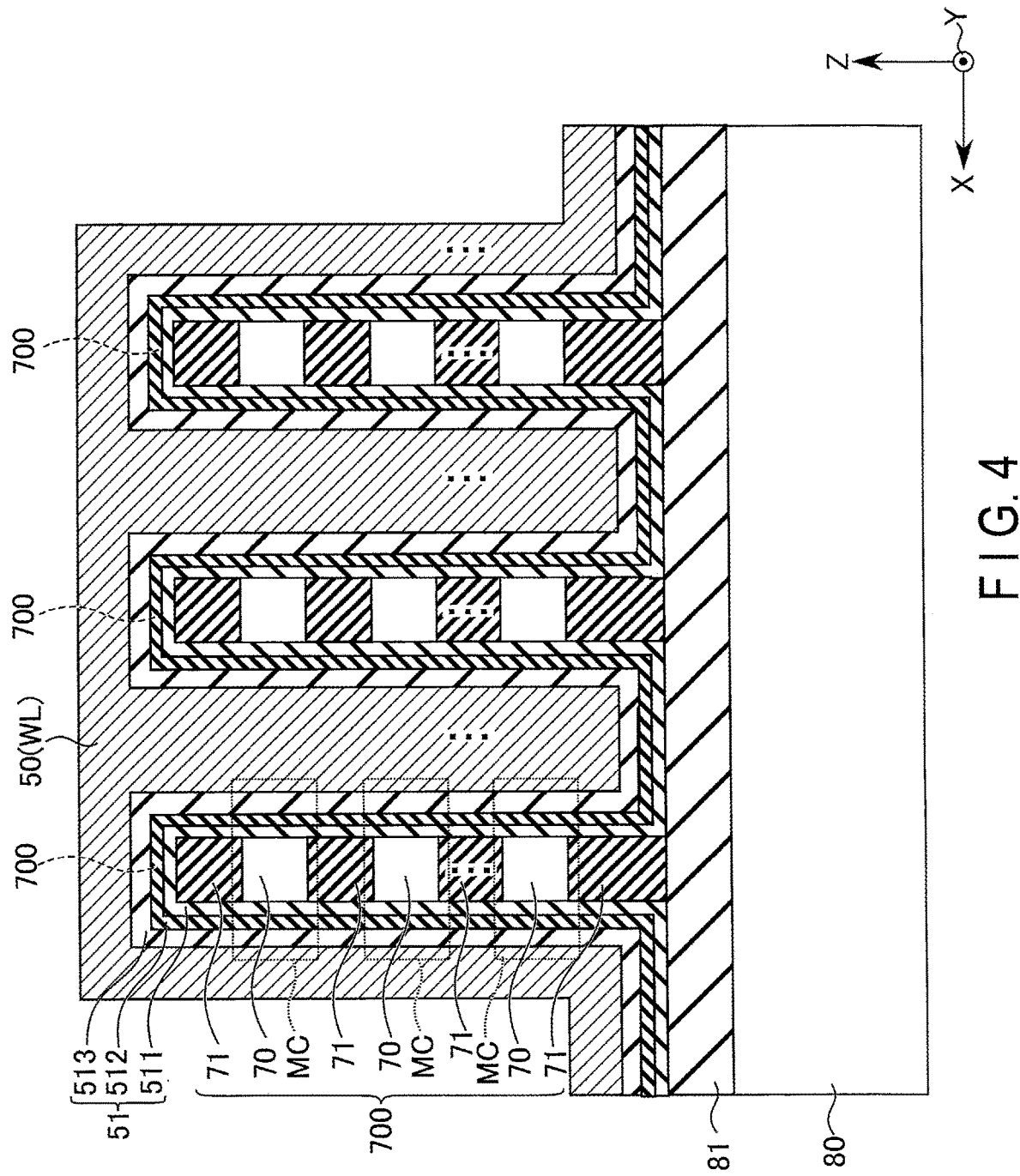
F I G. 4

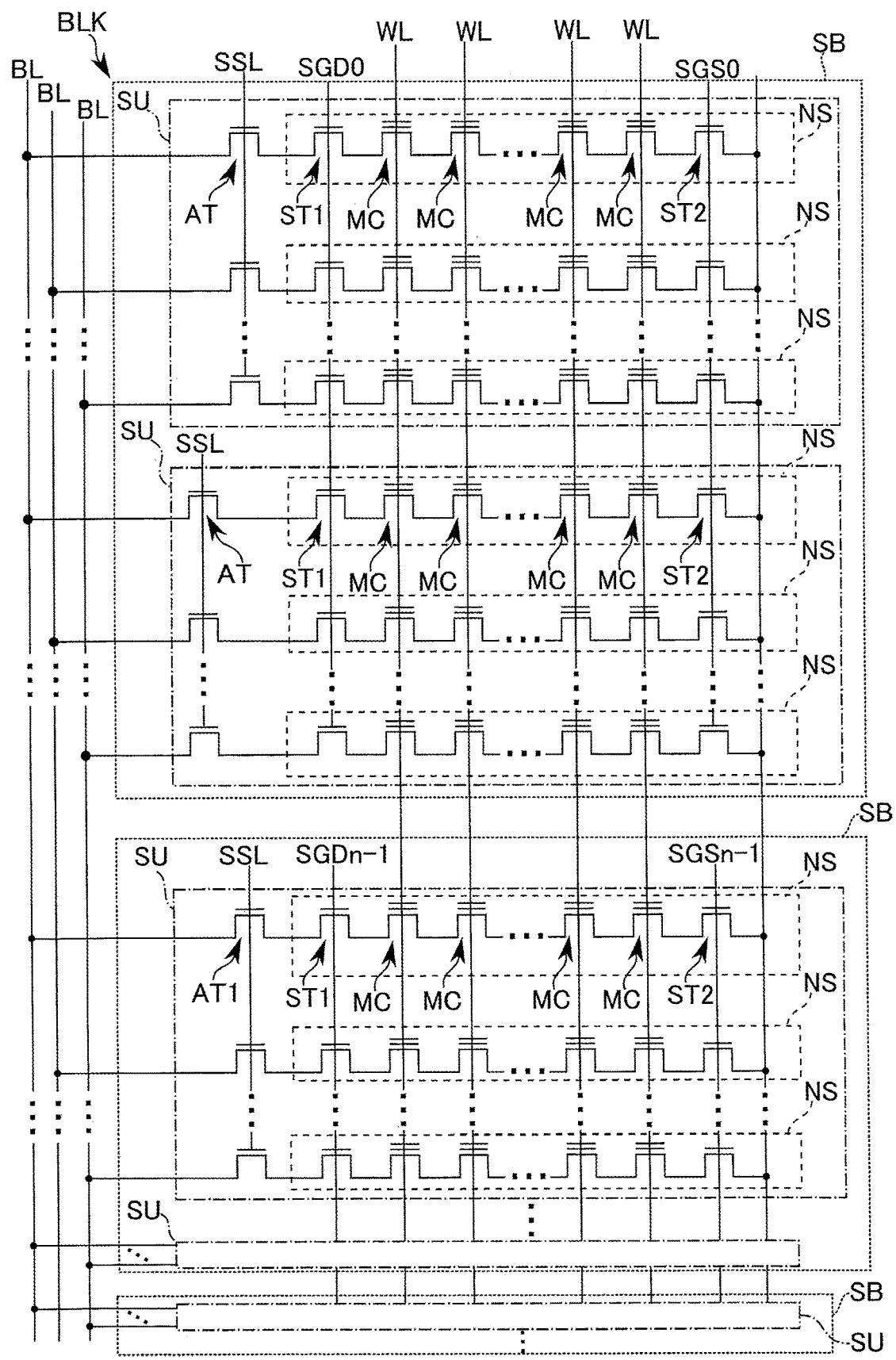
F I G. 6

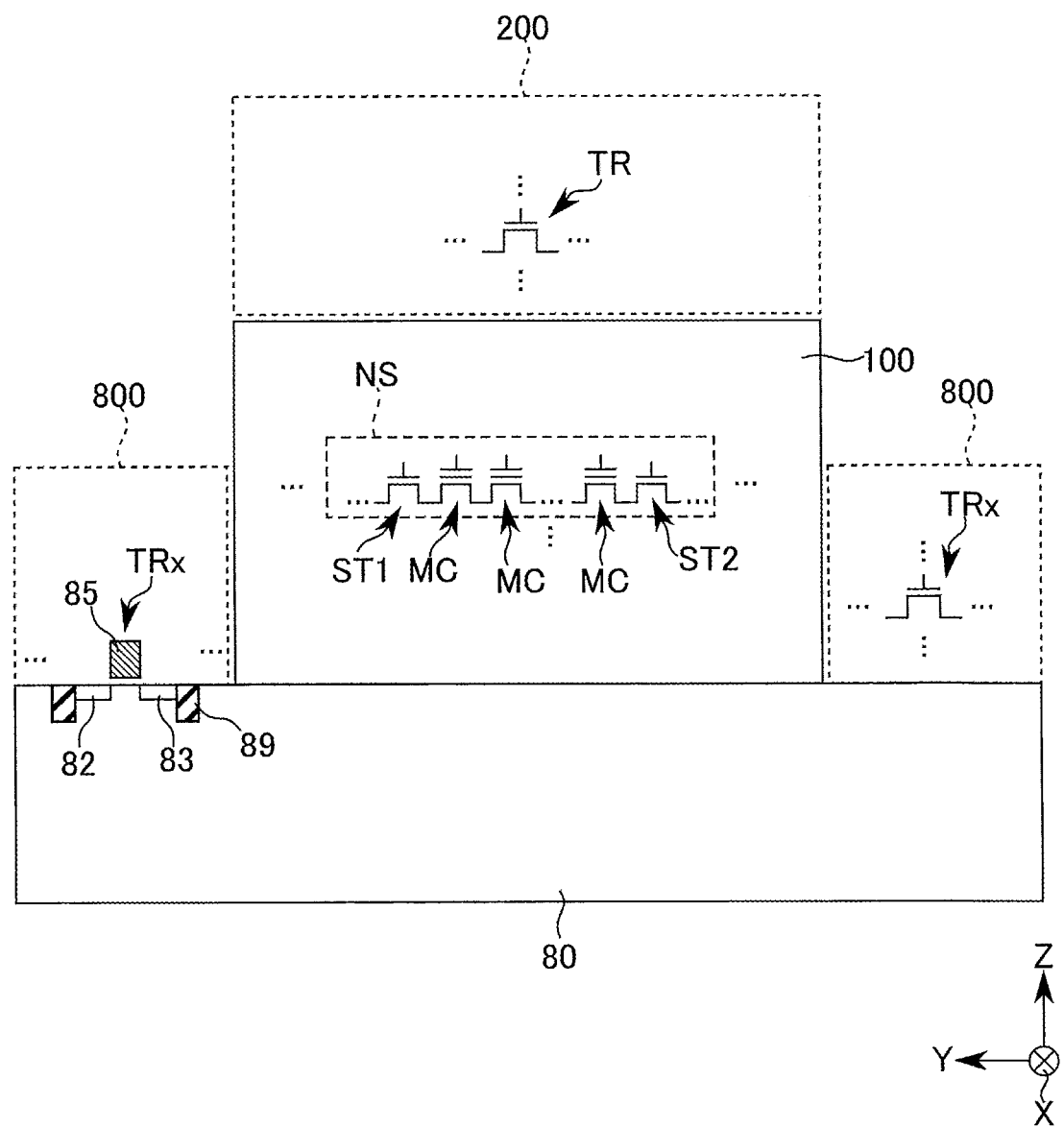
F I G. 7

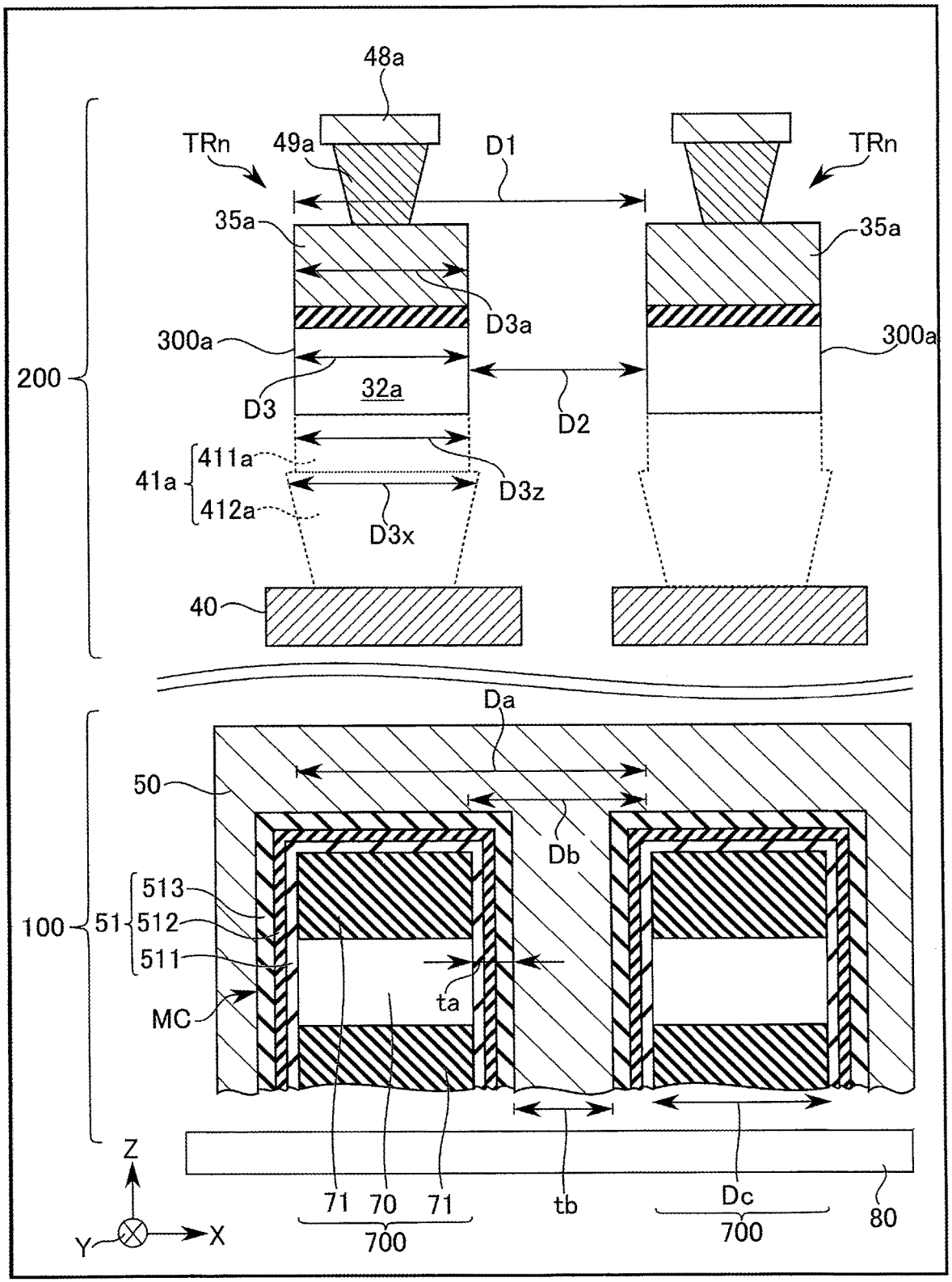
F I G. 11

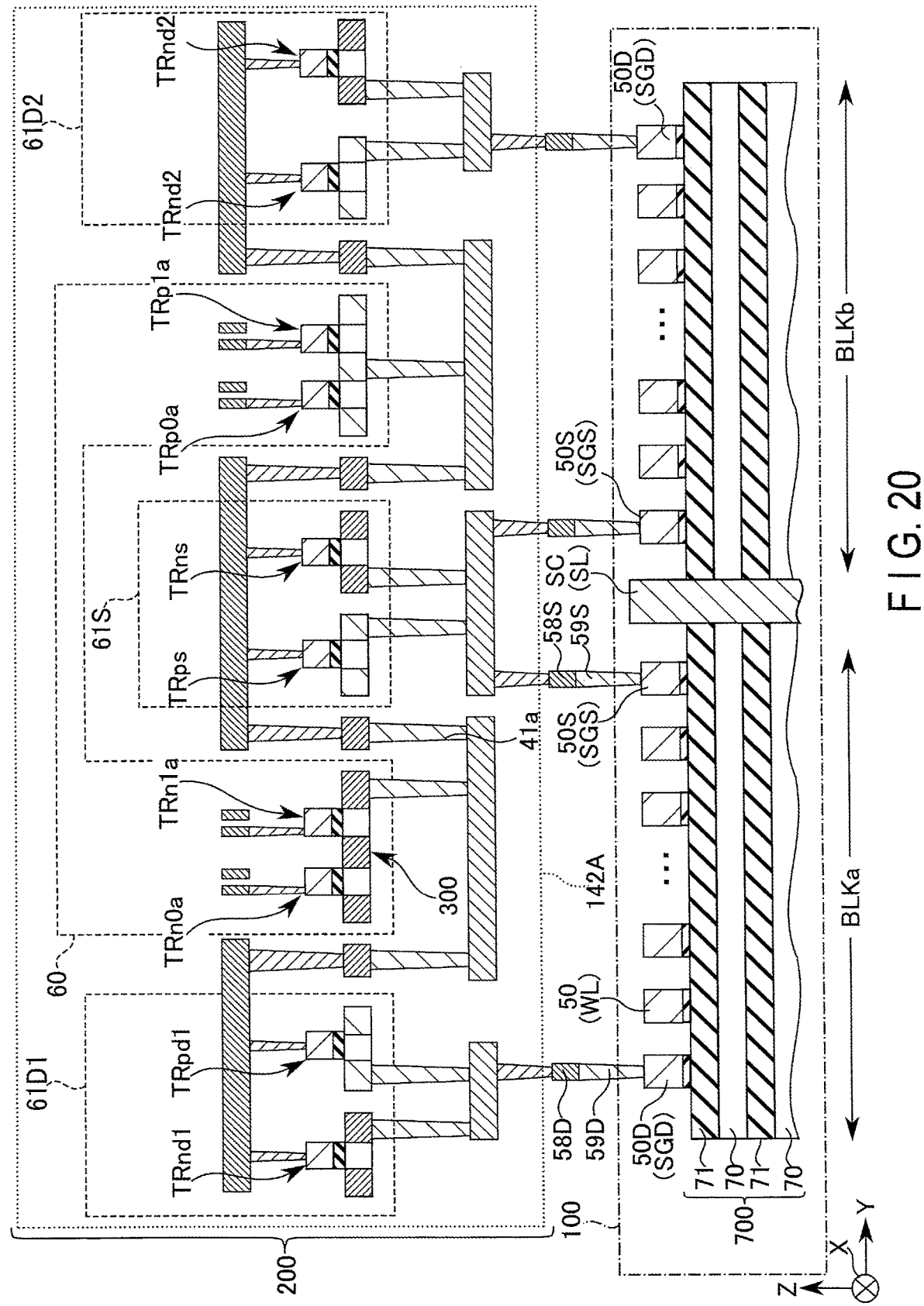
F I G. 20

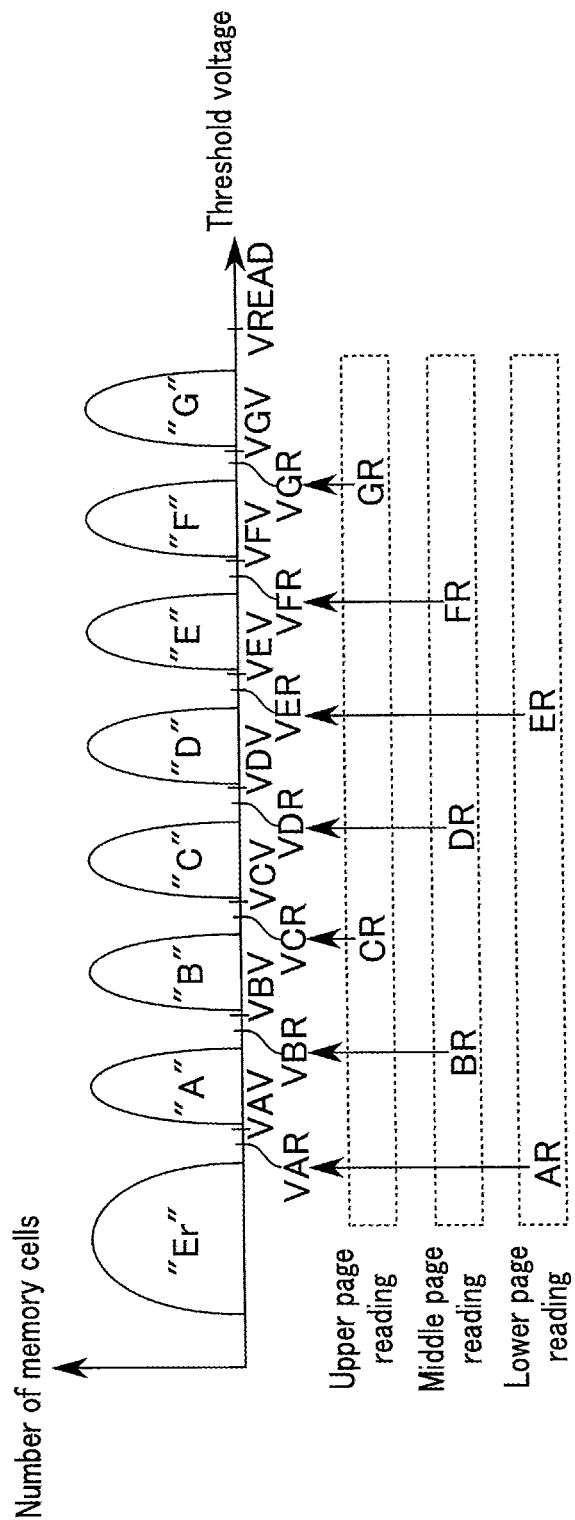
F I G. 32

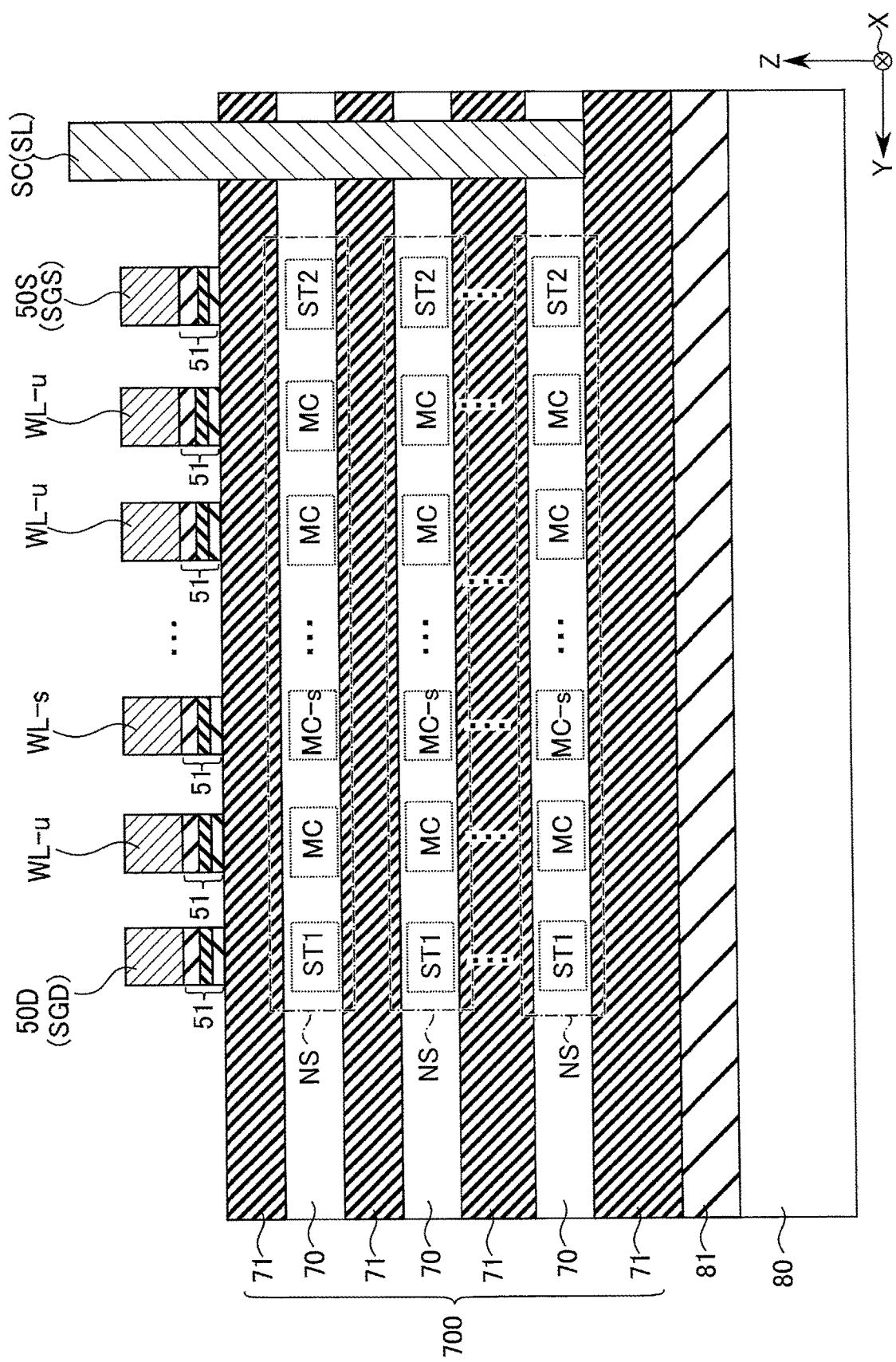
F I G. 35

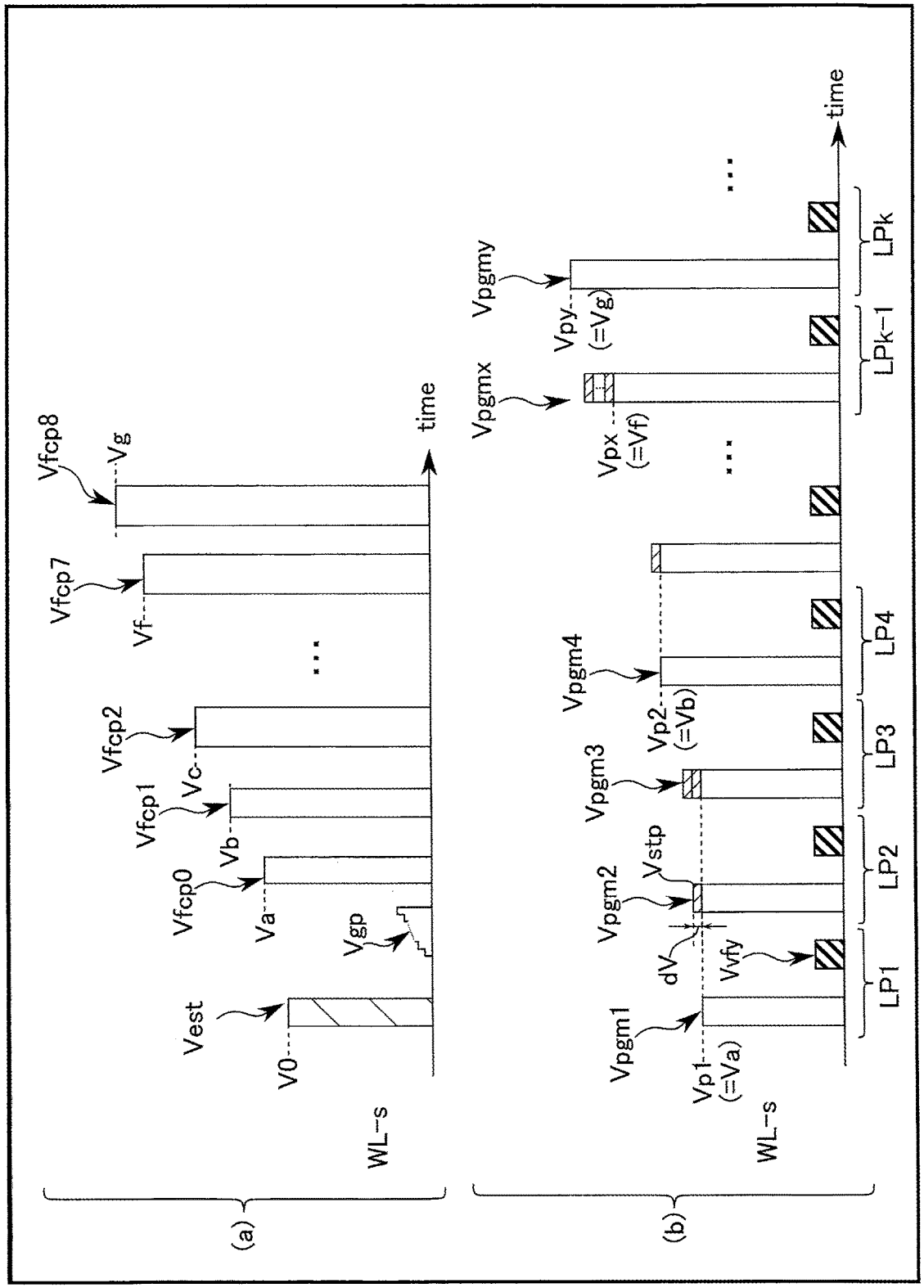
F I G. 36

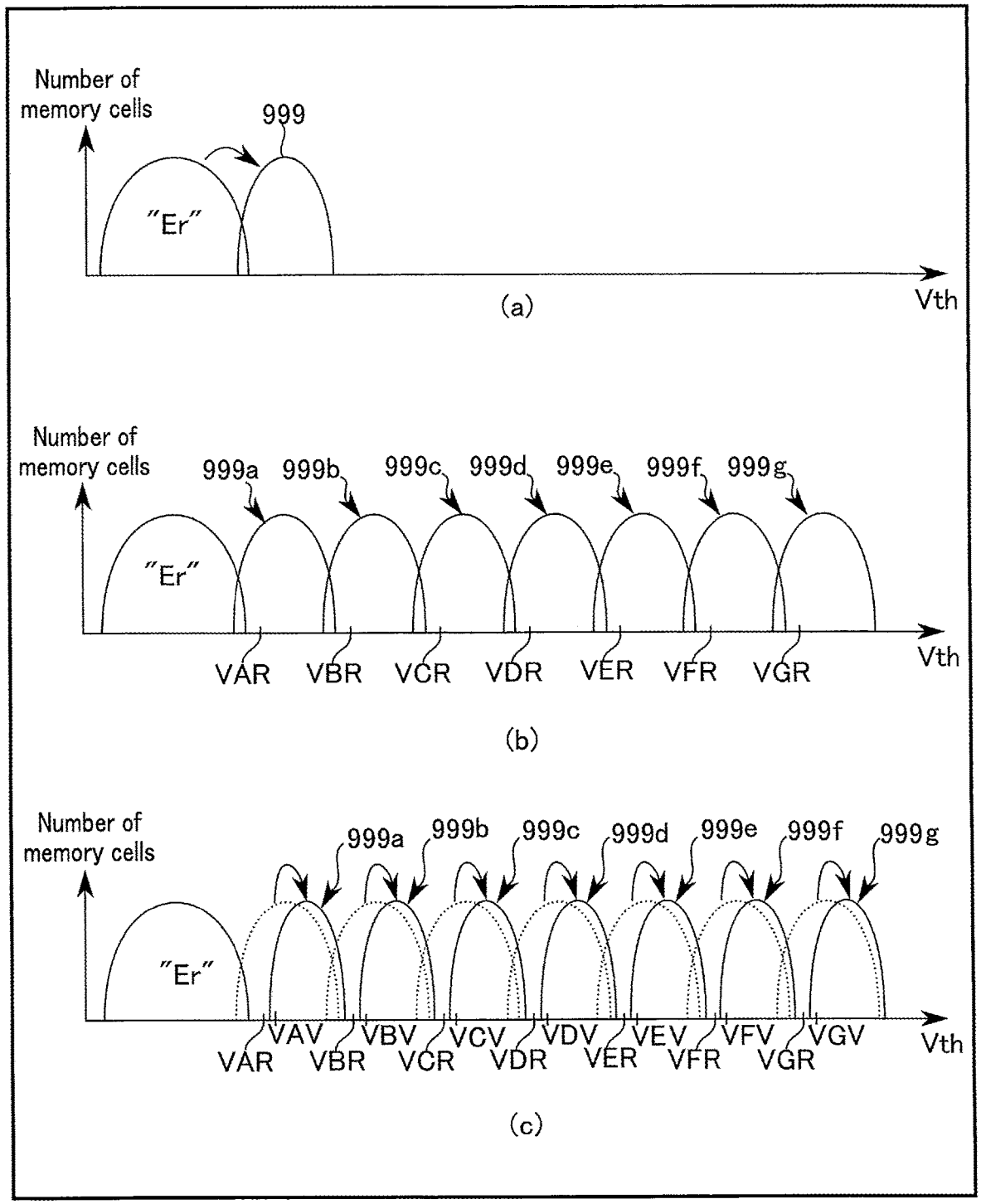
F I G. 37

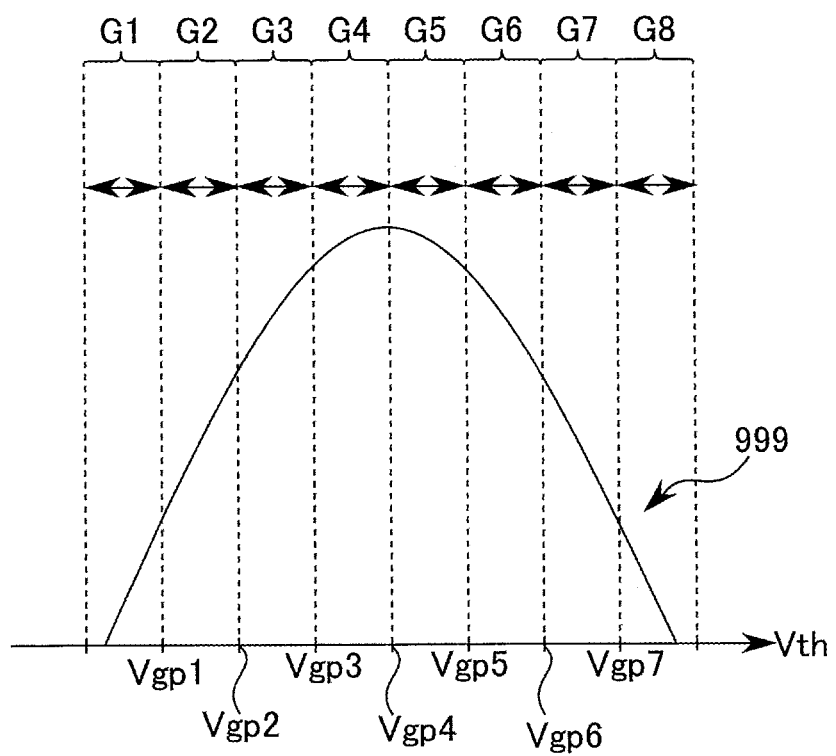
F I G. 38

| Writing speed | | Write state | | | | | | | |
|---|---|---|---|---|---|---|---|---|---|
| | | "A" | "B" | "C" | "D" | "E" | "F" | "G" |
| High speed ← | G8 | Vfcp0 | Vfcp1 | Vfcp2 | Vfcp3 | Vfcp4 | Vfcp5 | Vfcp6 |
| | G7 | Vfcp0 | Vfcp1 | Vfcp2 | Vfcp3 | Vfcp4 | Vfcp5 | Vfcp6 |
| | G6 | Vfcp1 | Vfcp2 | Vfcp3 | Vfcp4 | Vfcp5 | Vfcp6 | Vfcp7 |
| Writing speed | G5 | Vfcp1 | Vfcp2 | Vfcp3 | Vfcp4 | Vfcp5 | Vfcp6 | Vfcp7 |
| | G4 | Vfcp1 | Vfcp2 | Vfcp3 | Vfcp4 | Vfcp5 | Vfcp6 | Vfcp7 |
| | G3 | Vfcp1 | Vfcp2 | Vfcp3 | Vfcp4 | Vfcp5 | Vfcp6 | Vfcp7 |
| | G2 | Vfcp2 | Vfcp3 | Vfcp4 | Vfcp5 | Vfcp6 | Vfcp7 | Vfcp8 |
| → Low speed | G1 | Vfcp2 | Vfcp3 | Vfcp4 | Vfcp5 | Vfcp6 | Vfcp7 | Vfcp8 |

F I G. 39

MEMORY DEVICE AND METHOD OF CONTROLLING MEMORY DEVICE

CROSS-REFERENCE TO RELATED APPLICATIONS

This application is based upon and claims the benefit of priority from Japanese Patent Application No. 2021-015252, filed Feb. 2, 2021, the entire contents of which are incorporated herein by reference.

FIELD

Embodiments described herein relate generally to a memory device and a method of controlling a memory device.

BACKGROUND

A memory device having a memory cell array of a three-dimensional structure is known.

Simplification of a structure of a memory device and improvement of an operation characteristic of the memory device are promoted.

BRIEF DESCRIPTION OF THE DRAWINGS

FIGS. 4 and 5 are cross-sectional views of the memory cell array of the memory device of the first embodiment;

FIG. 6 is a circuit diagram of the memory cell array of the memory device of the first embodiment;

FIGS. 7 and 8 are diagrams schematically illustrating a configuration example of the memory device of the first embodiment;

FIGS. 10 and 11 are cross-sectional views illustrating the structure example of the memory device of the first embodiment;

FIG. 20 is a cross-sectional view illustrating the modification of the structure of the memory device of the first embodiment;

FIG. 32 is a diagram illustrating an example of a relationship between a threshold voltage of a memory cell and data;

FIGS. 35, 36, 37, 38, and 39 are diagrams for explaining the operation example of the memory device of the second embodiment;

DETAILED DESCRIPTION

Figure 1:
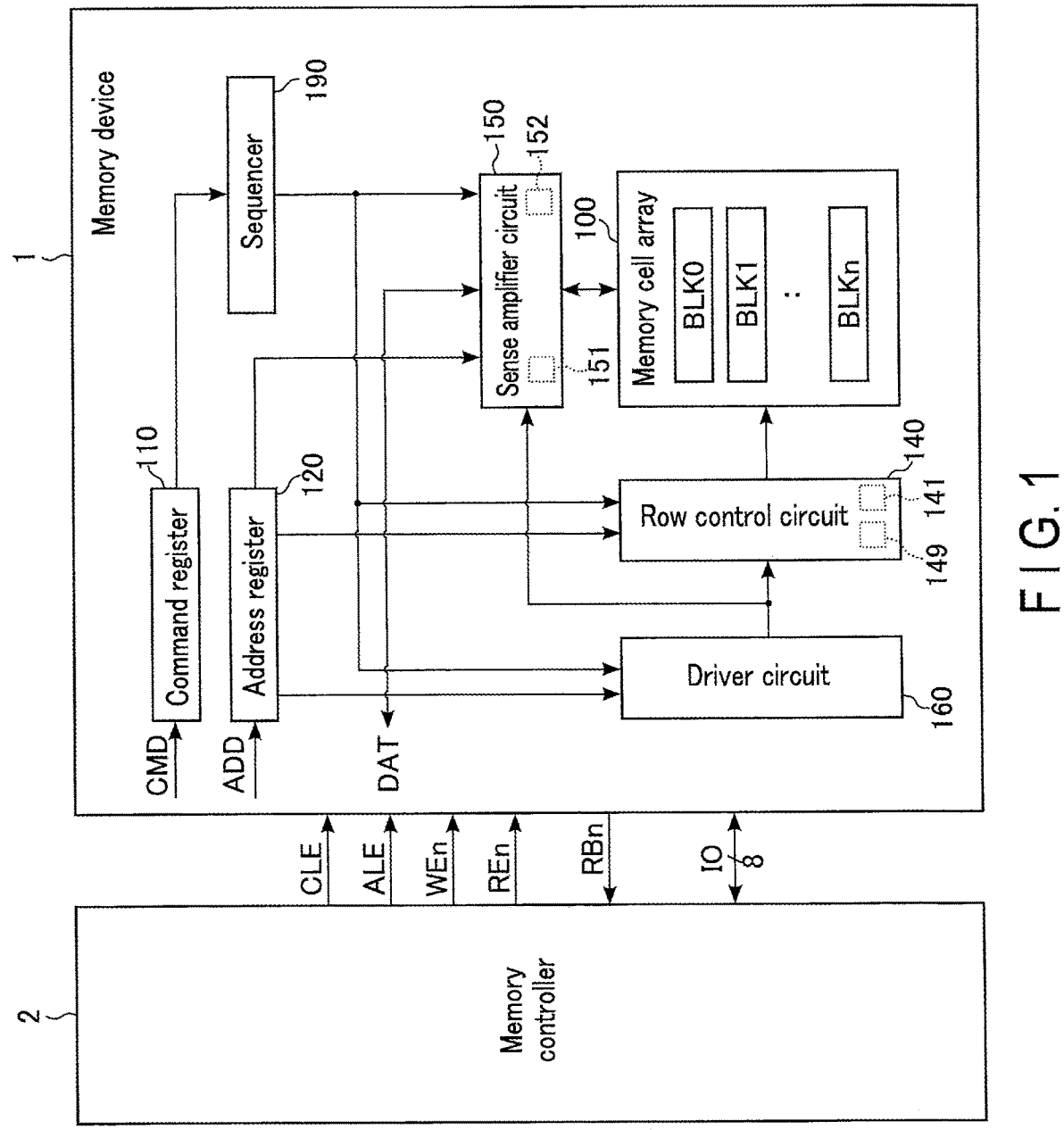
FIG. 1 is a block diagram of a memory system including a memory device of a first embodiment.

A memory device of embodiments will be described with reference to FIGS. 1 to 49.

Hereinafter, the present embodiments will be described in detail with reference to the drawings. In the following explanation, the same reference numerals denote constituent elements having the same functions and configurations.

In the following embodiments, when constituents (such as circuits, wirings, various voltages, and signals) having numerals/letters added at ends of reference numerals for differentiation are not necessarily distinguished from each other, an expression (reference numeral) in which the last number/letter is omitted is used.

In general, according to one embodiment, a memory device includes: a substrate; first and second layer stacks each including a plurality of first semiconductor layers arranged in a first direction perpendicular to a surface of the substrate, the first and second layer stacks arranged in a second direction parallel to the surface of the substrate; a plurality of word lines covering the first and second layer stacks; a second semiconductor layer provided above the first layer stack in the first direction; a third semiconductor layer provided above the second layer stack in the first direction; a plurality of memory cells provided between the first semiconductor layers and the word lines, respectively; a first transistor provided on the second semiconductor layer; and a second transistor provided on the third semiconductor layer, wherein the first and second layer stacks are arranged at a first pitch in the second direction, the first and second semiconductor layers are arranged at a second pitch in the second direction, and the second pitch is equal to the first pitch.

EMBODIMENTS

(1) First Embodiment

A memory device of a first embodiment will be described with reference to FIGS. 1 to 31.

(a1) Configuration Example

A configuration example of the memory device of the first embodiment will be described with reference to FIGS. 1 to 20.

FIG. 1 is a block diagram for explaining the configuration example of the memory device of the present embodiment.

As illustrated in FIG. 1, a memory device 1 of the present embodiment is electrically coupled to a memory controller 2.

The memory controller 2 sends a command CMD, an address ADD, and a plurality of control signals to the memory device 1 of the present embodiment.

The memory device 1 receives the command CMD, the address ADD, and the plurality of control signals. Data DAT is transferred between the memory device 1 and the memory controller 2. Hereinafter, the data DAT transferred from the memory controller 2 to the memory device 1 during write operation is referred to as write data. The write data DAT is written in the memory device 1. The data DAT transferred from the memory device 1 to the memory controller 2 during read operation is referred to as read data. The read data DAT is read from the memory device 1.

The memory device 1 of the present embodiment includes, for example, a memory cell array 100, a command register 110, an address register 120, a row control circuit 140, a sense amplifier 150, a driver circuit 160, and a sequencer 190.

The memory cell array 100 stores data. A plurality of bit lines and a plurality of word lines are provided in the memory cell array 100. The memory cell array 100 includes a plurality of blocks BLK0 to BLKn (n is an integer of 1 or more). The block BLK is a set of a plurality of memory cells. Each memory cell is associated with a bit line and a word line. The memory cell array 100 includes a plurality of select gate lines for selecting a control unit in the memory cell array 100.

The configuration of the memory cell array 100 will be described later.

The command register 110 holds the command CMD from the memory controller 2. The command CMD includes, for example, a command for causing the sequencer 190 to execute a read operation, a write operation, an erase operation, and the like.

The address register 120 holds address information (selected address) ADD from the memory controller 2. The address information ADD includes, for example, a block address, a page address, and a column address. In the address information ADD, for example, the block address, the page address, and the column address are respectively used to select the block BLK, the word line, the bit line, and the select gate line. Hereinafter, the block selected based on the block address is referred to as a selected block. The word line selected based on the page address is referred to as a selected word line.

The row control circuit 140 controls an operation related to a row of the memory cell array 100. The row control circuit 140 selects the block BLK in the memory cell array 100 based on the block address in the address register 120. The row control circuit 140 transfers, for example, a voltage applied to a wiring corresponding to the selected word line to the selected word line in the selected block BLK. The row control circuit 140 controls selection and non-selection of the select gate line based on the address information ADD.

The row control circuit 140 includes a word line decoder 141, a select gate line decoder 142, and the like.

The sense amplifier 150 controls an operation related to a column of the memory cell array 100. In the write operation, the sense amplifier 150 applies a voltage to each of the bit lines BL provided in the memory cell array 100 according to the write data DAT from the memory controller 2. In the read operation, the sense amplifier 150 determines data stored in the memory cell MC based on a potential (alternatively, whether or not current is generated) of the bit line BL. The sense amplifier 150 transfers data based on the determination result to the memory controller 2 as read data.

The sense amplifier 150 includes a bit line selection circuit 151, an amplifier circuit 152, and (or) the like.

The driver circuit 160 outputs a voltage used in the read operation, the write operation, the erase operation, and the like to the memory cell array 100. The driver circuit 160 applies a predetermined voltage to wirings corresponding to, for example, the word line and the bit line based on the address in the address register 120.

The sequencer 190 controls the overall operation of the memory device 1. For example, the sequencer 190 controls each circuit based on the command CMD in the command register 110.

For example, the memory device 1 of the present embodiment is a NAND flash memory. Communication between the NAND flash memory (hereinafter, also simply referred to as the flash memory) 1 and the memory controller 2 is supported by a NAND interface standard. A command latch enable signal CLE, an address latch enable signal ALE, a write enable signal WEn, a read enable signal REn, a ready/busy signal RBn, an input/output signal IO, and other signals are used for communication between the flash memory 1 and the memory controller 2.

The command latch enable signal CLE is a signal indicating that the input/output signal IO received by the flash memory 1 is the command CMD. The address latch enable signal ALE is a signal indicating that the signal IO received by the flash memory 1 is the address information ADD. The write enable signal WEn is a signal that orders the flash memory 1 to input the input/output signal IO. The read enable signal REn is a signal that orders the flash memory 1 to output the input/output signal IO.

The ready/busy signal RBn is a signal for notifying the memory controller 2 whether the flash memory 1 is in a ready state to accept a command (instruction or request) from the memory controller 2 or in a busy state in which no command is accepted.

The input/output signal IO is, for example, a signal having an 8-bit width. The input/output signal IO may include the command CMD, the address information ADD, the data DAT, and the like.

The flash memory 1 may further include an input/output circuit (not illustrated), a voltage generator (not illustrated), and the like. The input/output circuit functions as an interface circuit on the flash memory 1 side between the flash memory 1 and the memory controller 2. The voltage generator generates a plurality of voltages for various operations of the flash memory 1.

Hereinafter, each of the plurality of circuits 110, 120, 140, 150, 160, and 190 other than the memory cell array 100 in the flash memory 1 or a set thereof (circuit group) is referred to as a peripheral circuit (alternatively, a control circuit).

<Memory Cell Array>

A structure example of the memory cell array of the flash memory of the present embodiment will be described with reference to FIGS. 2 to 5.

In FIGS. 2 to 5, a portion of the memory cell array of the flash memory of the present embodiment is extracted and illustrated.

Figure 2:
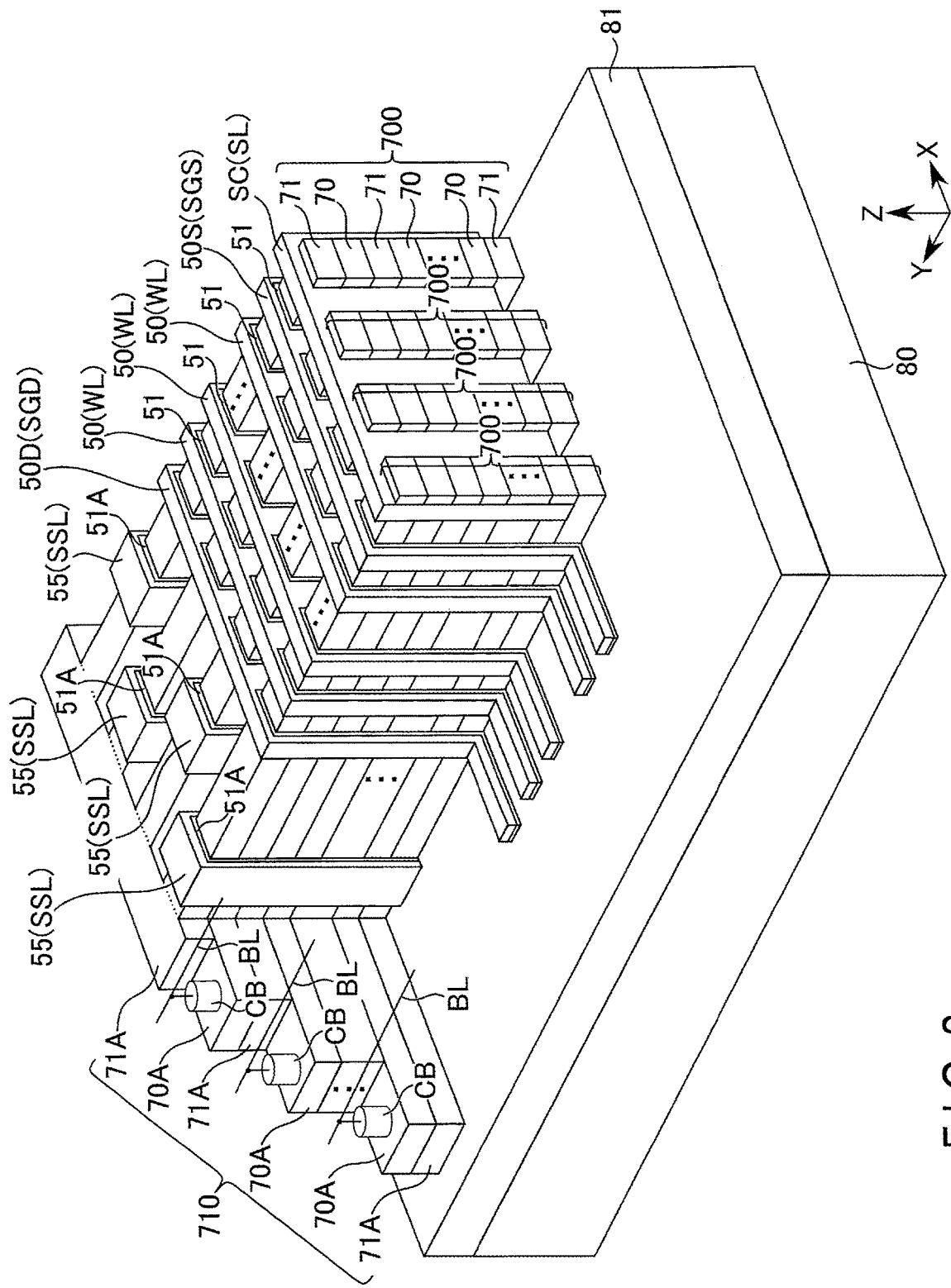
FIG. 2 is a bird's-eye view of a memory cell array of the memory device of the first embodiment.
Figure 3:
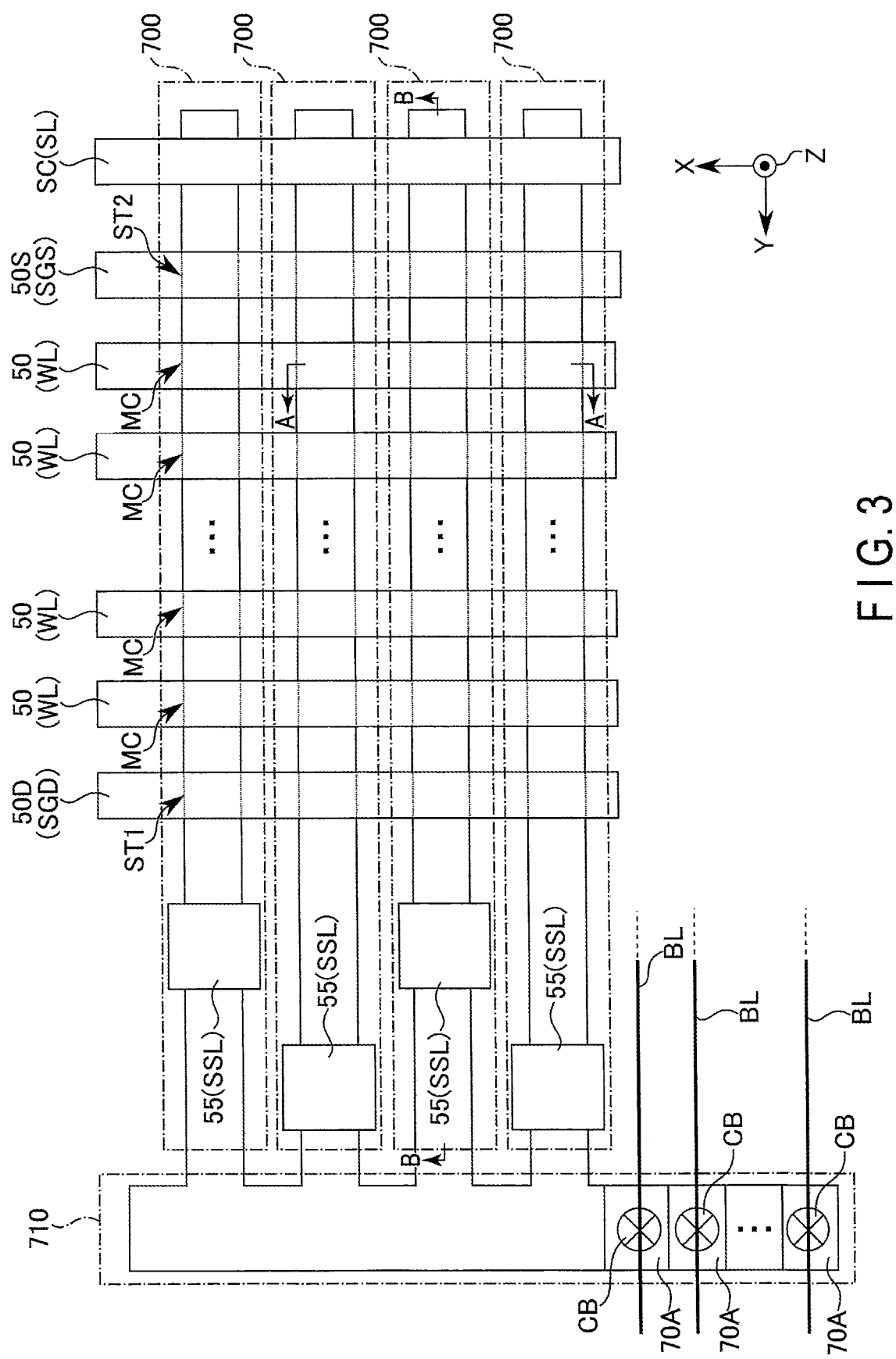
FIG. 3 is a top view of the memory cell array of the memory device of the first embodiment.
Figure 5:
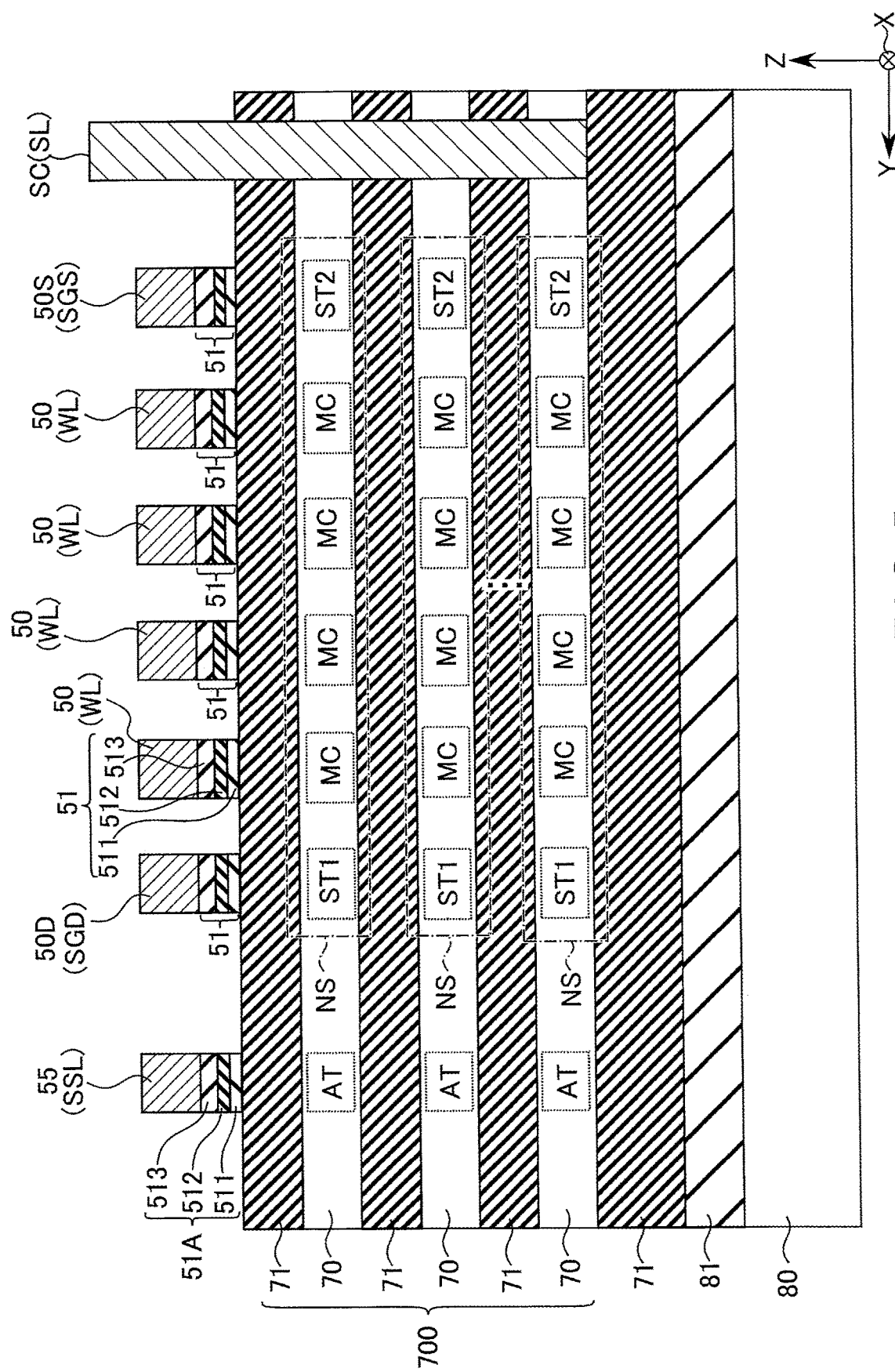

FIG. 2 is a bird's-eye view illustrating the structure example of the memory cell array of the flash memory of the present embodiment. FIG. 3 is a plan view illustrating the structure example of the memory cell array of the flash memory of the present embodiment. FIGS. 4 and 5 are cross-sectional views illustrating the structure example of the memory cell array of the flash memory of the present embodiment. FIG. 4 is a cross-sectional view taken along line A-A of FIG. 3. FIG. 5 is a cross-sectional view taken along line B-B in FIG. 3.

In the flash memory 1 of the present embodiment, the memory cell array 100 has a three-dimensional structure. As illustrated in FIGS. 2 to 5, the memory cell array 100 is provided above a substrate 80. A plurality of the memory cells MC are three-dimensionally arranged in the memory cell array 100. The plurality of memory cells MC are arranged in a direction (X direction and Y direction) parallel to an upper surface of the substrate 80. The plurality of memory cells MC are arranged in a direction (Z direction) perpendicular to the upper surface of the substrate 80.

The memory cell array 100 includes a plurality of layer stacks 700. The plurality of layer stacks 700 are arranged on an insulating layer 81 covering the substrate 80.

Each of the layer stacks 700 includes a plurality of semiconductor layers 70 and a plurality of insulating layers 71. Each of the semiconductor layers 70 has a columnar (for example, prismatic) structure extending in the Y direction. Each of the insulating layers 71 has a columnar (for example, prismatic) structure extending in the Y direction.

In the layer stack 700, the plurality of semiconductor layers 70 and the plurality of insulating layers 71 are alternately stacked in the Z direction. Each of the semiconductor layers 70 is provided between the two insulating layers 71 in the Z direction. In each of the layer stacks 700, the plurality of semiconductor layers 70 are arranged in the Z direction.

A plurality of conductive layers 50, 50D, and 50S are provided on the plurality of layer stacks 700. The plurality of conductive layers 50, 50D, and 50S cover a side surface (surface intersecting the X direction) of each of the layer stacks 700 and an upper surface (surfaces intersecting the Z direction) of each of the layer stacks 700.

The plurality of conductive layers 50, 50D, and 50S face the side surface of the layer stack 700 in the X direction. The plurality of conductive layers 50, 50D, and 50S are provided between the layer stacks 700 adjacent to each other in the X direction. Each of the conductive layers 50, 50D, and 50S extends in the X direction and the Z direction.

The conductive layer 50D is provided on one end side in the Y direction of the layer stack 700. The conductive layer 50D functions as a drain-side select gate line SGD. The conductive layer 50S is provided on the other end side in the Y direction of the layer stack 700. The conductive layer 50S functions as a source-side select gate line SGS.

The plurality of conductive layers 50 are provided in a region between the conductive layer 50D and the conductive layer 50S. Each of the conductive layers 50 functions as a word line WL.

Each of a plurality of memory layers 51 is provided between each of the conductive layers 50, 50D, and 50S and each of the layer stacks 700. The plurality of memory layers 51 are provided on the side surface of the layer stack 700 and the upper surface of the layer stack 700. Each of the memory layers 51 faces the side surface of the layer stack 700. Each of the memory layers 51 extends in the X direction and the Z direction.

The memory layer 51 includes an insulating layer 511, a charge storage layer 512, and an insulating layer 513.

The charge storage layer 512 is provided between the two insulating layers 511 and 513. The charge storage layer 512 can store charge within the layer. For example, the charge storage layer 512 is a layer having a charge trap level. An example of a material of the charge storage layer 512 is silicon nitride.

The insulating layer 511 is provided between the layer stack 700 and the charge storage layer 512. The insulating layer 511 functions as a tunnel film between the semiconductor layer 70 and the charge storage layer 512. Hereinafter, the insulating layer 511 is referred to as a tunnel insulating film.

The insulating layer 513 is provided between the conductive layers 50, 50D, and 50S and the charge storage layer 512. The insulating layer 513 blocks transfer of charges between the charge storage layer 512 and the conductive layer 50. Hereinafter, the insulating layer 513 is referred to as a block insulating film.

A portion between the semiconductor layer 70 and the conductive layer 50 sandwiching the memory layer 51 functions as the memory cell MC.

The memory layer may have a floating gate structure formed of a conductor divided in the Z direction. A material of the memory layer of the floating gate structure is silicon, metal, a silicide compound, or the like.

As described above, the memory cell MC is provided in a portion (region) between the semiconductor layer 70 and the conductive layer 50.

A portion between the semiconductor layer 70 and the conductive layer 50D functions as a drain-side select transistor ST1.

A portion between the semiconductor layer 70 and the conductive layer 50S functions as a source-side select transistor ST2.

As illustrated in FIG. 3, a layer stack 710 is provided on the substrate 80 on one end side in the Y direction of the layer stack 700.

The layer stack 710 is connected to one end of the layer stack 700. The layer stack 710 includes a plurality of semiconductor layers 70A and a plurality of insulating layers 71A. The semiconductor layer 70A has a columnar (for example, prismatic) structure extending in the X direction. The insulating layer 71A has a columnar (for example, prismatic) structure extending in the X direction.

The plurality of semiconductor layers 70A and the plurality of insulating layers 71A are alternately stacked in the Z direction. In the layer stack 710, the plurality of semiconductor layers 70A are arranged in the Z direction.

The semiconductor layer 70A is continuous with the semiconductor layer 70. The insulating layer 71A is continuous with the insulating layer 71.

The layer stack 710 extends in the X direction. One end of the layer stack 710 in the X direction has a step-like structure. Hereinafter, the layer stack 710 is referred to as a step structure.

At one end of the step structure 710 in the X direction, an upper surface of the semiconductor layer 70A as a lower layer is exposed without being covered with the semiconductor layer 70A as an upper layer.

A plurality of the bit lines BL are arranged above the layer stacks 700 and 710 in the Z direction. Each of the bit lines BL extends in the Y direction.

The bit line BL is connected to the semiconductor layers 70 and 70A via a bit line contact CB.

One of a plurality of the bit line contacts CB is provided on the exposed upper surface of the corresponding semiconductor layer 70A among the plurality of semiconductor layers 70A in the step structure 710.

Each of the bit lines BL is connected to a corresponding one of the plurality of bit line contacts CB. As a result, each of the bit lines BL is connected to the corresponding semiconductor layer 70 among the plurality of semiconductor layers 70 in the layer stack 700.

A plurality of conductive layers 55 are provided on the layer stack 700 in a region between the step structure 710 and the conductive layer 50D. Each of the plurality of conductive layers 55 is provided on the corresponding layer stack 700. The plurality of conductive layers 55 are independent of each other for each of the layer stacks 700.

Each of the conductive layers 55 covers the side surface and the upper surface of the corresponding layer stack 700.

For example, a layer 51A is provided between the conductive layer 55 and the layer stack 700. The layer 51A includes the same members 511, 512, and 513 as the memory layer 51.

A portion between the conductive layer 55 and the semiconductor layer 70 functions as a transistor (hereinafter, referred to as the access transistor) AT.

The conductive layer 55 functions as a wiring (hereinafter, referred to as the string select line) SSL for controlling connection between the layer stack 700 and the step structure.

An access transistor AT is turned on or off by controlling a potential of the string select line SSL. Thereby, any one of the plurality of layer stacks 700 is electrically connected to the step structure 710.

FIG. 6 is a circuit diagram illustrating a circuit configuration of the memory cell array of the flash memory of the present embodiment.

The memory cell array 100 described with reference to FIGS. 2 to 5 has the circuit configuration of FIG. 6.

In a NAND flash memory, the memory cell array 100 includes a plurality of NAND strings NS.

Each of the NAND strings NS includes the plurality of memory cells MC and the select transistors ST1 and ST2. The memory cell MC is connected in series between the source of the select transistor ST1 and the drain of the select transistor ST2.

The memory cell MC can store data in a nonvolatile manner. The memory cell (hereinafter, also referred to as the memory cell transistor) MC is a field effect transistor having a control gate and a charge storage layer.

In the structure of FIGS. 2 to 5, the NAND string NS includes the plurality of memory cells MC and the plurality of select transistors ST1 and ST2 formed using one semiconductor layer.

In each of a plurality of the control units in the block BLK, gates of the select transistors ST1 are connected to the corresponding select gate lines SGD (SGD0, . . . , SGDn−1), respectively. Similarly, in each of the plurality of control units (select units) in the block BLK, gates of the select transistors ST2 are commonly connected to, for example, the select gate line SGS (SGS0, . . . , SGSn−1).

The control gates of the memory cells MC belonging to the same block BLK are connected to the corresponding word lines WL, respectively.

The drain of the select transistor ST1 of each of the NAND strings NS is connected to a corresponding one of the plurality of bit lines BL via the access transistor AT. The bit line BL is commonly connected to the NAND strings NS belonging to the same column in the plurality of blocks BLK.

Sources of the plurality of select transistors ST2 are commonly connected to a source line SL.

The string select line SSL is provided in the memory cell array for each certain control unit. Hereinafter, the control unit selected by the string select line SSL is referred to as a string unit.

A gate of the access transistor AT is connected to a corresponding one of the plurality of string select lines SSL. One of source/drains of the access transistor AT is connected to the drain of the select transistor ST1 of the corresponding NAND string NS. The other of the source/drains of the access transistor AT is connected to the drain of the select transistor ST1 of the corresponding NAND string NS.

Hereinafter, in the block BLK, the control unit selected by the drain-side select gate line SGD is also referred to as a sub-block SB.

Data writing and data reading are collectively executed for the plurality of memory cells connected to a common word line in a string unit SU belonging to the sub-block SB in the block BLK based on the address information. A unit of a plurality of selected cells selected during writing and reading data is referred to as a cell unit CU.

The number of blocks in the memory cell array 100, the number of string units in the block BLK, and the number of NAND strings in the string units SU are arbitrary.

In the flash memory 1 of the present embodiment, the peripheral circuit is provided above the memory cell array 100 in the Z direction.

FIG. 7 is a diagram schematically illustrating a region where the peripheral circuit of the flash memory of the present embodiment is provided.

As illustrated in FIG. 7, a region (hereinafter, referred to as a peripheral circuit region) 200 in which an element constituting the peripheral circuit is provided is provided above the memory cell array 100 in the Z direction.

The peripheral circuit region 200 includes a plurality of transistors TR.

The plurality of transistors TR are arranged above the memory cell array 100 in the Z direction. The peripheral circuit includes the plurality of transistors TR. The transistor TR in the peripheral circuit region 200 is used for a wiring selection circuit (for example, select gate line decoder) 142 in the memory cell array 100, and the like.

The transistor TR in the peripheral circuit region 200 is a thin film transistor (TFT). Hereinafter, the peripheral circuit region 200 is also referred to as a TFT region.

A structure of the transistor TR will be described later.

An element (for example, transistor) TRx of the peripheral circuit may be provided in a semiconductor region of the substrate (semiconductor substrate) 80.

For example, a peripheral circuit region 800 is provided in an adjacent region of the memory cell array 100 in the X direction and/or the Y direction.

The transistor TRx is provided in the peripheral circuit region 800. The semiconductor region where the transistor TRx is disposed is surrounded by an element isolation layer (insulating layer) 89.

A gate electrode 85 of the transistor TRx is provided on the upper surface of the substrate 80 via a gate insulating layer (not illustrated). Two source/drains 82 and 83 of the transistor TRx are provided inside the substrate 80.

The transistor TRx that operates using a relatively high voltage (for example, 8V or more), such as transistors in the word line decoder 141 and the driver circuit 160, is provided in the peripheral circuit region 800. As a result, the transistor TRx can ensure a relatively high gate breakdown voltage. For example, the voltage applied to the transistor TRx is equal to or higher than the voltage applied to the transistor TR.

As described above, the circuit that operates using a relatively higher voltage than the circuit in the TFT region 200 is disposed on the semiconductor region in the substrate 80. As a result, the flash memory 1 of the present embodiment can execute a desired operation without deteriorating operation characteristics.

Figure 8:
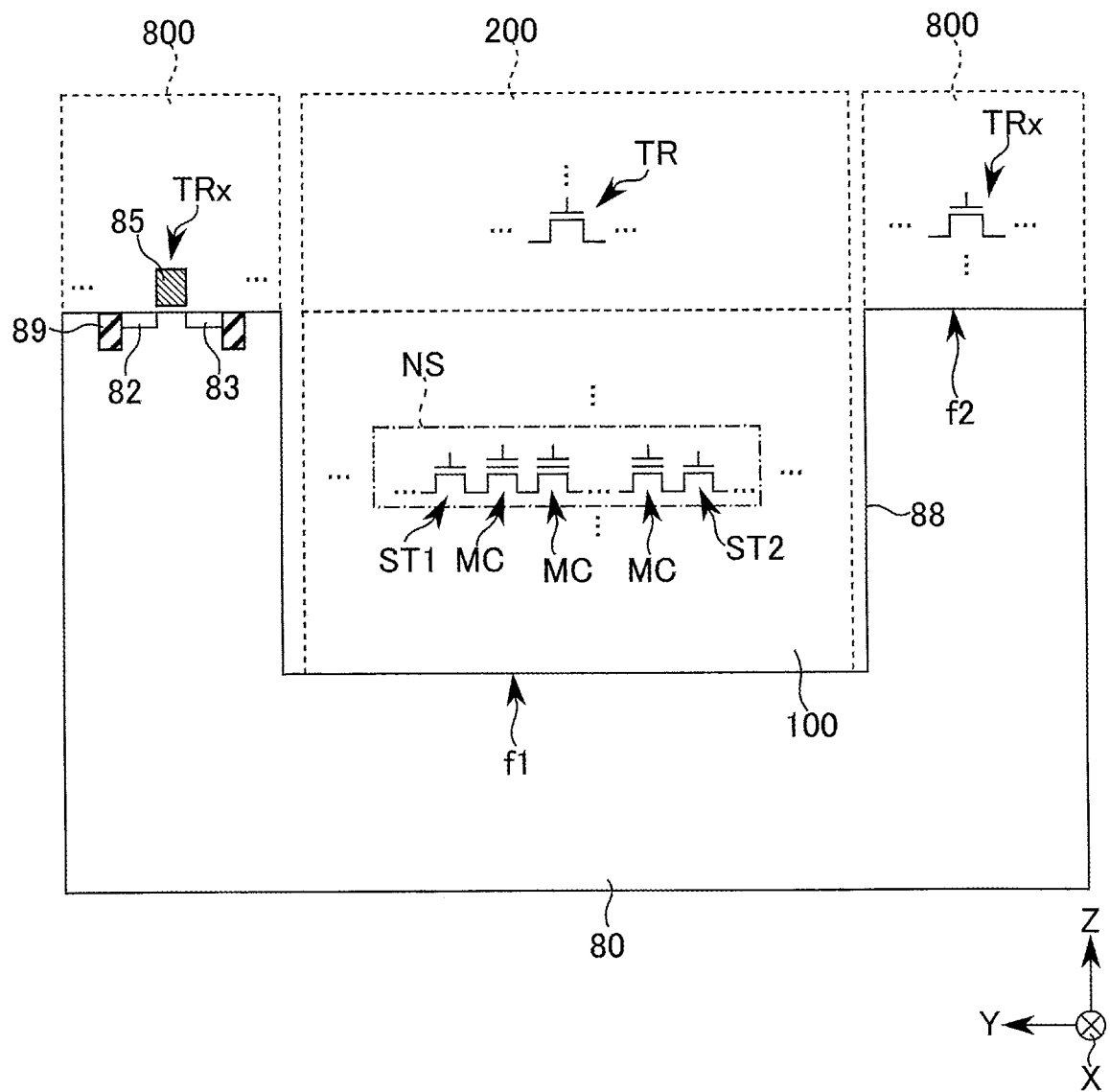

FIG. 8 illustrates a modification of FIG. 7.

The memory cell array 100 may be provided in a trench 88 of the substrate 80.

In this case, a position of the peripheral circuit region 800 in the Z direction is higher than a position of the memory cell array 100 in the Z direction. For example, a position in the Z direction of an upper surface f2 of the substrate (semiconductor region) of the peripheral circuit region 800 is higher than a position in the Z direction of an upper surface f1 of the substrate in the region where the memory cell array 100 is provided.

For example, the peripheral circuit region 800 is provided in an adjacent region of the TFT region 200 in the X direction and/or the Y direction.

All the elements constituting the peripheral circuit may be provided in the TFT region 200 without providing the peripheral circuit region 800 in the semiconductor region of the substrate 80.

(b1) Structure Example

A structure example of the flash memory of the present embodiment will be described with reference to FIGS. 9 to 11.

Figure 9:
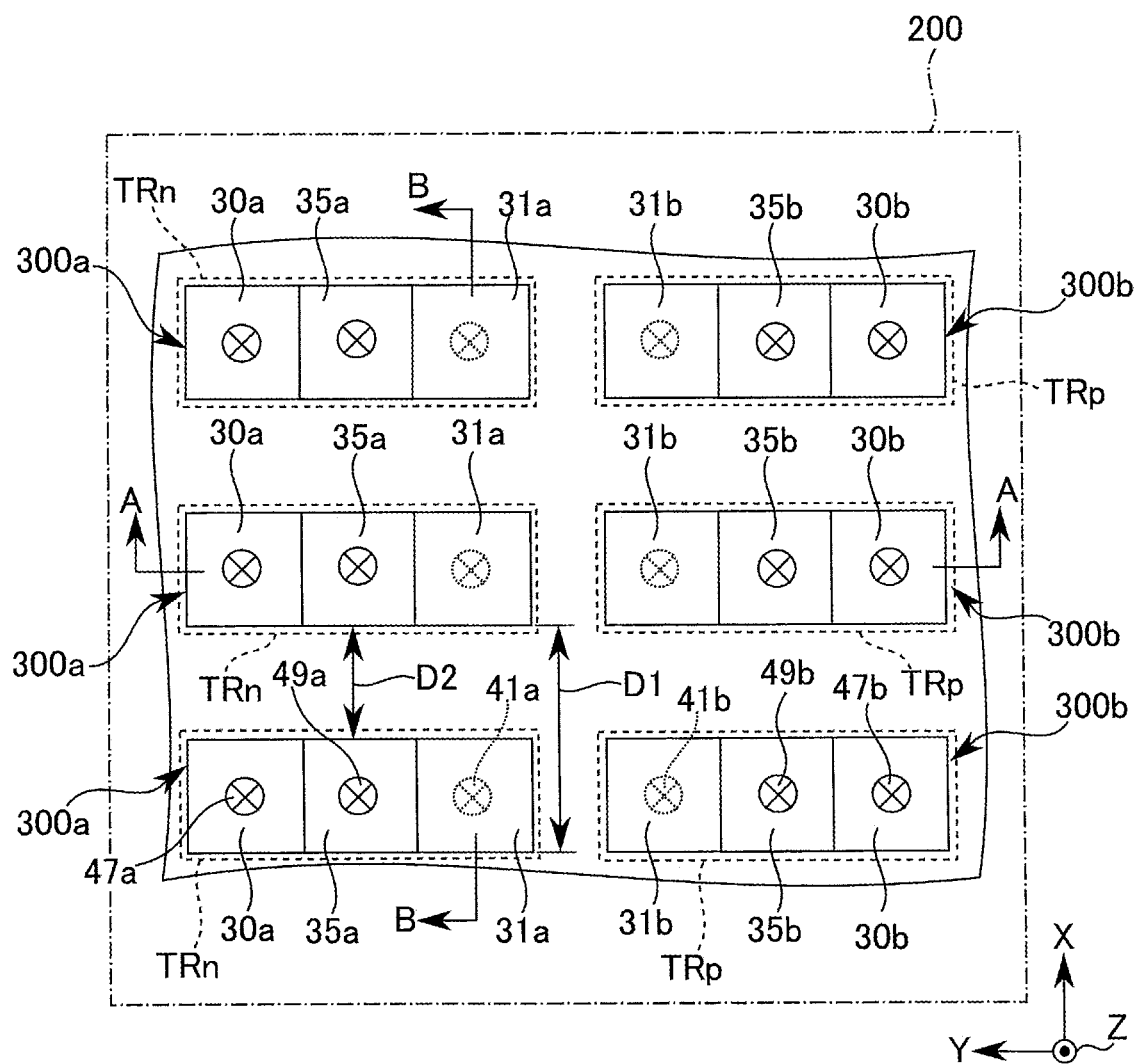
FIG. 9 is a plan view illustrating a structure example of the memory device of the first embodiment.
Figure 10:
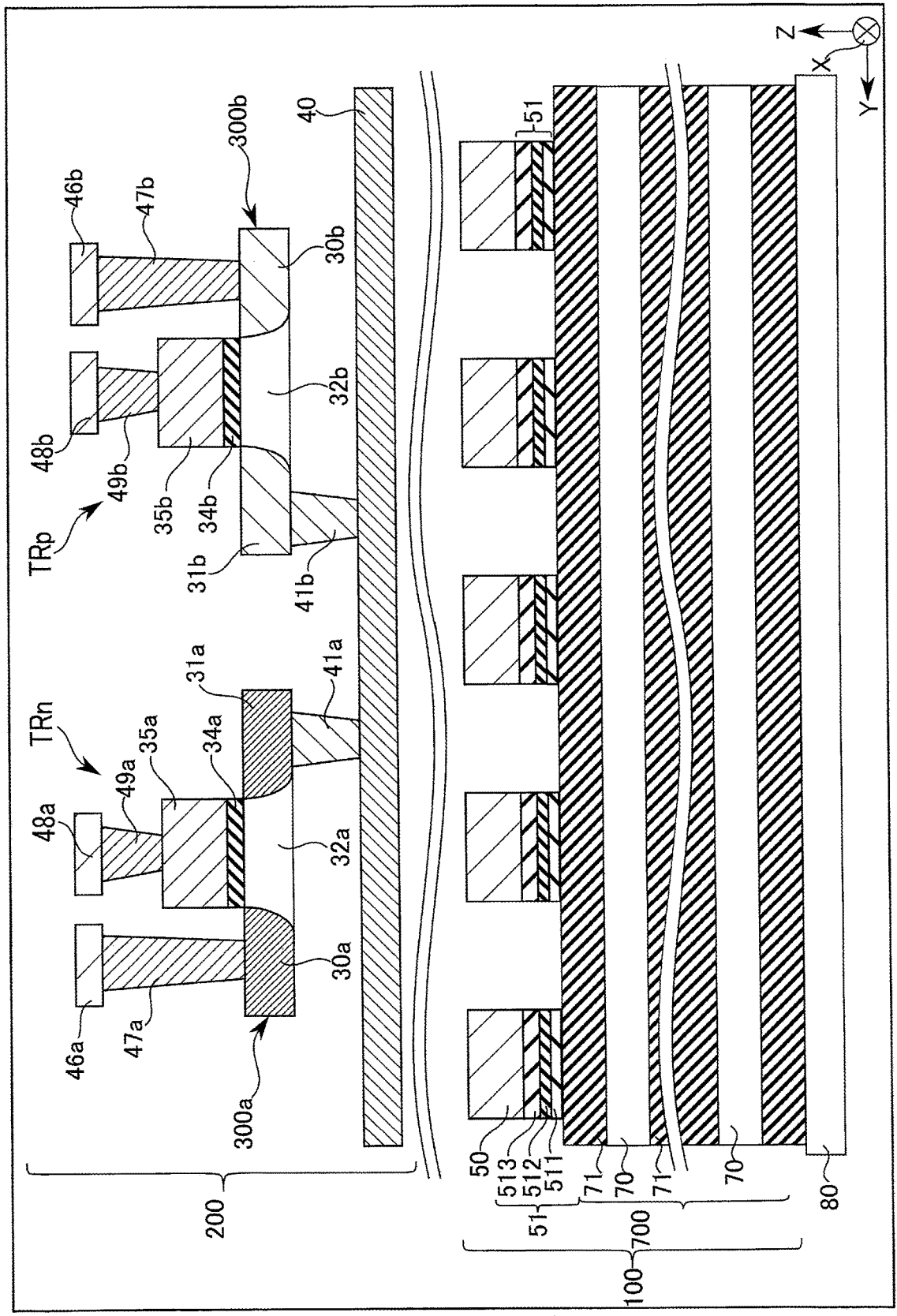

FIGS. 9 to 11 are diagrams for explaining a basic configuration of a structure example of the element in the peripheral circuit region above the memory cell array in the flash memory of the present embodiment.

FIG. 9 is a plan view illustrating a structure example of the transistor in the peripheral circuit region (TFT region) in the flash memory of the present embodiment. FIG. 10 is a cross-sectional view taken along line A-A of FIG. 9 in the flash memory of the present embodiment. FIG. 11 is a cross-sectional view taken along line B-B of FIG. 9 in the flash memory of the present embodiment.

As illustrated in FIGS. 9 to 11, a plurality of semiconductor layers 300 (300a, 300b) are provided above the memory cell array 100 in the Z direction. Above the memory cell array 100, the plurality of semiconductor layers 300 are arranged in the Y direction and the X direction. Each of the semiconductor layers 300 extends in the Y direction. Each of the semiconductor layers 300 has a quadrangular planar structure when viewed from the Z direction.

For example, each of the semiconductor layers 300 is disposed at a position overlapping the layer stack 700 in the memory cell array 100 in the Z direction in an X-Y plane.

A plurality of field effect transistors TRn and TRp are provided on the semiconductor layers 300a and 300b, respectively. The semiconductor layer 300a is, for example, a p-type semiconductor layer. The semiconductor layer 300b is, for example, an n-type semiconductor layer. The semiconductor layers 300a and 300b may be semiconductor layers to which a dopant by ion implantation is not added.

The n-channel transistor TRn is provided on the semiconductor layer (semiconductor region) 300a. The p-channel transistor TRp is provided on the semiconductor layer (semiconductor region) 300b.

Each of the transistors TRn and TRp is a thin film transistor (TFT).

Each of the transistors TR (TRn, TRp) includes a gate electrode 35 (35a, 35b), a gate insulating layer 34 (34a, 34b), and two source/drain layers 30 (30a, 30b) and 31 (31a, 31b).

In each of the transistors TR, the two source/drain layers 30 and 31 adjacent to each other in the Y direction are provided in the semiconductor layer 300. A region 32 (32a, 32b) between the two source/drain layers in the semiconductor layer 300 is a channel region of the transistor.

For example, in the n-channel transistor TRn, the n-type source/drain layers 30a and 31a are provided in the semiconductor layer 300a. For example, in the p-channel transistor TRp, the p-type source/drain layers 30b and 31b are provided in the semiconductor layer 300b.

The gate electrode 35 is provided above a channel region 32 of the semiconductor layer 300. The gate insulating layer 34 is provided between the gate electrode 35 and the semiconductor layer 300.

Hereinafter, the layer stack including the gate electrode 35 and the gate insulating layer 34 is also referred to as a gate stack.

A conductive layer 40 is provided below the semiconductor layer 300 in the Z direction. The conductive layer 40 is disposed in a region between the semiconductor layer 300 and the memory cell array 100 in the Z direction.

For example, in each of the transistors TRn and TRp, the source/drain layer 31 is connected to the conductive layer 40 via a contact plug 41 (41a, 41b). The contact plug 41 is in contact with a lower surface of the semiconductor layer 300 in the Z direction (a surface facing the surface on which the gate electrode is provided in the Z direction).

Conductive layers 46 (46a, 46b) and 48 (48a, 48b) are provided above the semiconductor layer 300 in the Z direction.

For example, in each of the transistors TRn and TRp, the source/drain layer 30 is connected to the conductive layer 46 (46a, 46b) via a contact plug 47 (47a, 47b). The contact plug 47 is in contact with the upper surface of the semiconductor layer 300 in the Z direction (the surface on which the gate electrode is provided in the Z direction).

Both the source/drain layers 30 and 31 of each of the transistors TR may be connected to the contact plug in contact with the upper surface of the semiconductor layer 300. Both the source/drain layers 30 and 31 of each of the transistors TR may be connected to the contact plug in contact with the lower surface of the semiconductor layer 300. The source/drain layer 30 may be connected to the contact plug in contact with the lower surface of the semiconductor layer 300. The source/drain layer 31 may be connected to the contact plug in contact with the upper surface of the semiconductor layer 300.

For example, in each of the transistors TRn and TRp, the gate electrode 35 is connected to the conductive layer 48 via a contact plug 49 (49a, 49b).

For example, when the two transistors TR adjacent to each other in the Y direction on the common semiconductor layer 300 are transistors of the same conductivity type, the two transistors TR adjacent to each other in the Y direction can share one source/drain layer between the two transistors.

Such sharing of the source/drain layer between the two transistors TR makes it possible to suppress an increase in size (area) of the transistor TR (and the circuit) above the memory cell array 100.

For example, a material of the semiconductor layer 300 is selected from silicon, germanium, silicon germanium, an oxide semiconductor, a nitride semiconductor, and an oxynitride semiconductor.

A material of the gate electrode 35 is selected from silicon, germanium, silicon germanium, a silicon compound, a germanium compound, a metal, and a conductive compound.

A material of the gate insulating layer 34 is selected from silicon oxide, silicon oxynitride, germanium oxide, germanium oxynitride, silicon germanium oxide, silicon germanium oxynitride, and an insulating high dielectric material.

In the present embodiment, a pitch D1 of the plurality of semiconductor layers 300*a* in the TFT region 200 is substantially equal to a pitch Da of the plurality of layer stacks 700 in the memory cell array 100.

An interval D2 between the two semiconductor layers 300 in the X direction is equal to, for example, an interval Db between the two layer stacks 700 in the X direction.

For example, a dimension of the semiconductor layer 300 in the X direction has a certain size D3. For example, a dimension D3 is equal to a dimension Dc of the layer stack 700 in the X direction.

The pitch D1 in the semiconductor layer 300*a* corresponds to a dimension between one end (left end in FIG. 11) of one of the semiconductor layers 300*a* in the X direction and one end (left end in FIG. 11) of the other semiconductor layer 300*a* in the X direction in the two semiconductor layers 300*a* arranged in the X direction. The pitch D1 is equal to a sum of the interval D2 and the dimension D3.

The pitch Da in the layer stack 700 corresponds to a dimension between one end (left end in FIG. 11) of one of the layer stacks 700 in the X direction and one end (left end in FIG. 11) of the other layer stack 700 in the X direction in the two layer stacks 700 arranged in the X direction.

When a film thickness of the memory layer 51 on the side surface of the layer stack 700 is indicated by "ta", a dimension Db is larger than 2×ta. When a dimension of the conductive layer 50 between the memory layers 51 facing each other in the X direction is indicated by "tb", the dimension Db is equal to 2×ta+tb.

The pitch Da is equal to a sum of the interval Db and the dimension Dc.

The layer stack 700 may have a tapered cross-sectional shape according to the number of stacked semiconductor layers 70 in the layer stack 700 (height of the layer stack 700 in the Z direction). In this case, the pitch Da of the layer stack 700, the interval Db between the layer stacks 700, and the dimension Dc of the layer stack 700 are set based on a dimension on an upper end side of the layer stack 700 in the Z direction. However, the pitch Da and the interval Db may be set based on a dimension of a lower end side of the layer stack 700 in the Z direction.

Processing (etching) of the semiconductor layer 300 is integrated with the processing (etching) of a gate stack (the gate electrode 35 and the gate insulating layer 34).

By designing a manufacturing process to be common, a position of an end of the semiconductor layer 300 in the X direction is aligned with a position of an end (a gate end in a gate width direction) of the gate electrode 35 in the X direction. For example, the dimension D3 of the semiconductor layer 300 in the X direction is equal to a dimension D3*a* of the gate electrode 35 in the X direction.

A position of an end of the gate insulating layer 34 in the X direction is aligned with the position of the end of the semiconductor layer 300 in the X direction and the position of the end of the gate electrode 35 in the X direction. A dimension of the gate insulating layer 34 in the X direction is equal to the dimension D3 of the semiconductor layer 300*a* and the dimension D3*a* of the gate electrode 35*a*.

For example, during processing the semiconductor layer 300, an end in the X direction of the contact plug 41 below the semiconductor layer 300 may be etched according to a pattern of the semiconductor layer 300.

In this case, a position of the end of the contact plug 41 in the X direction is aligned with the position of the end of the semiconductor layer 300 in the X direction. The position of the end of the contact plug 41 in the X direction is aligned with the position of the end of the gate insulating layer 34 in the X direction and the position of the end of the gate electrode 35 in the X direction. Only a position of one end of the contact plug 41 in the X direction may be aligned with a position of one end of the semiconductor layer 300 in the X direction.

For example, the contact plug 41*a* includes a portion 411*a* having a dimension D3*z* in the X direction. For example, the contact plug 41*a* includes two portions 411*a* and 412*a*. The portion 411*a* is provided between the semiconductor layer 300 and the portion 412*a*. The portion 412*a* is provided between the portion 411*a* and the conductive layer 40.

The dimension D3*z* of the portion 411*a* in the X direction is smaller than a maximum dimension D3*x* of the portion 412*a* in the X direction. The portion 412*a* has a maximum dimension on an upper side (portion 411*a* side) in the Z direction and a minimum dimension on a lower side (conductive layer 40 side) in the Z direction.

Here, a dimensional relationship between the semiconductor layer 300*a* and the layer stack 700 is exemplified. However, a dimensional relationship between the semiconductor layer 300*b* and the layer stack 700 is also substantially the same as the dimensional relationship between the semiconductor layer 300*a* and the layer stack 700.

Here, a dimensional relationship between the semiconductor layer 300*a* and the gate electrode 35*a* of the n-channel transistor is exemplified. However, a dimensional relationship between the semiconductor layer 300*b* and the gate electrode 35*b* of the p-channel transistor is also substantially the same as the dimensional relationship between the semiconductor layer 300*a* and the gate electrode 35*a*.

The peripheral circuit using the plurality of transistors TR having the above-described structure as a basic structure is provided above the memory cell array 100 in the Z direction.

Hereinafter, a configuration example of the peripheral circuit above the memory cell array 100 will be described.

Example 1: Select Gate Line Decoder

An example 1 of the peripheral circuit above the memory cell array in the flash memory of the present embodiment will be described with reference to FIGS. 12 to 14.

In this example, the select gate decoder 142 is provided in the TFT region 200 above the memory cell array 100.

(Circuit Example)

Figure 12:
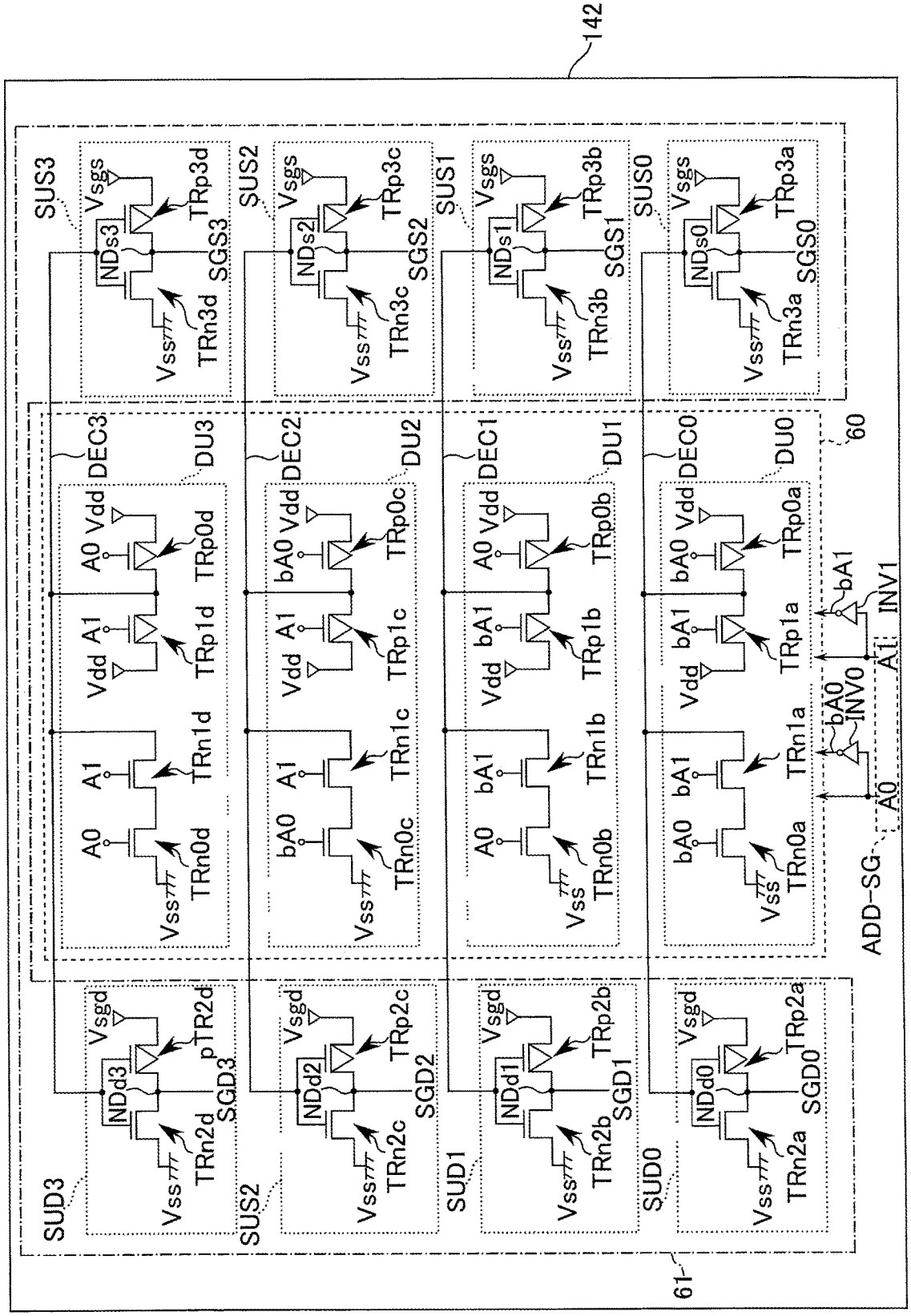
FIG. 12 is a circuit diagram illustrating a first example of a structure of the memory device of the first embodiment.

FIG. 12 is a circuit diagram schematically illustrating a configuration of the select gate line decoder of the flash memory of the present embodiment.

In the present embodiment, the select gate line decoder (hereinafter, also referred to as the SG decoder) 142 includes the plurality of field effect transistors TRn and TRp in the TFT region 200 above the memory cell array 100 in the Z direction.

The SG decoder 142 sets the drain-side and source-side select gate lines SGD and SGS based on the address information (selected address) among the plurality of select gate lines SGD and SGS in the memory cell array 100 to a selected state (activated state). The SG decoder 142 sets the select gate lines SGD and SGS other than the selected select gate lines SGD and SGS to a non-selected state (deactivated state). Hereinafter, a pair of the drain-side select gate line SGD and the source-side select gate line SGS is referred to as a select gate line set SG. In this example, the number of select gate line sets SG is four.

The SG decoder 142 includes an address decode circuit 60 and a selection circuit 61.

The address decode circuit 60 includes a plurality of decoding units DU (DU0, DU1, DU2, DU3). Each of the decoding units DU is associated with a corresponding one of the plurality of select gate line sets SG.

For example, the number of decoding units DU is the same as the number of select gate line sets SG in the block BLK. In this example, an example in which the four decoding units DU are provided in the address decode circuit 60 is illustrated. However, the number of decoding units DU is changed according to the number of select gate line sets in the memory cell array 100.

The plurality of decoding units DU decode the select gate line addresses ADD-SG by using mutually different calculation processing (decoding processing) for the supplied address information.

For example, when a certain block BLK (alternatively a certain sub-block or string unit) has the four select gate line sets SG, the select gate line of the certain block is indicated by 2-bit signals A0 and A1.

In this case, each of the decoding units DU (DU0, DU1, DU2, DU3) includes two n-channel transistors TRn0 and TRn1 and two p-channel transistors TRp0 and TRp1.

In each of the decoding units DU, one of source/drains of the transistor TRn1 (TRn1a, TRn1b, TRn1c, TRn1d) is connected to a terminal (hereinafter, referred to as the ground terminal Vss) to which a ground voltage Vss is applied. The other of the source/drains of the transistor TRn1 is connected to one of source/drains of the transistor TRn0 (TRn0a, TRn0b, TRn0c, TRn0d). The other of the source/drains of the transistor TRn0 is connected to a corresponding decode signal line DEC (DEC0, DEC1, DEC2, DEC3).

As described above, in the decoding unit DU, current paths of the plurality of transistors TRn are connected in series between the ground terminal Vss and the decode signal line DEC.

In each of the decoding units DU, one of source/drains of the transistor TRp0 (TRp0a, TRp0b, TRp0c, TRp0d) is connected to a terminal (hereinafter, referred to as the power supply terminal Vdd) to which a voltage Vdd is applied. The other of the source/drains of the transistor TRp0 is connected to the corresponding decode signal line DEC. One of source/drains of the transistor TRp1 (TRp1a, TRp1b, TRp1c, TRp1d) is connected to the power supply terminal Vdd. The other of the source/drains of the transistor TRp1 is connected to the corresponding decode signal line DEC.

As described above, in the decoding unit DU, a current path of the transistor TRp is connected in parallel between the power supply terminal Vdd and the decode signal line DEC in the plurality of transistors TRp.

The select gate line address ADD-SG includes a plurality of signals (hereinafter, also referred to as the address bit signal) A0 and A1. One of the signal A0 and the signal bA0 is supplied to a gate of the transistor TRn0 according to the decoding unit DU. One of the signal A1 and the signal bA1 is supplied to a gate of the transistor TRn1 according to the decoding unit DU. The signal bA0 is an inverted signal of the signal A0. The signal bA1 is an inverted signal of the signal A1.

One of the signal A0 and the signal bA0 is supplied to a gate of the transistor TRp0 according to the decoding unit DU. One of the signal A1 and the signal bA1 is supplied to a gate of the transistor TRp1 according to the decoding unit DU.

The selection circuit 61 includes a plurality of drain-side select gate line selectors (hereinafter, also referred to as the drain-side SG selectors) SUD (SUD0, SUD1, SUD2, SUD3) and a plurality of source-side select gate line selectors (hereinafter, also referred to as the source-side SG selectors) SUS (SUS0, SUS1, SUS2, SUS3).

The drain-side SG selector SUD is associated with a corresponding one of the plurality of drain-side select gate lines SGD. The source-side SG selector SUS is associated with a corresponding one of the plurality of source-side select gate lines SGS.

Each of the SG selectors SUD includes an n-channel transistor TRn2 (TRn2a, TRn2b, TRn2c, TRn2d) and a p-channel transistor TRp2 (TRp2a, TRp2b, TRp2c, TRp2d).

In each of the SG selectors SUD, one of source/drains of the transistor TRn2 is connected to the ground terminal Vss, and the other of the source/drains of the transistor TRn2 is connected to a node NDd (NDd0, NDd1, NDd2, NDd3). In each of the SG selectors SUD, one of source/drains of the transistor TRp2 is connected to a terminal (hereinafter, also referred to as the power supply terminal. Vsgd) to which a voltage Vsgd is applied. The other of the source/drains of the transistor TRp2 is connected to the node NDd.

The node NDd of each of the SG selectors SUD is connected to a corresponding one of the plurality of drain-side select gate lines SGD.

In each of the drain-side SG selectors SUD, a gate of the transistor TRn2 and a gate of the transistor TRp2 are connected to a corresponding one of the plurality of decode signal lines DEC. In each of the SG selectors SUD, one of the transistor TRn2 and the transistor TRp2 is turned on according to a potential of the decode signal line DEC (signal level of a decode signal).

Each of the SG selectors SUS includes an n-channel transistor TRn3 (TRn3a, TRn3b, TRn3c, TRn3d) and a p-channel transistor TRp3 (TRp3a, TRp3b, TRp3c, TRp3d).

In each of the SG selectors SUS, one of source/drains of the transistor TRn3 is connected to the ground terminal Vss, and the other of the source/drains of the transistor TRn3 is connected to a node NDs (NDs0, NDs1, NDs2, NDs3). In each of the SG selectors SUS, one of source/drains of the transistor TRp3 is connected to a terminal (hereinafter, also referred to as the power supply terminal Vsgs) to which a voltage Vsgs is applied. The other of the source/drains of the transistor TRp3 is connected to the node NDs.

The node NDs of each of the SG selectors SUS is connected to a corresponding one of the plurality of source-side select gate lines SGS.

In each of the source-side SG selectors SUS, a gate of the transistor TRn3 and a gate of the transistor TRp3 are connected to a corresponding one of the plurality of decode signal lines DEC. In each of the SG selectors SUS, one of the transistor TRn3 and the transistor TRp3 is turned on according to the potential of the decode signal line DEC.

The SG decoder 142 includes a plurality of inverters INV0 and INV1.

Each of the address bit signals A0 and A1 is supplied to the corresponding inverter INV0 or INV1. The inverter INV0 outputs an inverted signal (hereinafter, referred to as the inverted address bit signal) bA0 of the address bit signal A0. The inverter INV1 outputs an inverted address bit signal bA1 of the address bit signal A1.

The SG decoder 142 controls the selected state and the non-selected state of the select gate lines SGD and SGS by using the address bit signals A0 and A1 and the inverted signals bA0 and bA1.

(Operation Example)

The SG decoder 142 selects one of the plurality of select gate line sets based on the address information ADD.

In the SG decoder 142, each of the plurality of decoding units DU receives the select gate line address.

Each of the decoding units DU decodes the select gate line address. Each of the decoding units DU outputs a signal (hereinafter, referred to as the decode signal) indicating a decoding result to the corresponding drain-side and source-side SG selectors SUD and SUS.

The decoding unit DU corresponding to the select gate line address outputs the decode signal indicating the selected state. The other decoding unit DU outputs the decode signal indicating the non-selected state.

In the selection circuit, each of the SG selectors SUD and SUS receives the decode signal from the corresponding decoding unit DU.

When the SG selectors SUD and SUS receive the decode signal indicating the selected state, the SG selectors SUD and SUS bring the corresponding select gate line set SG into the selected state. When the SG selector SUD and SUS receives the decode signal indicating the non-selected state, the SG selector sets the corresponding select gate line set SG to the non-selected state.

As a result, any one of the plurality of select gate line sets in the memory cell array is selected.

More specifically, an operation example of the SG decoder 142 will be described by exemplifying a case where the select gate line address ADD-SG is expressed by 2 bits as illustrated in FIG. 12.

The 2-bit select gate line address ADD-SG includes the two address bit signals A0 and A1.

In the 2-bit address ADD-SG, the address signal A0 corresponds to a lower bit, and the address signal A1 corresponds to an upper bit.

When the addresses of the select gate lines SGD and SGS are expressed by 2 bits, the memory cell array 100 includes the four drain-side select gate lines SGD (SGD0, SGD1, SGD2, SGD3) and the four source-side select gate lines SGS (SGS0, SGS1, SGS2, SGS3).

The SG decoder 142 of FIG. 12 selects one of the four select gate line sets SG based on the select gate line address ADD-SG.

A unit selected by the select gate line address ADD-SG varies depending on the configuration in the memory cell array 100. For example, the select gate line address ADD-SG corresponds to the block address of the memory cell array 100 or an address of the select unit (for example, sub-block or string unit) smaller than a block allocated in the block.

The address bit signals A0 and A1 of the select gate line address ADD-SG are supplied to the corresponding inverters INV0 and INV1. The inverter INV0 outputs the inverted signal bA0 of the address bit signal A0. The inverter INV1 outputs the inverted signal bA1 of the address bit signal A1.

In the address decode circuit 60, the decoding unit DU receives the address bit signals A0 and bA1 and/or the inverted signals bA0 and bA1 according to the corresponding select gate line set.

Each of the decoding units DU generates a decode signal based on the address bit signals A0 and A1 and/or the inverted signals bA0 and bA1.

For example, when the value of the select gate line address ADD-SG is "00", a decoding unit DU0 receives the signal bA0 of "1" and the signal bA1 of "1".

In this case, the other decoding units DU1, DU2, and DU3 each receive the address bit signal as follows.

The decoding unit DU1 receives the signal A0 of "0" and the signal bA1 of "1". The decoding unit DU2 receives the signal bA0 of "1" and the signal A1 of "0". The decoding unit DU3 receives the signal A0 of "0" and the signal A1 of "0".

The signal of "0" is associated with a signal at an "L" level. The signal of "1" is associated with a signal at an "H" level. For example, a voltage value (for example, a power supply voltage) indicating the signal at the "H" level is higher than a voltage value (for example, the ground voltage Vss) indicating the signal at the "L" level.

In the decoding unit DU0, the signal at the "H" (="1") level is supplied to the gates of the transistors TRn0 and TRn1 and the gates of the transistors TRp0 and TRp1.

In the decoding unit DU0, all of the n-channel transistors TRn0 and TRn1 are turned on by the signals bA0 and bA1 at the "H" level. The ground terminal Vss is connected to a decode signal line DEC0 via a transistor nTR in an ON state. All of the p-channel transistors TRp0 and TRp1 of the decoding unit DU0 are turned off by the signals bA0 and bA1 at the "H" level. The power supply terminal Vdd is electrically separated from the decode signal line DEC0 by the transistors TRp0 and TRp1 in an OFF state.

As a result, the decoding unit DU0 outputs the decode signal at the "L" level to the decode signal line DEC0.

In the decoding unit DU1, the transistor TRn0b is turned off and the transistor TRp1b is turned on by the signal A0 of "0". The ground terminal Vss is electrically separated from the decode signal line DEC1 by the transistor TRn0b in the OFF state. The power supply terminal Vdd is electrically connected to the decode signal line DEC1 by the transistor TRp1b in the ON state.

Accordingly, the decoding unit DU1 outputs the voltage Vdd to the decode signal line DEC1.

In the decoding unit DU2, the transistor TRn1c is turned off and the transistor TRp0c is turned on by the signal A1 of "0". The ground terminal Vss is electrically separated from the decode signal line DEC2 by the transistor TRn1c in the OFF state. The power supply terminal Vdd is electrically connected to the decode signal line DEC2 by the transistor TRp0c in the ON state.

Accordingly, the decoding unit DU2 outputs the voltage Vdd to the decode signal line DEC2.

In the decoding unit DU3, the transistors TRn0d and TRn1d are turned off and the transistors TRp0d and TRp1d are turned on by the signals A0 and A1 of "0". The ground terminal Vss is electrically separated from the decode signal line DEC3 by the transistors TRn0d and TRn1d in the OFF state. The power supply terminal Vdd is electrically connected to the decode signal line DEC3 by the transistors TRp0d and TRp1d in the ON state.

Accordingly, the decoding unit DU3 outputs the voltage Vdd to the decode signal line DEC3.

As described above, according to the signal levels of the signals A0, A1, bA0, and bA1 of the select gate line address ADD-SG, the decoding unit DU selected from the plurality of decoding units DU outputs the decode signal at the "L" level. The other decoding units DU not selected output the decode signal at the "H" level.

Each of the SG selectors SU receives the decode signal from the corresponding decoding unit DU.

The SG selectors SUD0 and SUS0 receive the decode signal at the "L" level from the decoding unit DU0.

The other SG selectors SUD1, SUD2, SUD3, SUS1, SUS2, and SUS3 receive the decode signals at the "H" level from the decoding units DU1, DU2, and DU3, respectively.

In the SG selector SUD0, the n-channel transistor TRn2a is turned off by the decode signal at the "L" level. The ground terminal Vss is electrically separated from the node NDd0 by the transistor TRn2a in the OFF state. The p-channel transistor TRp2a is turned on by the decode signal at the "L" level. The power supply terminal Vsgd is electrically connected to the node NDd0 by the transistor TRp2a in the ON state.

In the SG selector SUS0, the n-channel transistor TRn3a is turned off by the decode signal at the "L" level. The ground terminal Vss is electrically separated from the node NDs0 by the transistor TRn3a in the OFF state. The p-channel transistor TRp3a is turned on by the decode signal at the "L" level. The power supply terminal Vsgs is electrically connected to the node NDs0 by the transistor TRp3a in the ON state.

As a result, the voltage Vsgd is applied to the drain-side select gate line SGD0. The voltage Vsgs is applied to the source-side select gate line SGS0.

As a result, the select gate lines SGD0 and SGS0 are brought into the selected state. The select transistor ST1 connected to the select gate line SGD0 is turned on by the applied voltage Vsgd. The select transistor ST2 connected to the select gate line SGS0 is turned on by the applied voltage Vsgs.

In the other drain-side SG selectors SUD1, SUD2, and SUD3, the transistor TRn2 is turned on and the transistor TRp2 is turned off by the decode signal at the "H" level. As a result, the ground voltage Vss is applied to each of the drain-side select gate lines SGD1, SGD2, and SGD3.

As a result, the select transistor ST1 connected to each of the drain-side select gate lines SGD1, SGD2, and SGD3 is turned off.

In the other source-side SG selectors SUS1, SUS2, and SUS3, the transistor TRn3 is turned on and the transistor TRp3 is turned off by the decode signal at the "H" level. As a result, the ground voltage Vss is applied to each of the source-side select gate lines SGS1, SGS2, and SGS3. As a result, the select transistor ST2 connected to each of the source-side select gate lines SGS1, SGS2, and SGS3 is turned off.

As described above, the select gate lines SGD0 and SGS0 other than the selected select gate lines SGD0 and SGS0 are brought into the non-selected state.

Even when the address bit signals A0 and A1 of the select gate line address are "01", "10", and "11", any one of the decoding units DU1, DU2, and DU3 outputs the decode signal at the "L" level. The SG selector to which the decode signal at the "L" level is supplied brings the select gate lines SGD and SGS into the selected state.

As described above, in the present embodiment, the SG decoder 142 of FIG. 12 can select the drain-side select gate line SGD and the source-side select gate line SGS based on the address information ADD.

(Structure Example)

A structure example of the SG decoder in the flash memory of the present embodiment will be described with reference to FIGS. 13 and 14.

Figure 13:
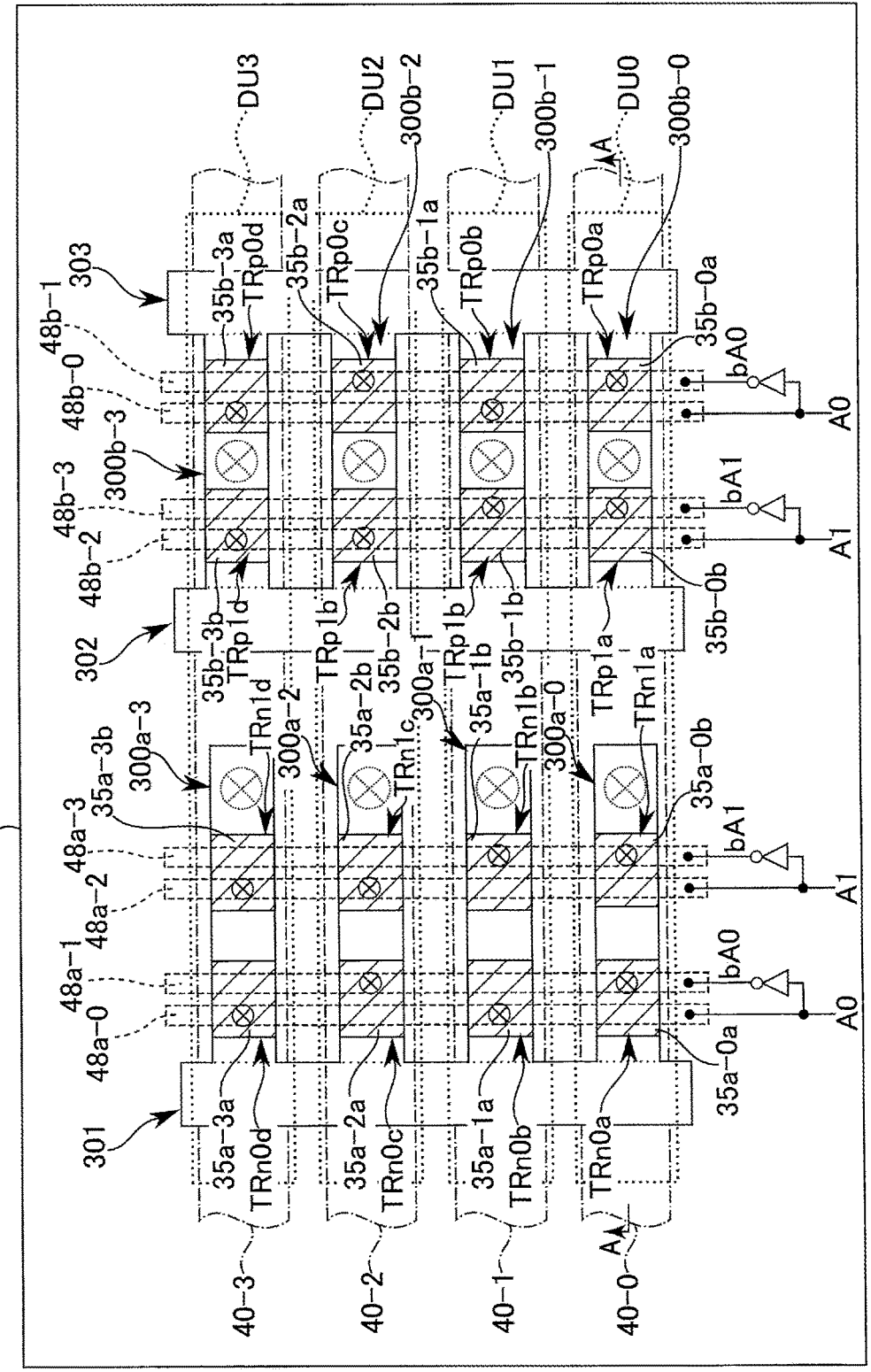
FIG. 13 is a top view illustrating the first example of the structure of the memory device of the first embodiment.

FIG. 13 is a plan view schematically illustrating a structure example of the address decode circuit of the SG decoder in the flash memory of the present embodiment.

Figure 14:
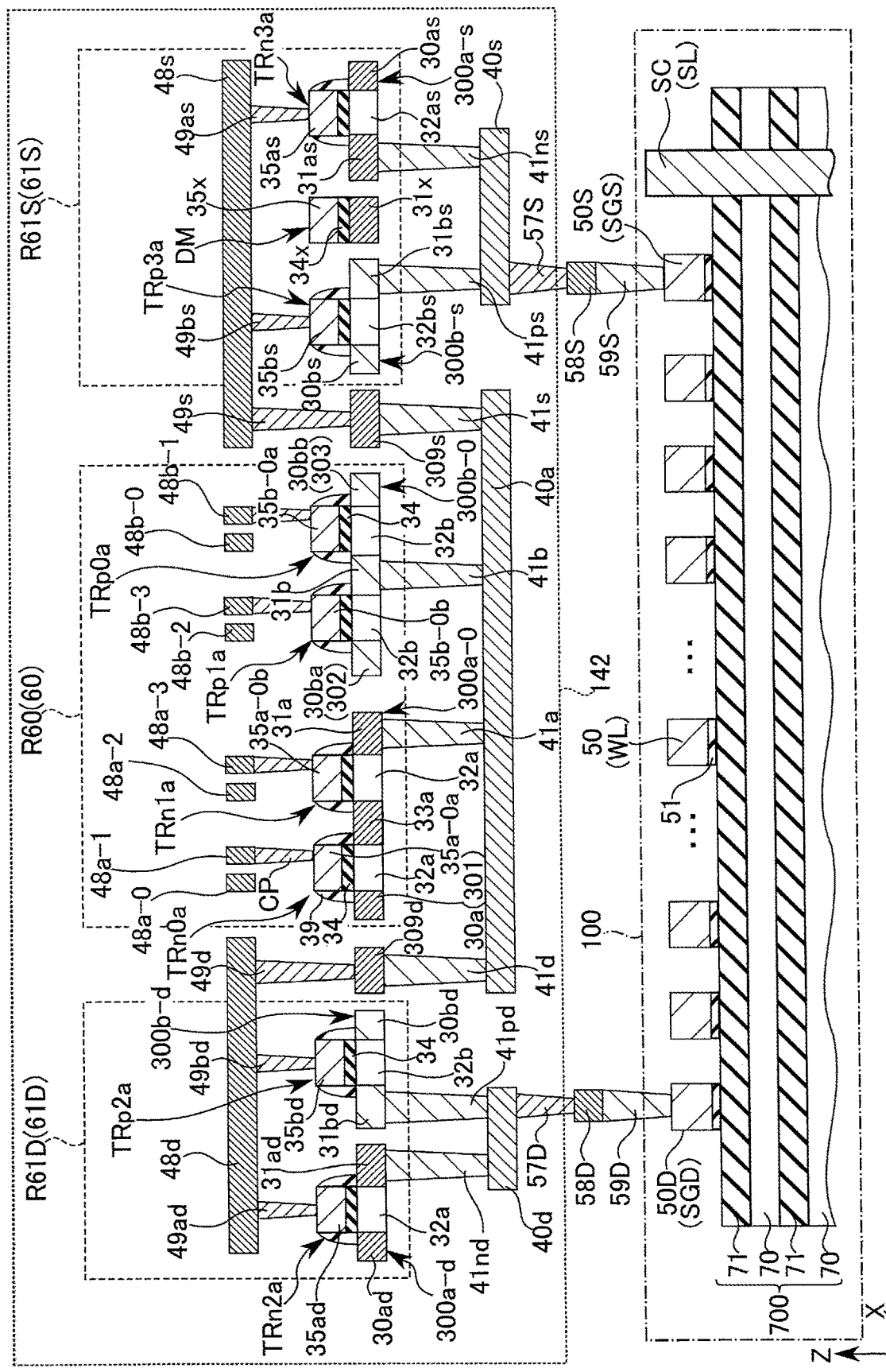
FIG. 14 is a cross-sectional view illustrating the first example of the structure of the memory device of the first embodiment.

FIG. 14 is a cross-sectional view schematically illustrating the structure example of the SG decoder in the flash memory of the present embodiment. FIG. 14 illustrates a cross section taken along line A-A of FIG. 13.

Since a cross section along the X direction in FIG. 14 is substantially the same as the example of FIG. 11, the description of a cross-sectional structure along the X direction in this example is omitted.

As illustrated in FIGS. 13 and 14, the plurality of semiconductor layers 300a (300a-0, 300a-1, 300a-2, 300a-3) and a plurality of the semiconductor layers 300b (300b-0, 300b-1, 300b-2, 300b-3) are provided in the TFT region 200 above the memory cell array 100 in the Z direction. The plurality of semiconductor layers 300a and 300b are provided at the same height from the upper surface of the substrate in the Z direction. Each of the semiconductor layers 300a and 300b extends in the Y direction.

A region R60 where the address decode circuit 60 is provided is provided above the memory cell array 100.

In the region R60, the n-channel field effect transistors (for example, TFTs) TRn0a and TRn1a are provided on each of the semiconductor layers 300a.

For example, in the decoding unit DU0, the two transistors TRn0a and TRn1a are provided on the semiconductor layer 300a-0.

Two gate electrodes 35a-0a and 35a-0b are provided on the semiconductor layer 300a-0 via a gate insulating film 34. For example, an insulating layer (hereinafter, also referred to as the sidewall insulating layer) 39 is provided on a side surface of the gate electrode 35a. The plurality of source/drain layers 30a, 31a, and 33a are provided in the semiconductor layer 300a-0. A channel region 32a is provided in the semiconductor layer 300a-0 between the source/drain layers 30a, 31a, and 33a.

The two transistors TRn0a and TRn1a adjacent to each other in the Y direction on the semiconductor layer 300a-0 share the source/drain layer 33a.

As a result, current paths of the transistors TRn0a and TRn1a on each of the semiconductor layers 300a-0 are connected in series.

One end of the semiconductor layer 300a-0 is electrically connected to a conductive layer (for example, metal layer) 40a. The conductive layer 40a extends in the Y direction. The conductive layer 40a is provided between the semiconductor layers 300a-0 and 300b-0 and the memory cell array 100 in the Z direction. A position of the conductive layer 40a in the Z direction is lower than a position of the semiconductor layer 300a in the Z direction.

The contact plug 41a is provided under a lower surface of one end (source/drain layer 31a) of the semiconductor layer 300a-0 in the Y direction. The contact plug 41a is provided between the semiconductor layer 300a-0 and the conductive layer 40a. The semiconductor layer 300a-0 is connected to the conductive layer 40a via the contact plug 41a.

The other end (source/drain layer 30a) of the semiconductor layer 300a-0 is connected to a semiconductor layer 301. The semiconductor layer 301 extends in the X direction. The plurality of semiconductor layers 300a-0 are commonly connected to the semiconductor layer 301. The semiconductor layer 301 is connected to the ground terminal Vss. The ground voltage Vss is supplied from the semiconductor layer 301 to the plurality of semiconductor layers 300a-0.

For example, the semiconductor layer 300a-0 and the semiconductor layer 301 constitute a continuous layer.

The source/drain layers 31a arranged in the X direction are separated for each of the decoding units DU. The source/drain layers 33a arranged in the X direction are separated for each of the decoding units DU.

A plurality of the conductive layers (for example, metal layers) 48a (48a-0, 48a-1, 48a-2, 48a-3) are provided above the gate electrodes 35a-0a and 35a-0b. Each of the conductive layers 48a extends in the X direction.

The four conductive layers 48a are arranged above the plurality of gate electrodes 35a arranged in the X direction. A position of the conductive layer 48a in the Z direction is higher than the position of the semiconductor layer 300a in the Z direction.

The address bit signal is supplied to each of the conductive layers 48a.

As described above, when the select gate line address ADD-SG includes the 2-bit address bit signal, the signal A0 is supplied to the conductive layer 48a-0, and the inverted signal bA0 is supplied to the conductive layer 48a-1. The signal A1 is supplied to the conductive layer 48a-2, and the inverted signal bA1 is supplied to the conductive layer 48a-3.

For example, in the transistors TRn0 and TRn1 of the decoding unit DU0, the conductive layer 48a-1 is connected to the gate electrode 35a-0a via a contact plug CP, and the conductive layer 48a-3 is connected to the gate electrode 35a-0b via the contact plug CP.

With respect to the other decoding units DU1, DU2, and DU3, the transistors TRn0 and TRn1 on each of the semiconductor layers 300a have substantially the same structure as the above-described structure. However, the conductive layers 48a-0, 48a-1, 48a-2, and 48a-3 connected to each of the gate electrodes 35a are different for each of the decoding units DU.

The p-channel field effect transistors (for example, TFTs) TRp0 and TRp1 are provided on each of the semiconductor layers 300b.

For example, in the decoding unit DU0, the two transistors TRp0a and TRp1a are provided on the semiconductor layer 300b-0.

Two gate electrodes 35b-0a and 35b-0b are provided on the semiconductor layer 300b-0 via the gate insulating film 34. For example, the sidewall insulating layer 39 is provided on a side surface of the gate electrode 35b. The plurality of source/drain layers 30b (30ba and 30bb) and 31b are provided in the semiconductor layer 300b. A channel region 32b is provided in the semiconductor layer 300b between the source/drain layers 30b and 31b.

In the plurality of semiconductor layers 300b arranged in the X direction, the source/drain layers 30ba arranged in the X direction are connected via a semiconductor layer 302. The semiconductor layer 302 extends in the X direction. The semiconductor layer 302 is connected to the power supply terminal Vdd. The power supply voltage Vdd is supplied from the semiconductor layer 302 to the plurality of semiconductor layers 300b.

For example, the semiconductor layer 300b and the semiconductor layer 302 constitute a continuous layer.

The plurality of source/drain layers 30ba may be connected via a contact plug and a conductive layer.

In the plurality of semiconductor layers 300b arranged in the X direction, the source/drain layers 30bb arranged in the X direction are connected via a semiconductor layer 303. The semiconductor layer 303 is connected to the power supply terminal Vdd. The power supply voltage Vdd is supplied from the semiconductor layer 303 to the plurality of semiconductor layers 300b.

For example, the semiconductor layer 300b and the semiconductor layer 303 constitute a continuous layer.

The plurality of source/drain layers 30bb may be connected via a contact plug and a conductive layer.

The two transistors TRp0a and TRn1a adjacent to each other in the Y direction on the semiconductor layer 300b share the source/drain layer 31b.

The source/drain layer 31b is electrically connected to the conductive layer 40a below the semiconductor layer 300b in the Z direction via the contact plug 41b.

The contact plug 41b overlaps the source/drain layer 31b in the Z direction. The source/drain layers 31b arranged in the Y direction are separated from each other.

A plurality of the conductive layers (for example, metal layers) 48b are provided above the gate electrodes 35b-0a and 35b-0b. Each of the conductive layers 48b extends in the X direction.

The four conductive layers 48b are arranged above the plurality of gate electrodes 35b arranged in the X direction. A position of the conductive layer 48b in the Z direction is higher than a position of the semiconductor layer 300b in the Z direction.

The address bit signal is supplied to each of the conductive layers 48b.

As described above, when the select gate line address ADD-SG includes the 2-bit address bit signal, the signal A0 is supplied to the conductive layer 48b-0, and the inverted signal bA0 is supplied to the conductive layer 48b-1. The signal A1 is supplied to the conductive layer 48b-2, and the inverted signal bA1 is supplied to the conductive layer 48b-3.

For example, in the transistors TRp0 and TRp1 of the decoding unit DU0, the conductive layer 48b-1 is connected to the gate electrode 35b-0a via the contact plug CP, and the conductive layer 48b-3 is connected to the gate electrode 35b-0b via the contact plug CP.

With respect to the other decoding unit DU, the transistors TRp0 and TRp1 on each of the semiconductor layers 300b have substantially the same structure as the above-described structure. However, the conductive layers 48b-0, 48b-1, 48b-2, and 48b-3 connected to each of the gate electrodes 35b are different for each of the decoding units DU.

The drain-side SG selector SUD and the source-side SG selector SUS are provided in regions R61D and R61S above the memory cell array 100 in the Z direction.

The region R61D where the drain-side SG selector SUD is provided is provided on one end side in the Y direction of the region R60 where the address decode circuit 60 is provided. The region R61S where the source-side SG selector SUS is provided is provided on the other end side in the Y direction of the region R60 where the address decode circuit 60 is provided.

For example, the drain-side SG selector SUD and the source-side SG selector SUS are provided in a region (for example, a region above the corresponding select gate line) near the corresponding select gate line set SG. Each of the SG selectors SUD and SUS is connected to the corresponding decoding unit DU via the plurality of conductive layers and the contact plug.

In order to connect the decoding unit DU and the SG selector SU (SUD, SUS), the plurality of conductive layers 40a, 48d, and 48s and the plurality of contact plugs included in the decode signal line DEC are drawn out in a desired layout in a region between the region R60 and the regions R61D and R61S.

The semiconductor layer 300a (300a-d, 300a-s) and the semiconductor layer 300b (300b-d, 300b-s) are provided in the arrangement regions R61D and R61S of the SG selectors SU.

In the region R61D of the drain-side SG selector SUD, the n-channel transistors TRn2a (TRn2a, TRn2b, TRn2c, TRn2d) are provided on the semiconductor layer 300a-d.

A gate electrode 35ad of the transistor TRn2 is provided above the semiconductor layer 300a-d via the gate insulating layer 34.

Two source/drain layers (n-type semiconductor regions) 30ad and 31ad of the transistor TRn2 are provided in the semiconductor layer 300a-d. The channel region 32ad is provided in the semiconductor layer 300a-d between the two source/drain layers 30ad and 31ad.

The source/drain layer 30ad is connected to the ground terminal Vss. The source/drain layer 31ad is connected to a conductive layer (node NDd) 40d via the contact plug 41nd. A position of the conductive layer 40d in the Z direction is lower than positions of the semiconductor layer 300a-d in the Z direction. The position of the conductive layer 40d in the Z direction is the same as the position of the conductive layer 40a in the Z direction.

The gate electrode 35ad is connected to the conductive layer 48d via the plug 49ad. A position of the conductive layer 48d in the Z direction is higher than the positions of the semiconductor layer 300a-d in the Z direction. The position of the conductive layer 48d in the Z direction is the same as the position of the conductive layer 48a in the Z direction.

In the region R61D of the drain-side SG selector SUD, the p-channel transistors TRp2 (TRp2a, TRp2b, TRp2c, TRp2d) are provided on the semiconductor layer 300b-d.

A gate electrode 35bd of the p-channel transistor TRp2 is provided above the semiconductor layer 300b-d via the gate insulating layer 34.

Two source/drain layers (p-type semiconductor regions) 30bd and 31bd of the transistor TRp2 are provided in the semiconductor layer 300b-d. The channel region 32bd is provided in the semiconductor layer 300b-d between the two source/drain layers 30bd and 31bd.

The source/drain layer 30bd is connected to the power supply terminal Vsgd. The source/drain layer 31bd is connected to the conductive layer 40d (node NDd) via a contact plug 41pd.

The gate electode 35bd is connected to the conductive layer 48d via a contact plug 49bd.

The conductive layer 48d is connected to the conductive layer 40a via contact plugs 41d and 49d and a conductive layer 309d. The conductive layer 309d is, for example, a semiconductor layer (for example, n-type semiconductor layer). A position of the conductive layer 309d in the Z direction is substantially the same as the position of the semiconductor layer 300 in the Z direction.

In the region R61S of the source-side SG selector SUS, the n-channel transistors TRn3 (TRn3a, TRn3b, TRn3c, TRn3d) are provided on the semiconductor layer 300a-s.

A gate electrode 35as of the transistor TRn3 is provided above the semiconductor layer 300a-s via the gate insulating layer 34.

Two source/drain layers (n-type semiconductor regions) 30as and 31as of the transistor TRn3 are provided in the semiconductor layer 300a-s. A channel region 32as is provided in the semiconductor layer 300a-s between the two source/drain layers 30as and 31as.

The source/drain layer 30as is connected to the ground terminal Vss. The source/drain layer 31as is connected to a conductive layer (node NDs) 40s via a contact plug 41ns. A position of the conductive layer 40s in the Z direction is lower than position of the semiconductor layer 300a-s in the Z direction. The position of the conductive layer 40s in the Z direction is the same as the position of the conductive layer 40a in the Z direction.

The gate electrode 35as is connected to the conductive layer 48s via a plug 49as. A position of the conductive layer 48s in the Z direction is higher than the position of the semiconductor layer 300a-s in the Z direction. The position of the conductive layer 48s in the Z direction is the same as the position of the conductive layer 48a in the Z direction.

In the region R61S of the source-side SG selector SUS, the p-channel transistors TRp3 (TRp3a, TRp3b, TRp3c, TRp3d) are provided on the semiconductor layer 300b-s.

A gate electrode 35bs of the p-channel transistor TRp3 is provided above the semiconductor layer 300b-s via the gate insulating layer 34.

Two source/drain layers (p-type semiconductor regions) 30bs and 31bs of the transistor TRp3 are provided in the semiconductor layer 300b-s. A channel region 32bs is provided in the semiconductor layer 300b-s between the two source/drain layers 30bs and 31bs.

The source/drain layer 30bs is connected to the power supply terminal Vsgs. The source/drain layer 31bs is connected to the conductive layer 40s (node NDd) via a contact plug 41ps.

The gate electrode 35bs is connected to the conductive layer 48s via a contact plug 49bs.

The conductive layer 48s is connected to the conductive layer 40a via contact plugs 41s and 49s and a conductive layer 309s. The conductive layer 309s is, for example, a semiconductor layer (for example, n-type semiconductor layer). A position of the conductive layer 309s in the Z direction is substantially the same as the position of the semiconductor layer 300 in the Z direction.

The decode signal line DEC includes the conductive layer 40 provided in a layer (an interconnect level) below the semiconductor layer 300, the conductive layer 48 provided in a layer above the semiconductor layer 300, and a plurality of contact plugs connecting the conductive layers 40 and 48. The layer (or interconnect level) is a region (space) provided at a certain height from a surface of the substrate in the Z direction.

Accordingly, the SG selector SU is connected to the decoding unit DU.

As described above, one signal line may be formed using a plurality of conductive layers provided in different layers.

For example, in an arrangement region R60S of the source-side SG selector, a dummy portion DM may be provided between regions between the two semiconductor layers 300a-s and 300b-s.

The dummy portion DM includes a conductive layer 31x, an insulating layer 34x, and a conductive layer 35x. The conductive layer 35x is provided above the conductive layer 31x in the Z direction with the insulating layer 34x interposed therebetween. The conductive layer 31x is, for example, a semiconductor layer. A position of the conductive layer 31x in the Z direction is the same as the position of the semiconductor layer 300 in the Z direction.

For example, the dummy portion DM indicates a boundary between blocks adjacent to each other in the Y direction.

The drain-side select gate line SGD of the memory cell array 100 is connected to the conductive layer 40d via contact plugs 57D and 59D and a conductive layer 58D.

Accordingly, the drain-side select gate line SGD is connected to the corresponding drain-side SG selector SUD in the SG decoder 142.

The source-side select gate line SGS of the memory cell array 100 is connected to the conductive layer 40s via contact plugs 57S and 59S and a conductive layer 58S.

Accordingly, the source-side select gate line SGS is connected to the corresponding source-side SG selector SUS in the SG decoder 142.

As described above, in the flash memory 1 of the present embodiment, the SG decoder 142 can be formed using the transistor (for example, thin film transistor) in a region above the memory cell array 100.

Example 2: Bit Line Selection Circuit

An example 2 of the peripheral circuit above the memory cell array in the flash memory of the present embodiment will be described with reference to FIG. 15.

The bit line selection circuit 151 may be provided in the TFT region 200 above the memory cell array 100.

Figure 15:
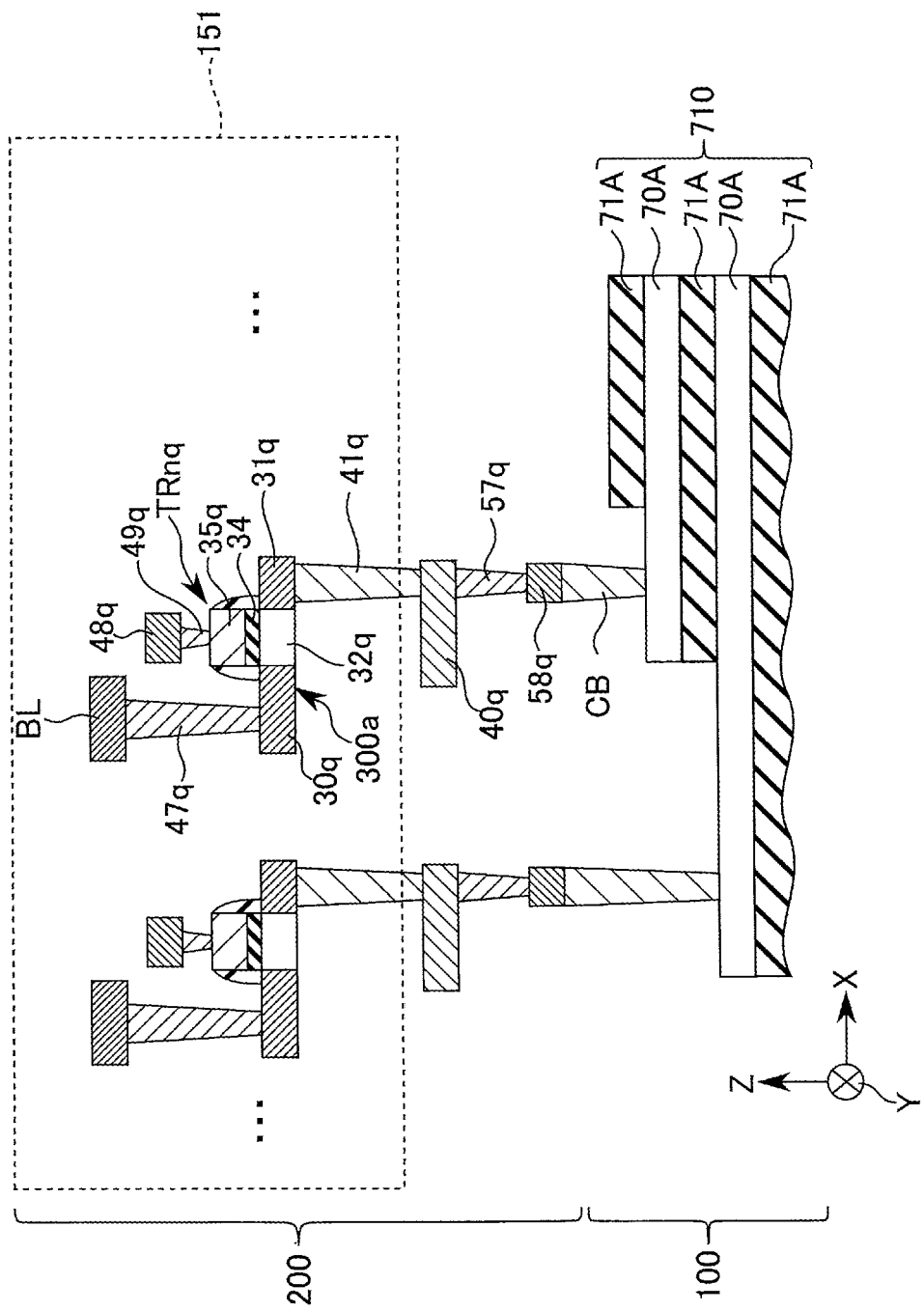
FIG. 15 is a cross-sectional view illustrating a second example of the structure of the memory device of the first embodiment.

FIG. 15 is a cross-sectional view schematically illustrating a structure example of the bit line selection circuit in the flash memory of the present embodiment.

The bit line selection circuit 151 includes a plurality of transistors TRnq. For example, the number of the plurality of transistors TRnq in the bit line selection circuit 151 is the same as the number of the plurality of bit lines BL.

Each of the transistors TRnq is connected to a corresponding one of the plurality of bit lines BL. Each of the transistors TRnq is connected to a corresponding one of the plurality of bit line contacts CB. Each of the transistors TRnq is provided between the corresponding bit line BL and the corresponding bit line contact CB.

Each of the transistors TRnq controls electrical connection and separation between the bit line BL and the bit line contact CB.

In the bit line selection circuit 151, each of the transistors TRnq functions as a bit line selector.

The transistor TRnq as the bit line selector is an n-channel field effect transistor (for example, TFT).

The transistor TRnq includes two source/drain layers 30q and 31q, a channel region 32q, a gate electrode 35q, and the gate insulating layer 34.

The two source/drain layers 30q and 31q are provided in the semiconductor layer 300a. The source/drain layers 30q and 31q are semiconductor regions.

The channel region 32q is provided in a portion of the two source/drain layers 30q and 31q in the semiconductor layer 300a. The channel region 32q is a p-type semiconductor region.

The gate electrode 35q is provided above the channel region 32q in the Z direction via the gate insulating layer 34.

The bit line BL extends in a direction (in the example of FIG. 15, the Y direction) parallel to the surface of the substrate 80 in a region above the semiconductor layer 300a in the Z direction.

The bit line BL is connected to the source/drain layer 30q via a contact plug 47q. The contact plug 47q is provided on an upper surface of the source/drain layer 30q in the Z direction.

The bit line contact CB is provided below the semiconductor layer 300a in the Z direction.

Contact plugs 41q and 57q and conductive layers 40q and 58q are provided between the bit line contact CB and the semiconductor layer 300a.

The contact plug 41q is provided below a lower surface of the semiconductor layer 300a in the Z direction. The contact plug 41q is connected to the source/drain layer 31q.

The conductive layer 40q is provided below the contact plug 41q in the Z direction. The conductive layer 40q is, for example, a metal layer.

The contact plug 57q is provided below the conductive layer 40q in the Z direction.

The conductive layer 58q is provided between the contact plug 57q and the bit line contact CB.

As described above, the bit line contact CB is connected to the source/drain layer 31q via the contact plugs 41q and 57q and the conductive layers 40q and 58q.

A contact plug 49q is provided on an upper surface of the gate electrode 35q in the Z direction.

A conductive layer 48q is provided above the gate electrode 35q in the Z direction. The conductive layer 48q is connected to the gate electrode 35q via the contact plug 49q. The conductive layer 48q is, for example, a metal layer.

A selection signal is supplied to the conductive layer 48q.

The transistor TRnq is turned on or off according to a signal level of a selection signal BCSEL supplied to the conductive layer 48q.

The bit line BL is electrically connected to a bit line contact BC by the transistor TRnq in the ON state. The bit line BL is electrically separated into the bit line contact BC by the transistor TRnq in the OFF state.

The bit line BL is connected to the corresponding semiconductor layer 70 via the transistor TRnq in the ON state and the semiconductor layer 70A.

As described above, in the bit line selection circuit 151, each of the transistors TRnq as the bit line selectors can control electrical connection between the bit line BL and the NAND string NS.

As described above, the bit line selection circuit 151 can be formed using the transistor (for example, thin film transistor) in the region above the memory cell array 100.

Example 3: Amplifier Circuit

An example 3 of the peripheral circuit above the memory cell array in the flash memory of the present embodiment will be described with reference to FIGS. 16 to 18.

The amplifier circuit 152 may be provided in the TFT region 200 above the memory cell array 100.

(Circuit Example)

Figure 16:
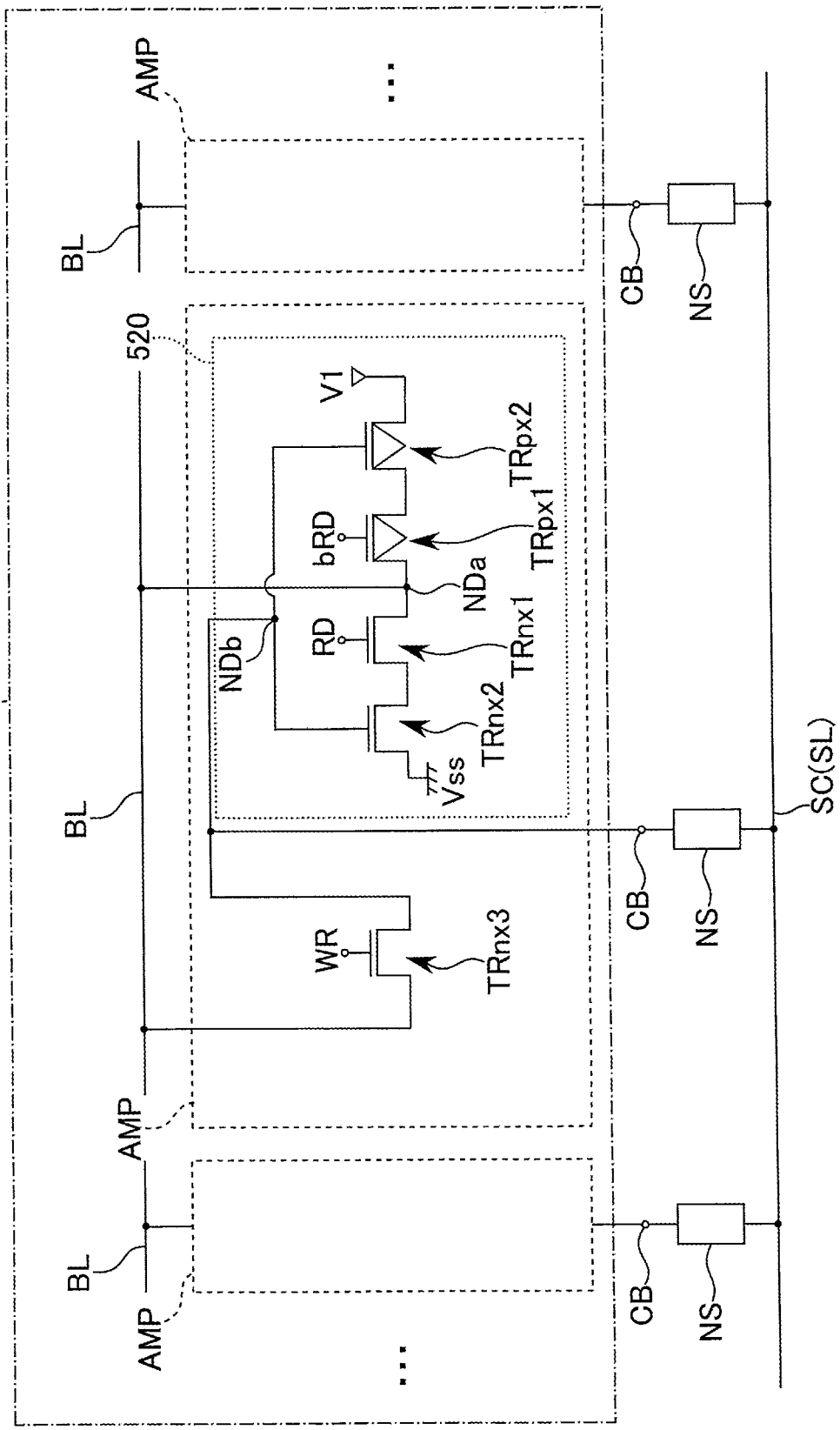
FIG. 16 is a circuit diagram illustrating a third example of the structure of the memory device of the first embodiment.

FIG. 16 is a circuit diagram illustrating a configuration example of the amplifier circuit in the flash memory of the present embodiment.

As illustrated in FIG. 16, the amplifier circuit (also referred to as the preamplifier) 152 is connected to the bit line BL in the sense amplifier 150.

The amplifier circuit 152 amplifies a signal from the NAND string NS (memory cell MC).

The amplifier circuit 152 includes a plurality of amplifier units AMP.

Each of the amplifier units AMP is connected to a corresponding one of the plurality of bit lines BL. Each of the amplifier units AMP is connected to a corresponding one of the plurality of bit line contacts CB.

The amplifier unit AMP amplifies a signal from the corresponding NAND string NS (memory cell MC). The amplifier unit AMP supplies the amplified signal to the sense amplifier 150 via the bit line BL.

For example, the amplifier unit AMP is provided between the bit line BL and the bit line contact CB instead of the bit line selector.

Each of the amplifier units AMP includes a plurality of transistors TRnx1, TRnx2, TRnx3, TRpx1, and TRpx2.

The transistors TRnx1, TRnx2, and TRnx3 are n-channel field effect transistors. In the transistors TRpx1 and TRpx2, the p-channel type is a p-channel field effect transistor.

One of source/drains of the transistor TRnx1 is connected to a node NDa. The other of the source/drains of the transistor TRnx1 is connected to one of source/drains of the transistor TRnx2. The other of the source/drains of the transistor TRnx2 is connected to the ground terminal Vss.

One of source/drains of the transistor TRpx1 is connected to the node NDa. The other of the source/drains of the transistor TRpx1 is connected to one of source/drains of the transistor TRpx2. The other of the source/drains of the transistor TRpx2 is connected to a terminal (hereinafter, also referred to as the power supply terminal V1) to which a voltage V1 is applied.

A gate of the transistor TRnx2 is connected to a node NDb. A gate of a transistor TRpx2 is connected to the node NDb.

The node NDa is connected to the corresponding bit line BL. The node NDb is connected to the corresponding bit line contact CB.

The transistors TRnx1, TRnx2, TRpx1, and TRpx2 function as inverters INV.

One of source/drains of the transistor TRnx3 is connected to the corresponding bit line BL. The other of the source/drains of the transistor TRnx3 is connected to the corresponding bit line contact CB.

The plurality of control signals RD, bRD, and WR are supplied to the amplifier unit AMP.

The signal RD is supplied to a gate of the transistor TRnx1. The signal bRD is supplied to a gate of the transistor TRpx1. The signal bRD is an inverted signal of the signal RD. The signal RD and the signal bRD have a complementary relationship.

The signal WR is supplied to a gate of the transistor TRnx3.

The signals RD and bRD are control signals indicating execution of the read operation. The transistors TRnx1 and TRpx1 (and the transistors TRnx2 and TRpx2) are activated by the signals RD and bRD during the read operation. During the write operation, the transistors TRnx1 and TRpx1 (and the transistors TRnx2 and TRpx2) are deactivated by the signals RD and bRD.

During the read operation, the signal level of the signal RD is set to the "H" level, and the signal level of the signal bRD is set to the "L" level. During the write operation, the signal level of the signal RD is set to the "L" level, and the signal level of the signal bRD is set to the "H" level.

The signal WR is a control signal indicating execution of the write operation. As a result, the transistor TRnx3 is activated during the write operation. During the read operation, the transistor TRnx3 is deactivated.

During the write operation, the signal level of the signal WR is set to the "H" level. During the read operation, the signal level of the signal WR is set to the "L" level.

A voltage value of the voltage V1 is controlled according to operation on the memory cell array 100. During the read operation, the voltage value of the voltage V1 has a certain value within a range of 2.3 V to 2.5 V, for example. During the write operation, the voltage value of the voltage V1 has a certain value within a range of 2.5 V to 2.8 V, for example.

For example, a voltage value at the "H" level in the signal RD is, for example, 2.5 V to 2.8 V. A voltage value at the "L" level in the signal RD is, for example, 0 V.

The voltage value at the "H" level in the signal WR is, for example, 2.5 V to 4.5 V. The voltage value at the "L" level in the signal WR is, for example, 0 V.

For example, during the erase operation, the potential states of the signals RD and WR and the terminals V1 and Vss can be set to an electrically floating state. However, in order to stabilize the operation, a certain voltage value may be supplied to the terminals V1 and Vss in the amplifier unit AMP or the gates of the transistors TRn and TRp.

(Operation Example)

The amplifier unit AMP in the amplifier circuit 152 operates as follows.

During the read operation of the flash memory 1, the signal RD at the "H" level and the signal WR at the "L" level are supplied to each of the amplifier units AMP.

The transistor TRnx3 is turned off by the signal WR at the "L" level. A signal path between the bit line contact CB and the bit line BL via the transistor TRnx3 is cut off by the transistor TRnx3 in the OFF state.

The transistor TRnx1 and the transistor TRpx1 are turned on by the signal RD at the "H" level and the signal bRD at the "L" level.

A signal (hereinafter, also referred to as the cell signal) from the NAND string NS is supplied to the gates of the transistors TRnx2 and TRpx2 via the bit line contact CB and the node NDb. One of the transistors TRnx2 and TRpx2 is turned on according to the signal level of the cell signal.

When the signal level of the cell signal is the "H" level, the transistor TRnx2 is turned on, and the transistor TRpx2 is turned off. As a result, the ground terminal Vss is electrically connected to the node NDa via the transistors TRnx1 and TRnx2 in the ON state. The voltage Vss is supplied to the bit line BL via the transistors TRnx1 and TRnx2 in the ON state and the node NDa.

When the signal level of the cell signal is the "L" level, the transistor TRnx2 is turned off, and the transistor TRpx2 is turned on. As a result, the voltage terminal V1 is electrically connected to the node NDa via the transistors TRpx1 and TRpx2 in the ON state. The voltage V1 is supplied to the bit line BL via the transistors TRpx1 and TRpx2 in the ON state and the node NDa.

As a result, during the read operation, the cell signal from the NAND string is output to the bit line BL at the signal level corresponding to the voltage value V1 or the voltage value Vss.

As described above, the amplifier unit AMP can amplify the cell signal from the NAND string NS to about the voltage values V1 and Vss during the read operation, and supply the amplified cell signal to the sense amplifier 150.

During the write operation of the flash memory 1, the signal RD at the "L" level and the signal WR at the "H" level are supplied to each of the amplifier units AMP.

The transistor TRnx1 is turned off by the signal RD at the "L" level, and the transistor TRpx1 is turned off by the signal bRD at the "H" level. A signal path between the bit line BL and the bit line contact CB via the nodes NDa and NDb is cut off by the transistors TRnx1 and TRpx1 in the OFF state.

The transistor TRnx3 is turned on by the signal WR at the "H" level. The bit line BL is connected to the bit line contact CB via the transistor TRnx3 in the ON state.

A 1-bit signal among the plurality of bits constituting the write data is supplied to the corresponding bit line BL. The potential (signal level) of the bit line BL has a value corresponding to a 1-bit signal ("0" or "1"). The potential of the bit line BL is applied to the bit line contact CB via the transistor TRnx3 in the ON state.

As a result, a signal corresponding to the write data is supplied to the NAND string NS.

As described above, the amplifier unit AMP can supply the write data to the NAND string NS during the write operation.

The transistors TRnx1, TRnx2, TRnx3, TRpx1, and TRpx2 of the amplifier unit AMP are provided in the TFT region 200.

(Structure Example)

Figure 17:
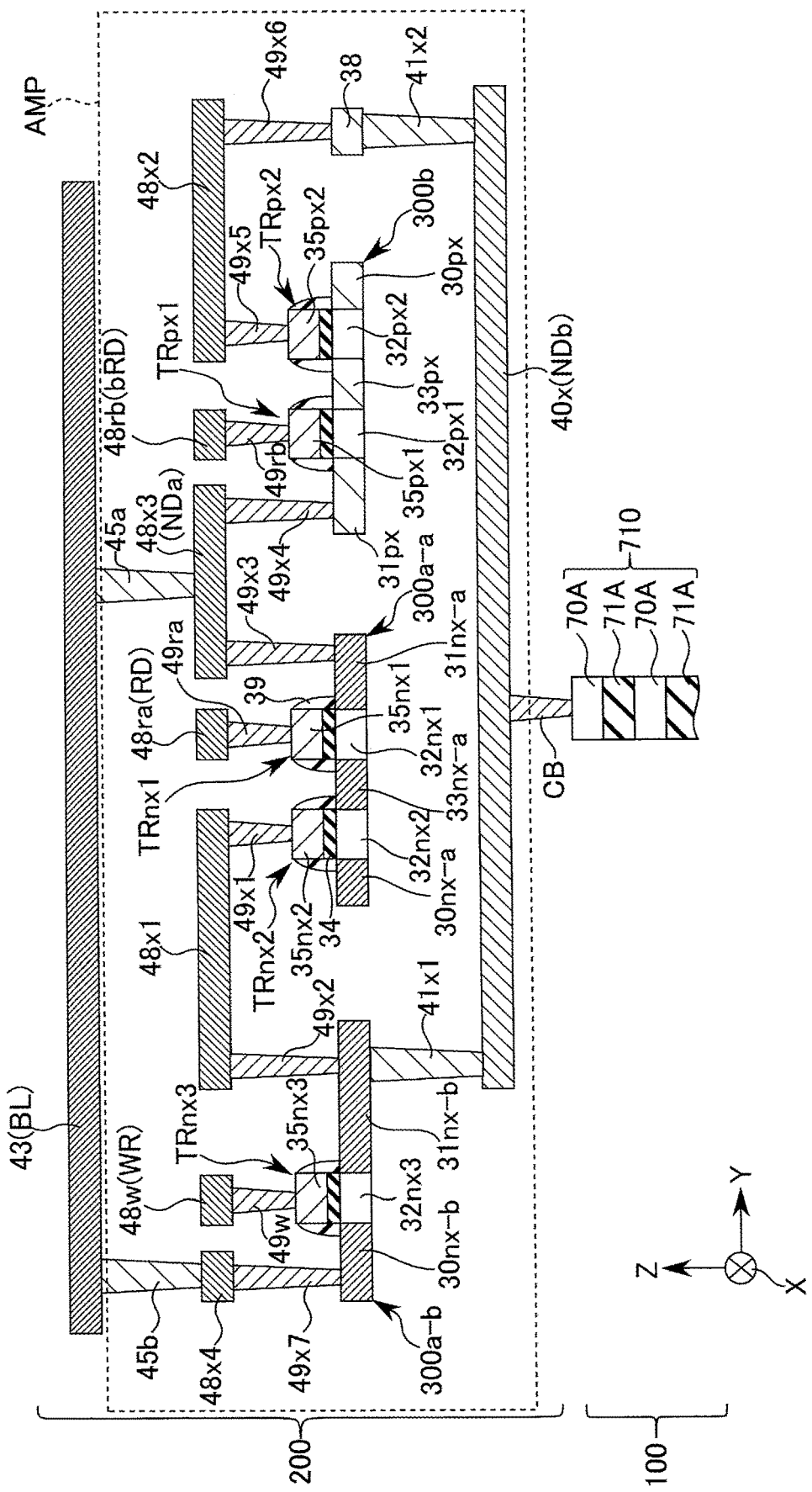
FIGS. 17 and 18 are cross-sectional views illustrating the third example of the structure of the memory device of the first embodiment.

FIG. 17 is a cross-sectional view illustrating a structure example of the amplifier unit in the flash memory of the present embodiment.

As illustrated in FIG. 17, the plurality of transistors TRnx1, TRnx2, TRnx3, TRpx1, and TRpx2 in the amplifier unit AMP are provided on the plurality of semiconductor layers 300 in the TFT region 200.

The plurality of semiconductor layers 300 (300a-a, 300a-b, 300b) are provided in the region 200 above the memory cell array 100.

A conductive layer 40x is provided in a region between the memory cell array 100 and the semiconductor layer 300. The position of the semiconductor layer 300 in the Z direction is higher than a position of the conductive layer 40x in the Z direction.

The transistors TRnx1 and TRnx2 are provided on the semiconductor layer 300a-a.

Three source/drain layers 30nx-a, 31nx-a, and 33nx-a are provided in the semiconductor layer 300a-a. The conductivity types of the source/drain layers 30nx-a, 31nx-a, and 33nx-a are n-types.

A channel region 32nx1 of the transistor TRnx1 is provided in the semiconductor layer 300a-a between the two source/drain layers 31nx-a and 33nx-a. A channel region 32nx2 of the transistor TRnx2 is provided in the semiconductor layer 300a-a between the two source/drain layers 30nx-a and 33nx-a.

The two transistors TRnx1 and TRnx2 share the source/drain layer 33nx-a.

The source/drain layer 30nx-a is connected to the ground terminal Vss. For example, the source/drain layer 30nx-a extends in the X direction. The ground terminal Vss is connected to an end of the source/drain layer 30nx-a in the X direction.

A contact plug 49x3 is provided on the source/drain layer 31nx-a. The contact plug 49x3 is connected to a conductive layer (node NDa) 48x3.

The conductive layer (for example, metal layer) 48x3 is provided above the semiconductor layer 300 in the Z direction. The conductive layer 48x3 spans between one end of the semiconductor layer 300a-a and one end of the semiconductor layer 300b adjacent in the Y direction above the semiconductor layer 300 in the Z direction.

A gate electrode 35nx1 of the transistor TRnx1 is provided above the channel region 32nx1 via the gate insulating layer 34. A contact plug 49ra is provided on an upper surface of a gate electrode 35nx2. The gate electrode 35nx1 is connected to a conductive layer 48ra via the contact plug 49ra. The signal RD is supplied to the conductive layer 48ra. For example, the conductive layer 48ra extends in the X direction.

The gate electrode 35nx2 of the transistor TRnx2 is provided above the channel region 32nx2 via the gate insulating layer 34. A contact plug 49x1 is provided on an upper surface of the gate electrode 35nx2. The gate electrode 35nx2 is connected to a conductive layer 48x1 via the contact plug 49x1. The conductive layer 48x1 is connected to the conductive layer 40x below the semiconductor layer 300 via a contact plug 49x2, the semiconductor layer 300a-b (region 31nx-b), and a contact plug 41xl.

The transistors TRpx1 and TRpx2 are provided on the semiconductor layer 300b.

Three source/drain layers 30px, 31px, and 33px are provided in the semiconductor layer 300b. The conductivity types of the source/drain layers 30px, 31px, and 33px are p-type.

A channel region 32px1 of the transistor TRpx1 is provided in the semiconductor layer 300b between the two source/drain layers 31px and 33px. A channel region 32px2 of the transistor TRpx2 is provided in the semiconductor layer 300b between the two source/drain layers 30px and 33px.

The two transistors TRpx1 and TRpx2 share the source/drain layer 33px.

The source/drain layer 30px is connected to the power supply terminal V1. For example, the source/drain layer 30px extends, for example, in the X direction. The power supply terminal V1 is connected to an end of the source/drain layer 30px in the X direction.

A contact plug 49x4 is provided on the source/drain layer 31px. The contact plug 49x4 is connected to the conductive layer 48x3 (node NDa). As a result, the source/drain layer 31px of the transistor TRpx2 is connected to the source/drain layer 31nx-a of the transistor TRnx2.

A gate electrode 35px1 of the transistor TRpx1 is provided above the channel region 32px1 via the gate insulating layer 34. A contact plug 49rb is provided on an upper surface of the gate electrode 35px1. The gate electrode 35px1 is connected to a conductive layer 48rb via the contact plug 49rb. The signal bRD is supplied to the conductive layer 48rb. For example, the conductive layer 48rb extends in the X direction.

A gate electrode 35px2 of the transistor TRpx2 is provided above the channel region 32px2 via the gate insulating layer 34. A contact plug 49x5 is provided on an upper surface of the gate electrode 35px2. The gate electrode 35px2 is connected to a conductive layer 48x2 via the contact plug 49x5. The conductive layer 48x2 is connected to the conductive layer (node NDb) 40x below the semiconductor layer 300 via a contact plug 49x6, a conductive layer (for example, semiconductor layer) 38, and a contact plug 41x2. As a result, the gate electrode 35px2 of the transistor TRpx2 is connected to the gate electrode 35nx2 of the transistor TRnx2 via the conductive layer 40x below the semiconductor layer 300.

The semiconductor layer 300a-b is adjacent to the semiconductor layer 300a-a in the Y direction.

The transistor TRnx3 is provided on the semiconductor layer 300a-b.

Two source/drain layers 30nx-b and 31nx-b of the transistor TRnx3 are provided in the semiconductor layer 300a-b. The conductivity types of the source/drain layers 30nx-b and 31nx-b are n-type.

A channel region 32nx3 of the transistor TRnx3 is provided in the semiconductor layer 300a-b between the two source/drain layers 30nx-b and 31nx-b.

A gate electrode 35nx3 of the transistor TRnx3 is provided above the channel region 32nx3 via the gate insulating film 34. A contact plug 49w is provided on an upper surface of the gate electrode 35nx3. The gate electrode 35nx3 is connected to a conductive layer 48w via the contact plug 49w. The signal WR is supplied to the conductive layer 48w. For example, the conductive layer 48w extends in the X direction.

The contact plug 41x1 is provided below a lower surface of a source/drain layer 31nx-b in the Z direction. As a result, the source/drain layer 31nx-b of the transistor TRnx3 is connected to the conductive layer 40x via the contact plug 41x1.

A contact plug 49x2 is provided on an upper surface of the source/drain layer 31nx-b. The contact plug 49x2 connects the conductive layer 48x1 to the conductive layer 40x via the semiconductor layer 300a-b and the contact plug 41x1.

The conductive layer 43 is provided above the conductive layer 48 (48x1, 48x2, 48x3, 48ra, 48rb, 48w, 48x4) in the Z direction.

The conductive layer 43 functions as the bit line BL. The bit line BL is connected to the conductive layer 48x3 via a contact plug 45a. As a result, the bit line BL is electrically connected to the source/drain layer 31nx-a of the transistor TRnx1 and the source/drain layer 31px of the transistor TRpx1.

The bit line BL is connected to the conductive layer 48x4 via a contact plug 45b. As a result, the bit line BL is connected to the source/drain layer 30nx-b of the transistor TRnx3.

The conductive layer 40x is connected to the bit line contact CB. As a result, the gate electrode 35nx2 of the transistor TRnx2, the gate electrode 35px2 of the transistor TRpx2, and the source/drain layer 31nx-b of a transistor TRnx3 are connected to the corresponding NAND string NS.

In FIG. 17, the transistors TRnx1, TRnx2, TRnx3, TRpx1, and TRpx2 of the amplifier unit AMP are provided in one layer (hierarchy, interconnect level).

However, the amplifier unit AMP may include the plurality of transistors TRn and TRp in a plurality of layers.

Figure 18:
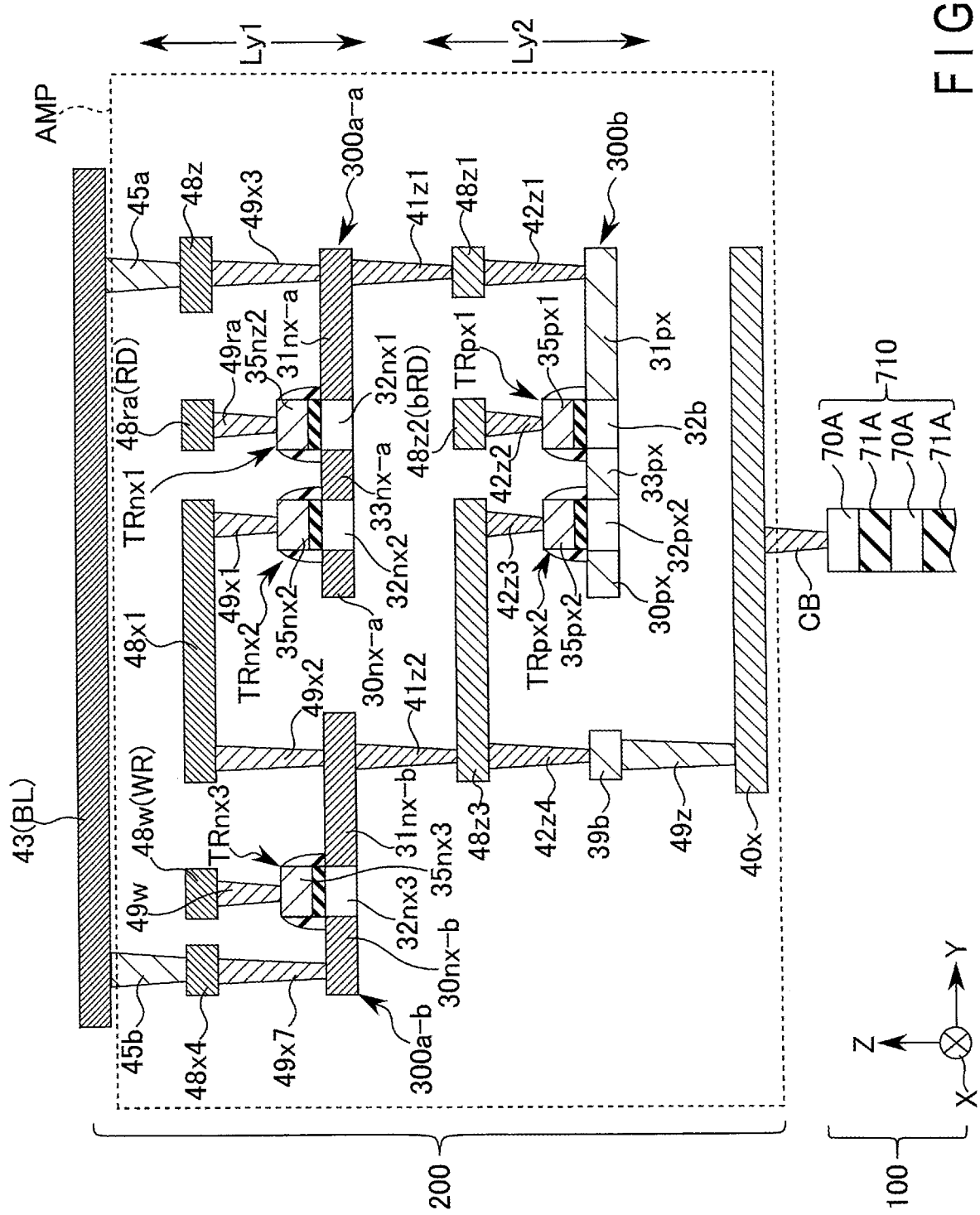

FIG. 18 is a cross-sectional view illustrating a structure example of the amplifier unit in the flash memory of the present embodiment.

As illustrated in FIG. 18, the amplifier unit AMP includes the plurality of transistors TRnx (TRnx1, TRnx2, TRnx3) in a layer Ly1 and the plurality of transistors TRpx (TRpx1, TRpx2) in a layer Ly2.

Each of the plurality of transistors TRnx1, TRnx2, and TRnx3 in the layer Ly1 is an n-type transistor.

Each of the plurality of transistors TRpx1 and TRpx2 in the layer Ly2 is a p-type transistor.

The layer Ly2 is provided below the layer Ly1 in the Z direction.

A plurality of plugs 41z (41z1 and 41z2) and 42z (42z1, 42z2, 42z3, and 42z4) and a conductive layer 48z (48z1, 48z2, and 48z3) are provided in a region between the semiconductor layer 300a in the layer Ly1 and the semiconductor layer 300b in the layer Ly2.

A source/drain layer 31px of the transistor TRpx1 is connected to the source/drain layer 31nx-a of the transistor TRnx1 via the contact plug 42z1, the conductive layer 48z1, and the contact plug 41z1. The source/drain layer 31nx-a is connected to the contact plugs 45a and 49x3 and the conductive layer 48z.

As a result, the source/drain layer 31px of the transistor TRpx1 is connected to the bit line BL via the source/drain layer 31nx-a of the transistor TRnx1.

The gate electrode 35px1 of the transistor TRpx1 is connected to the conductive layer 48z2 via the contact plug 42z2. The conductive layer 48z2 extends in the X direction. The signal bRD is supplied to the conductive layer 48z2.

The gate electrode 35px2 of the transistor TRpx2 is connected to the conductive layer 48z3 via the contact plug 42z3.

The conductive layer 48z3 is electrically connected to the source/drain layer 31nx-b of the transistor TRnx3 via the contact plug 41z2.

The conductive layer 48z3 is connected to the conductive layer 40x via the contact plug 42z4, a conductive layer (for example, semiconductor layer) 39b, and a contact plug 49z.

As a result, the source/drain layer 31nx-b of the transistor TRnx3, the gate electrode 35nx2 of the transistor TRnx2, and the gate electrode 35px2 of the transistor TRpx2 are connected to the corresponding NAND string NS via the conductive layer 40x.

As described above, the amplifier unit AMP is formed using the plurality of elements TRn and TRp provided in the different hierarchies Ly1 and Ly2.

As described above, the amplifier circuit 152 can be formed using the transistor (for example, thin film transistor) in the region 200 above the memory cell array 100.

(c1) Modification

A modification of the flash memory of the present embodiment will be described with reference to FIGS. 19 and 20.

Figure 19:
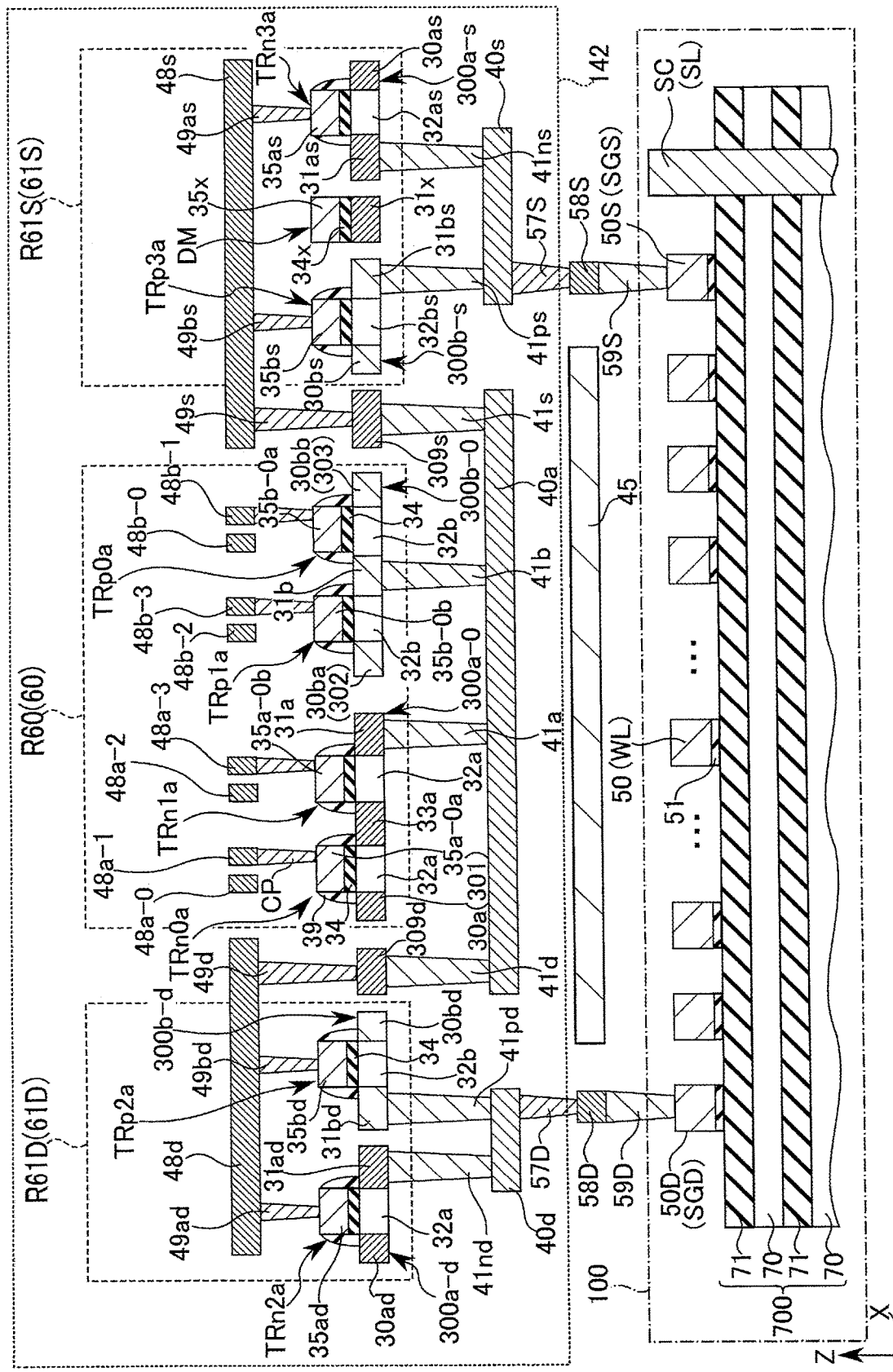
FIG. 19 is a cross-sectional view illustrating a modification of the structure of the memory device of the first embodiment.

FIG. 19 is a cross-sectional view illustrating an example of the modification of the flash memory of the present embodiment.

As illustrated in FIG. 19, a shield layer 45 may be provided between the memory cell array 100 and the TFT region 200.

For example, the shield layer 45 is provided below a lowermost layer (for example, the conductive layer 40) in the TFT region 200 in the Z direction.

The shield layer 45 is separated from the components of the TFT region 200 and the components of the memory cell array 100. For example, the shield layer 45 is in the electrically floating state. However, a voltage having a certain voltage value may be applied to the shield layer 45.

As a result, an influence of noise between the memory cell array 100 and the TFT region 200 can be suppressed. FIG. 20 is a cross-sectional view illustrating an example of the modification of the flash memory of the present embodiment.

As illustrated in FIG. 20, an SG decoder 142A may be provided above the memory cell array 100 in the Z direction so as to span over two blocks BLKa and BLKb adjacent to each other in the Y direction.

The connection relationship and structure of the elements TRp and TRp and the interconnects SGD and SGS in this example are substantially the same as those in the example of FIG. 14. Here, differences between the structure of FIG. 20 and the structure of FIG. 14 will be described.

The address decode circuit 60 includes the plurality of transistors TRn and TRp.

The plurality of transistors TRn (TRn0a, TRn1a) are provided on the semiconductor layer 300 above the block BLKa in the Z direction.

The plurality of transistors TRp (TRp0a, TRp1a) are provided on the semiconductor layer 300 above the block BLKb in the Z direction.

As described above, the elements TRn and TRp constituting the address decode circuit 60 are provided in a region spanning over the plurality of blocks BLKa and BLKb in the TFT region 200 above the memory cell array 100.

A drain-side SG selector 61D1 is connected to the drain-side select gate line SGD in the block BLKa. The drain-side SG selector 61D1 includes an n-type transistor TRnd1 and a p-type transistor TRpd1. The transistors TRnd1 and TRpd1 are provided on the semiconductor layer 300 similarly to the example of FIG. 14.

A drain-side SG selector 61D2 is connected to the drain-side select gate line SGD in the block BLKb. The drain-side SG selector 61D2 includes an n-type transistor TRnd2 and a p-type transistor TRpd2. The transistors TRnd2 and TRpd2 are provided on the semiconductor layer 300 similarly to the example of FIG. 14.

A source-side SG selector 61S is connected to the source-side select gate line SGS in the block BLKa and the source-side select gate line SGS in the block BLKb.

The source-side SG selector 61S is provided above the layer stack 700 in the Z direction so as to cross a boundary between the two blocks BLKa and BLKb.

As described above, in the example of FIG. 20, the drain-side SG selectors 61D1 and 61D2 are provided independently for each of the plurality of blocks BLK, and the source-side SG selector 61S is shared by the plurality of blocks BLK.

The SG decoder 142A controls selection and non-selection of the plurality of select gate lines SGD and SGS of the two adjacent blocks BLKa and BLKb.

As a result, the number of elements in the TFT region 200 is reduced. A margin of a space for drawing out the interconnect in the TFT region 200 is improved.

A plurality of constituent elements of the SG decoder may be provided in a plurality of layers arranged in the Z direction, like the constituent elements of the amplifier unit in FIG. 18.

(d1) Manufacturing Method

A method of manufacturing the flash memory of the present embodiment will be described with reference to FIGS. 21 to 31.

Figure 21:
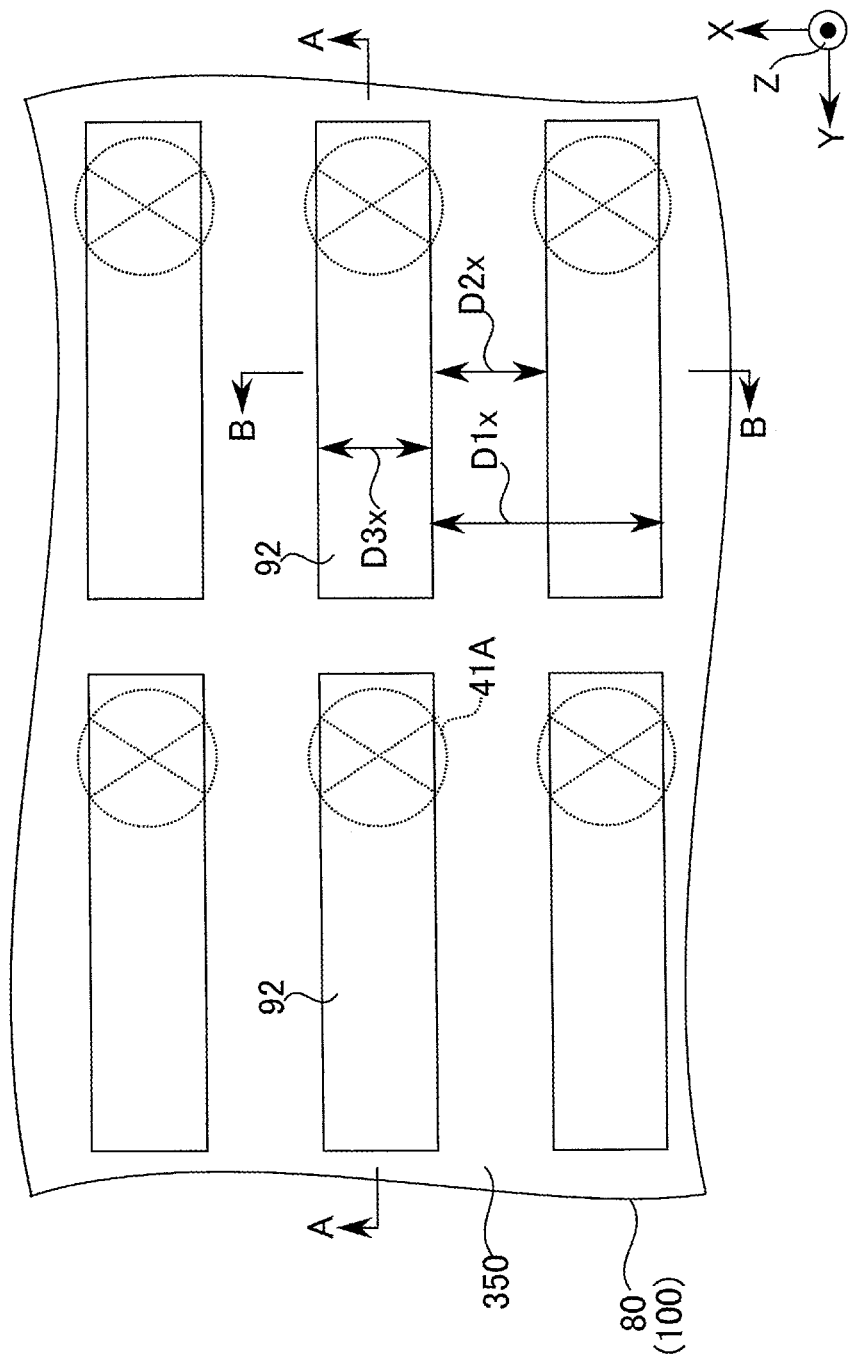
FIG. 21 is a top view illustrating a step of a method of manufacturing the memory device of the first embodiment.
Figure 22:
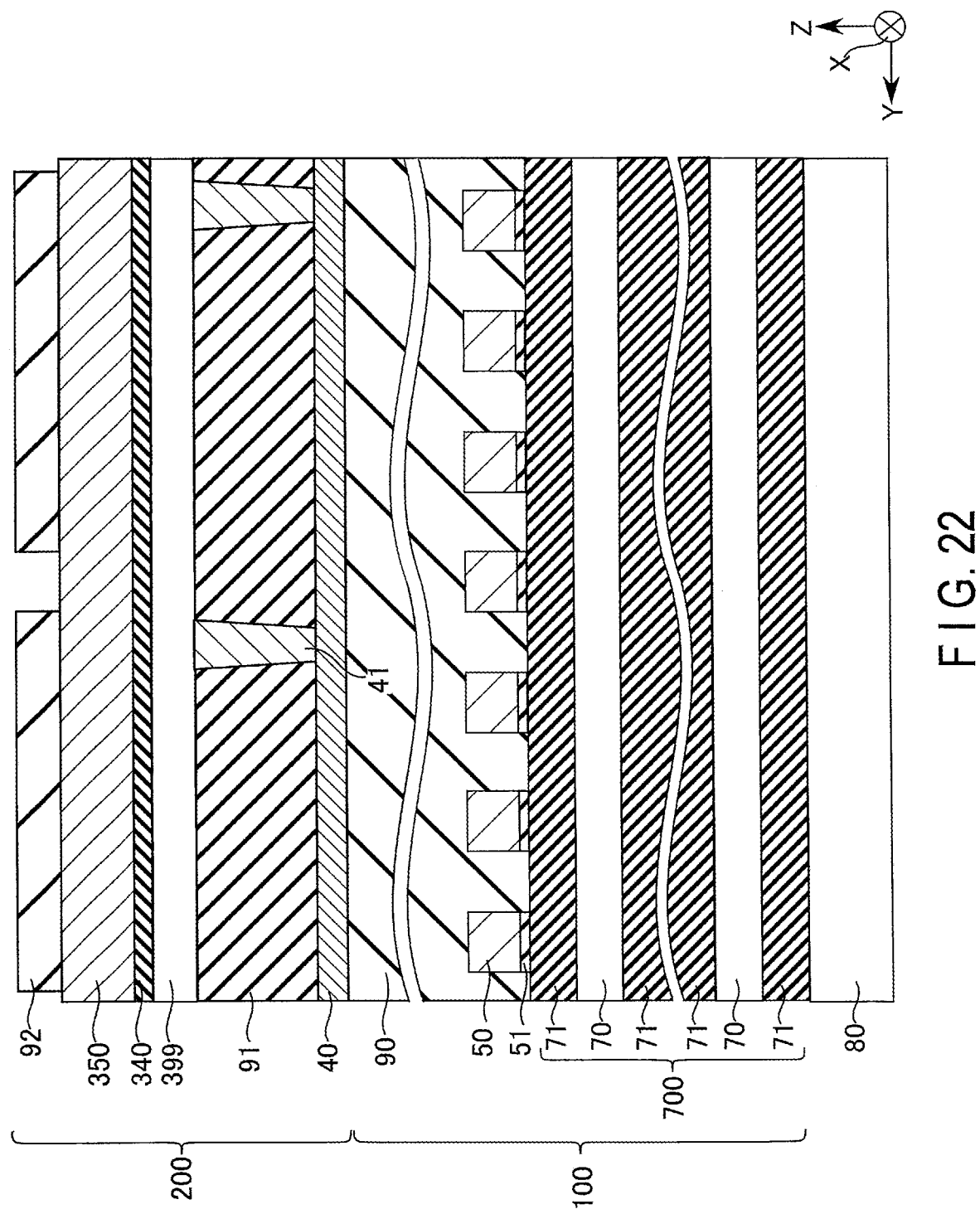
FIGS. 22, 23, 24, 25, and 26 are cross-sectional views illustrating a step of the method of manufacturing the memory device of the first embodiment.
Figure 23:
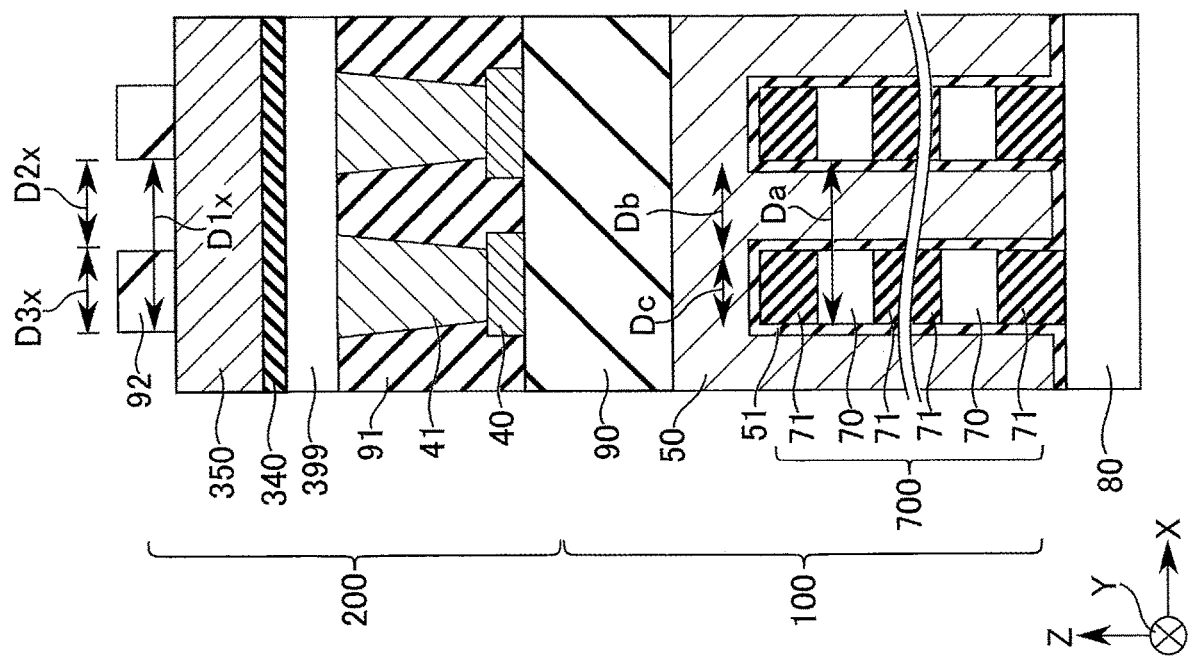

One step of the method of manufacturing the flash memory of the present embodiment will be described with reference to FIGS. 21 to 23. FIG. 21 is a top view in one step of the method of manufacturing the flash memory of the present embodiment. FIGS. 22 and 23 are schematic cross-sectional process diagrams illustrating one step of the method of manufacturing the flash memory of the present embodiment. FIG. 22 is a cross-sectional view taken along line A-A of FIG. 21. FIG. 23 is a cross-sectional view taken along line B-B in FIG. 23.

As illustrated in FIGS. 21 to 23, the plurality of layer stacks 700 are formed above the substrate 80 by a known technique. As described above, the layer stack 700 includes the plurality of semiconductor layers 70 and the plurality of insulating layers 71. In the layer stack 700, the semiconductor layers 70 and the insulating layers 71 are alternately stacked in the Z direction.

The plurality of layer stacks 700 are arranged in the X direction at a pitch of a dimension Da, for example. The interval between the layer stacks 700 in the X direction is, for example, the dimension Db. For example, the layer stack 700 has the dimension Dc in the X direction.

The plurality of memory layers 51 and the plurality of conductive layers 50 are formed on the plurality of layer stacks 700 by a known technique. The memory layer 51 and the conductive layer 50 extend in the X direction. The memory layer 51 and the conductive layer 50 span over the plurality of layer stacks 700. For example, the memory layer 51 is a stacked film including a charge storage layer (for example, silicon nitride film).

The plurality of conductive layers 50 include the word line WL, the select gate lines SGD and SGS, and the like. For example, a string select line (not illustrated) is independently formed for each of the layer stacks 700.

For example, the step structure (not illustrated) is formed above the substrate 80 to be connected to the layer stack 700.

An insulating layer 90 is formed on the layer stack 700 and the conductive layer 50.

A plurality of contact plugs (not illustrated) are formed in the insulating layer 90 by a known technique.

The plurality of contact plugs are connected to the semiconductor layer 70 or the conductive layer 50.

The plurality of conductive layers (interconnects) 40 are formed on the insulating layer 90 by a known technique.

An insulating layer 91 is formed on the insulating layer 90, the interconnect 40, and the contact plug by a known technique.

After planarization processing of an upper surface of the insulating layer 91, the contact plug 41 is formed in the insulating layer 91 by a known technique.

A semiconductor layer 399, an insulating layer 340, and a conductive layer 350 are sequentially formed on the insulating layer 91 (and on the contact plug 41).

An n-type or p-type dopant may be added into the semiconductor layer 399. On the insulating layer 91, the n-type semiconductor layer 399 and the p-type semiconductor layer 399 can be formed by a known technique.

A plurality of mask layers 92 are formed on the conductive layer 350 in the Z direction by well-known photolithography and etching. The mask layer 92 has a quadrangular pattern extending in the Y direction.

The plurality of mask layers 92 are arranged in the X direction at a certain pitch D1x. For example, the pitch D1x of the plurality of mask layers 92 is set to be substantially the same as the pitch Da of the layer stack 700.

An interval D2x between mask layers 93 in the X direction is set to be substantially the same as the interval Db between the layer stacks 700 in the X direction.

For example, the dimension D3x of the mask layer in the X direction is set to be substantially the same as the dimension Dc of the layer stack 700 in the X direction.

One step of the method of manufacturing the flash memory of the present embodiment will be described with reference to FIGS. 24 and 25.

Figure 24:
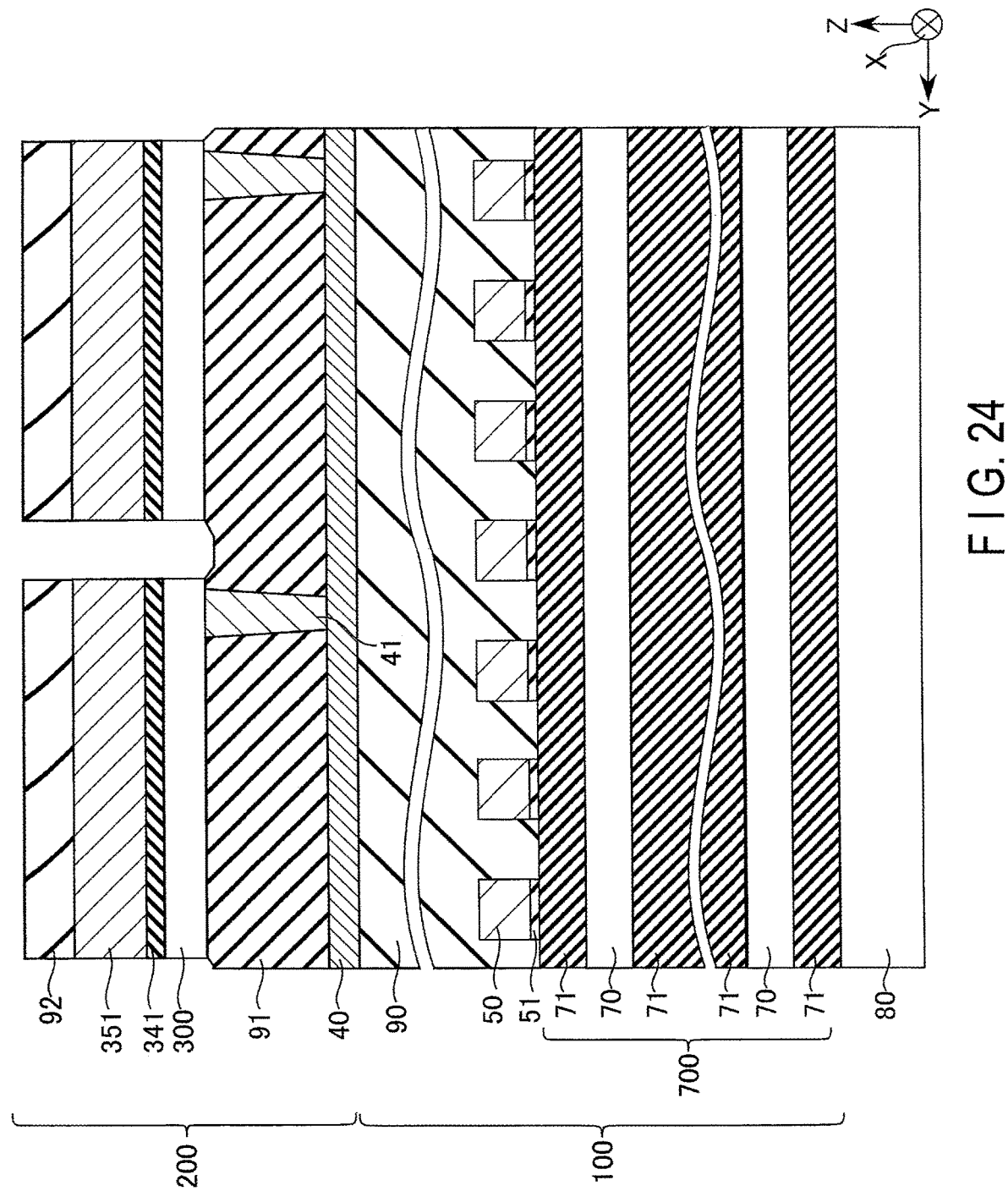
Figure 25:
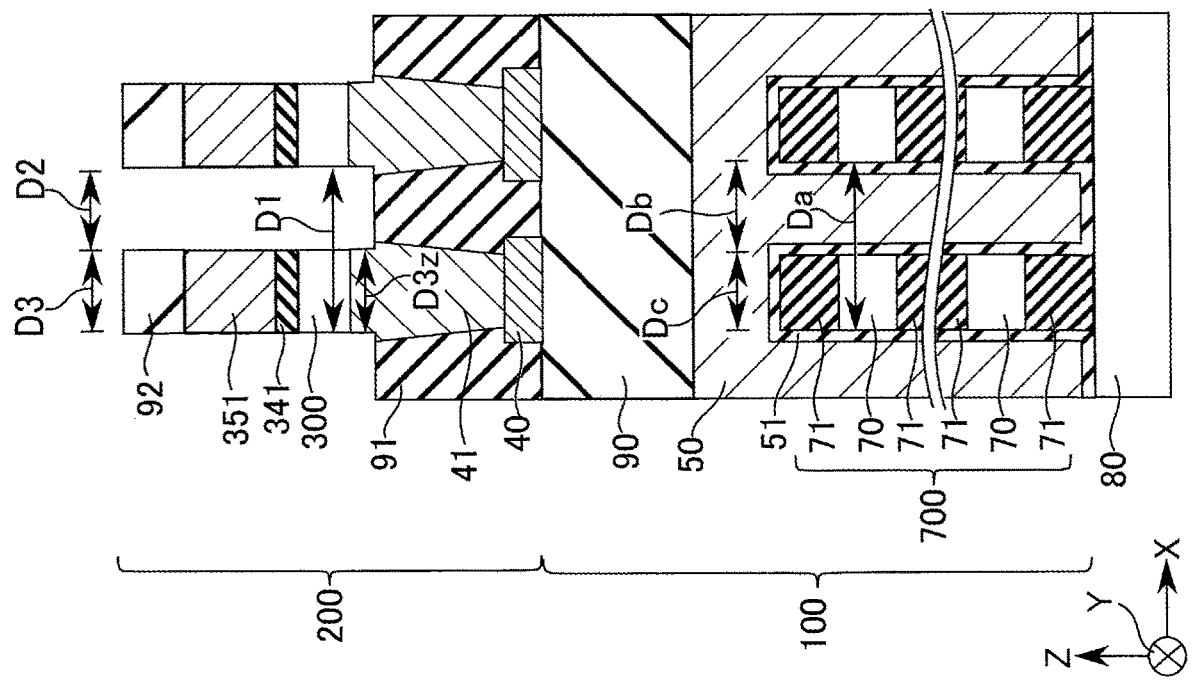

FIGS. 24 and 25 are schematic cross-sectional views illustrating one step of the method of manufacturing the flash memory of the present embodiment. FIG. 24 is a cross-sectional view along a cross section (Y-Z plane) along the Y direction of the memory cell array. FIG. 25 is a cross-sectional view along a cross section (X-Z plane) along the X direction of the memory cell array.

As illustrated in FIGS. 24 and 25, the conductive layer, the insulating layer, and the semiconductor layer are etched based on a shape of the mask layer 92.

As a result, the semiconductor layer 300, the conductive layer 351, and the insulating layer 341 are formed in the TFT region 200 above the memory cell array 100. The semiconductor layer 300 has a quadrangular planar shape when viewed from the Z direction. For example, the semiconductor layer 300 extends in the Y direction.

As described above, the conductive layer 351, the insulating layer 341, and the semiconductor layer 300 are collectively processed by a common etching process.

As a result, positions of ends in the X direction of the conductive layer 351 and the insulating layer 341, which have been etched, are aligned with a position of an end of the etched semiconductor layer 300 in the X direction (and the Y direction).

Dimensions of the conductive layer 351 and the insulating layer 341 in the X direction are substantially equal to the dimension D3 of the semiconductor layer 300 in the X direction.

The pitch D1 of the plurality of semiconductor layers 300 is substantially equal to the dimension Da of the pitch of the layer stack 700. The interval D2 between the semiconductor layers 300 adjacent to each other in the X direction is substantially equal to a space Db between the layer stacks 700 adjacent to each other in the X direction. The dimension D3 of the semiconductor layer in the X direction is substantially equal to the dimension Dc of the layer stack 700.

A member below the semiconductor layer 300 in the Z direction is etched by occurrence of over-etching in an etching step.

As a result, the end of the contact plug 41 in the X direction is etched. An upper portion of the contact plug 41 (a portion of the contact plug 41 on the semiconductor layer 300 side) is etched. In this case, a position of an end of the upper portion of the contact plug 41 in the X direction is aligned with the position of the end of the semiconductor layer 300 in the X direction. The dimension D3z of the upper portion of the contact plug 41 in the X direction is substantially equal to the dimension D3 of the semiconductor layer 300.

One step of the method of manufacturing the flash memory of the present embodiment will be described with reference to FIG. 26.

Figure 26:
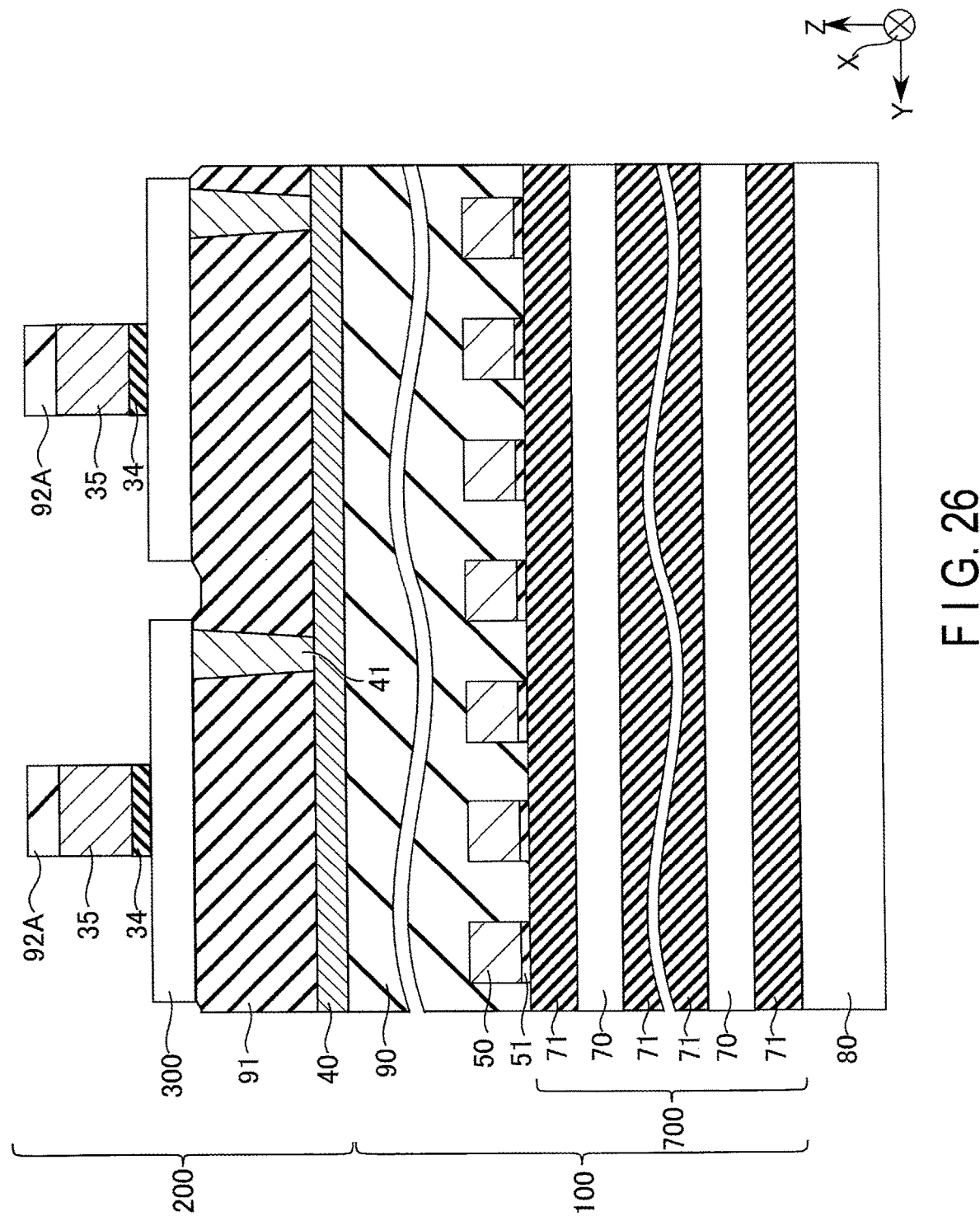

FIG. 26 is a schematic cross-sectional view illustrating one step of the method of manufacturing the flash memory of the present embodiment. FIG. 26 is a cross-sectional view along the cross section (Y-Z plane) along the Y direction of the memory cell array.

As illustrated in FIG. 26, in a formation region of the gate electrode of the transistor, a mask layer 92A is formed above the semiconductor layer 300 in the Z direction by a known technique.

Etching is performed on the conductive layer and the insulating layer based on a shape of the mask 92A. As a result, the gate electrode 35 and the gate insulating layer 34 are formed on the semiconductor layer 300.

One step of the method of manufacturing the flash memory of the present embodiment will be described with reference to FIGS. 27 to 29.

Figure 27:
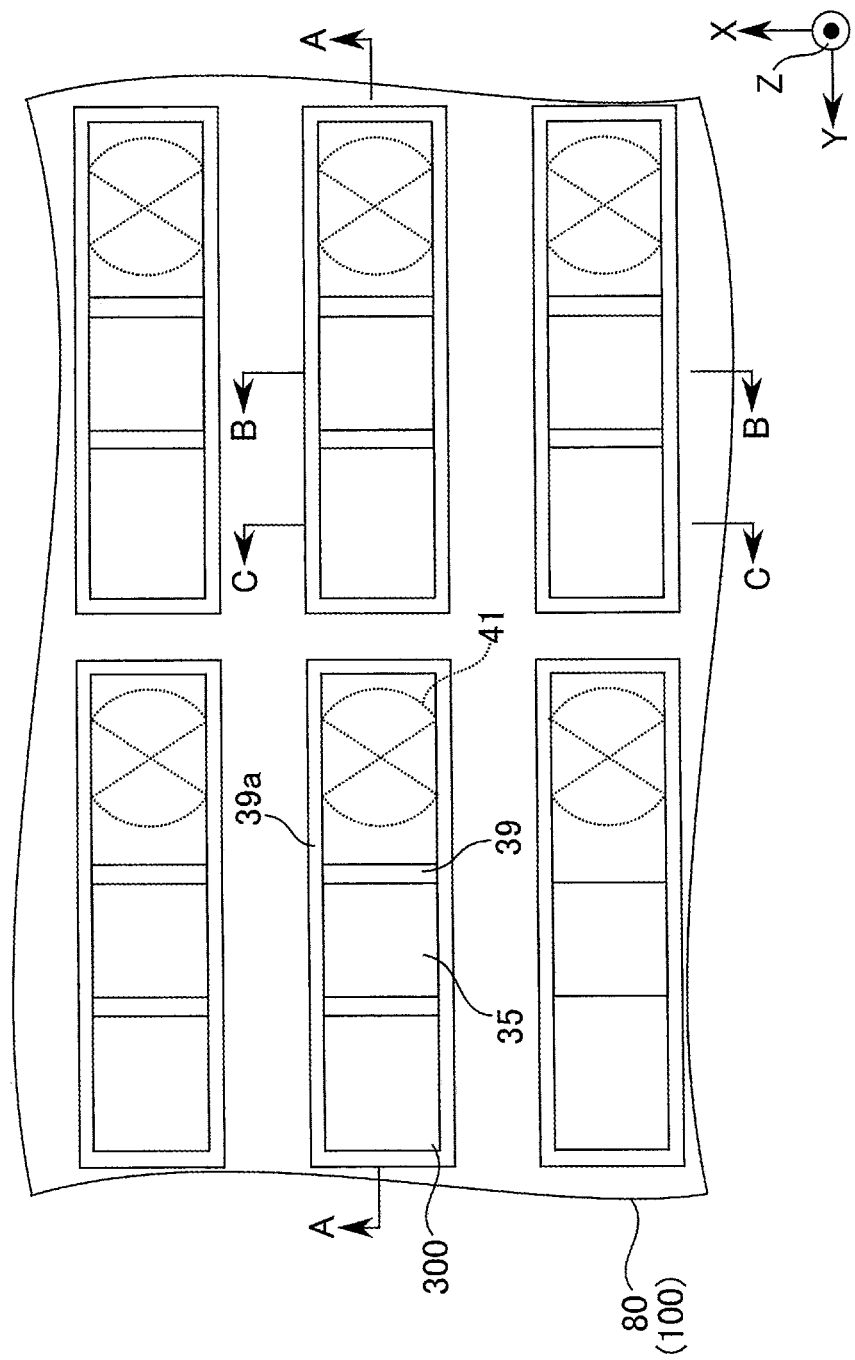
FIG. 27 is a top view illustrating a step of the method of manufacturing the memory device of the first embodiment.

FIG. 27 is a top view in one step of the method of manufacturing the flash memory of the present embodiment. FIGS. 28 and 29 are schematic cross-sectional process diagrams illustrating one step of the method of manufacturing the flash memory of the present embodiment. FIG. 28 is a cross-sectional view taken along line A-A of FIG. 27. (a) of FIG. 29 is a cross-sectional view taken along line B-B in FIG. 27. (b) of FIG. 29 is a cross-sectional view taken along line C-C in FIG. 27.

Figure 28:
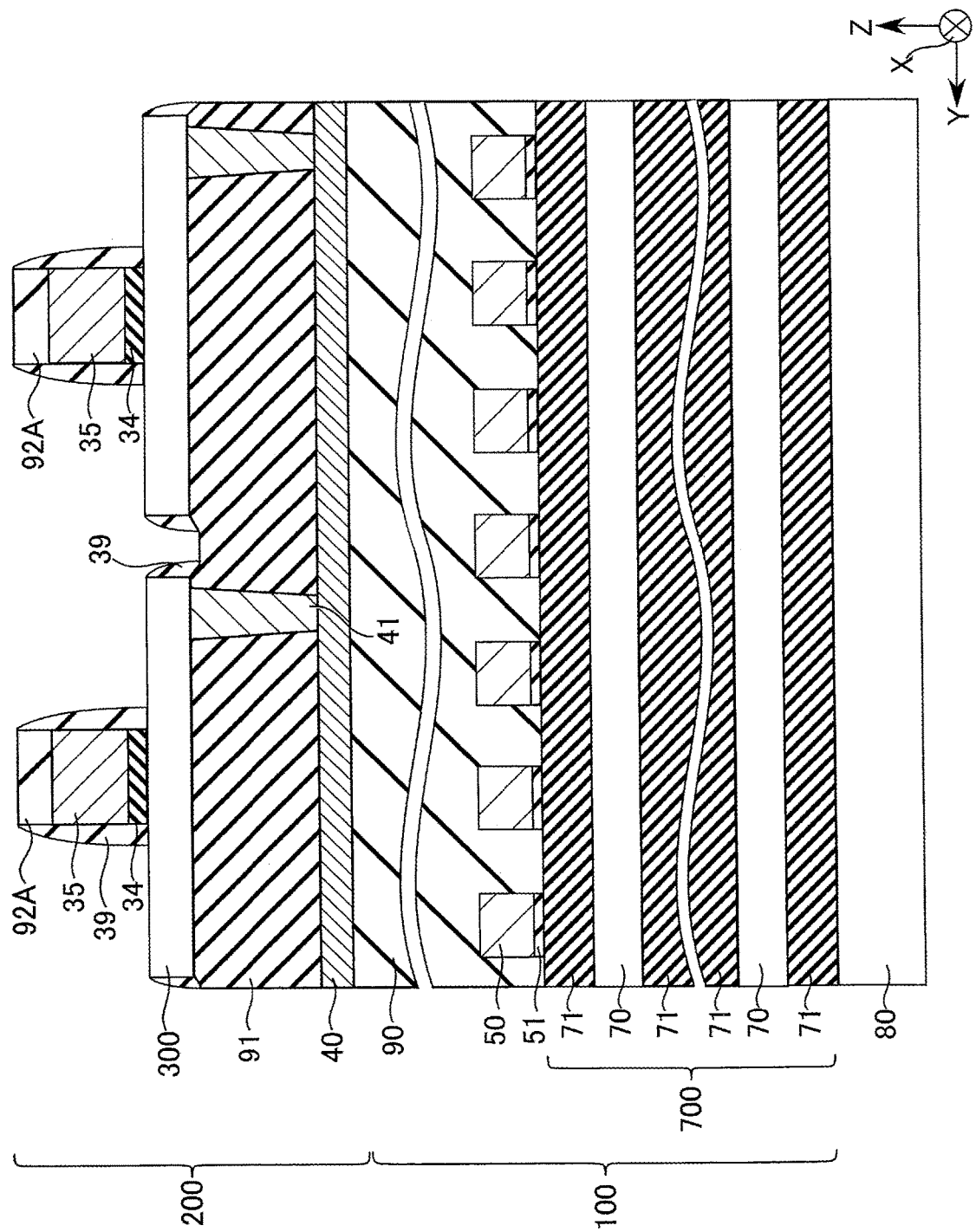
FIGS. 28, 29, 30, and 31 are cross-sectional views illustrating a step of the method of manufacturing the memory device of the first embodiment.
Figure 29:
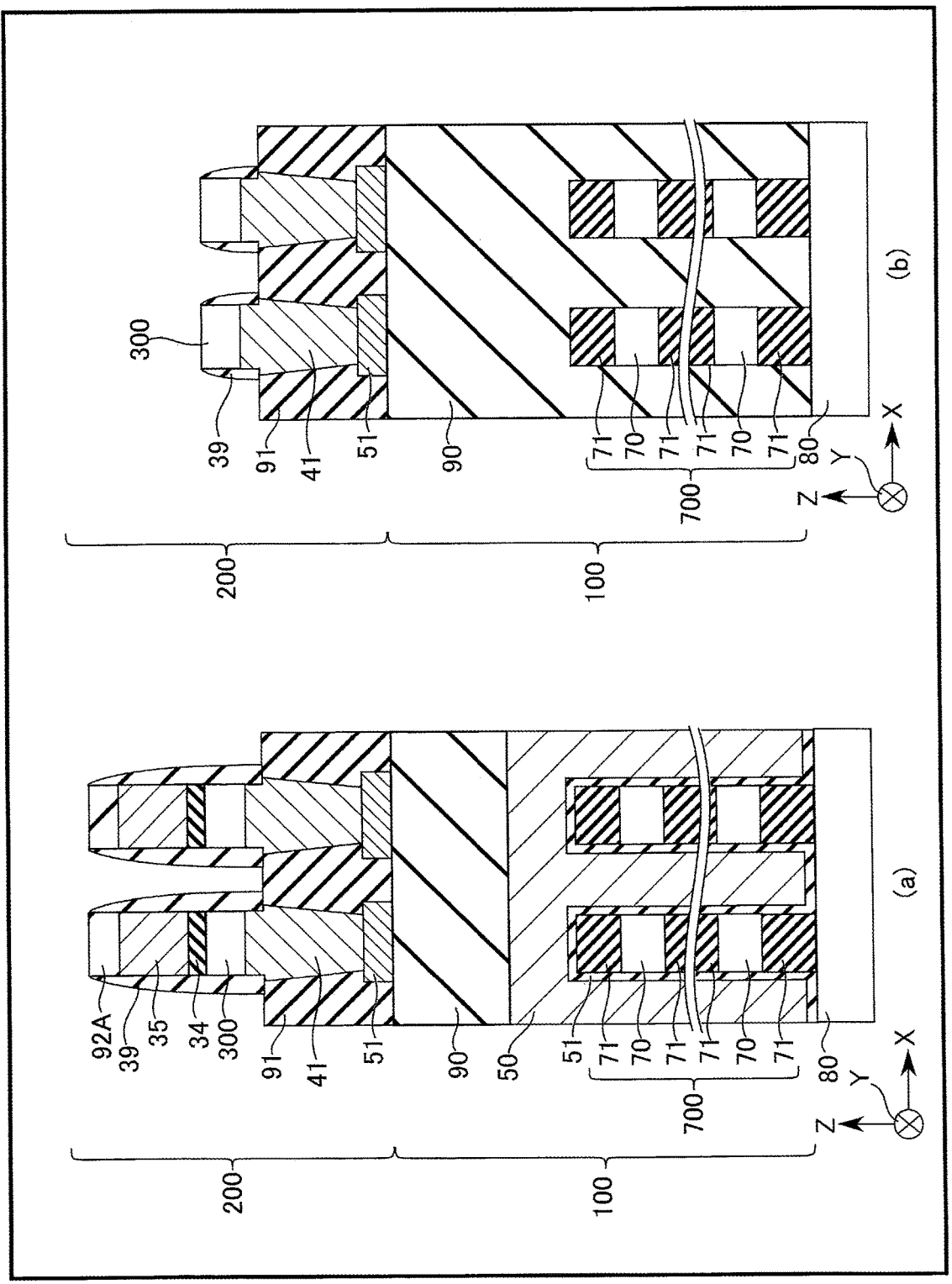

As illustrated in FIGS. 27 to 29, an insulating layer is formed on the semiconductor layer 300, the gate insulating layer 34, the gate electrode 35, and the insulating layer 91. Etch-back is selectively performed on the formed insulating layer.

As a result, the sidewall insulating layer 39 remains on the side surface of the gate electrode 35 in the X direction and the Y direction. At this time, the sidewall insulating layer 39 remains on a side surface of the semiconductor layer 300.

One step of the method of manufacturing the flash memory of the present embodiment will be described with reference to FIGS. 30 and 31.

Figure 30:
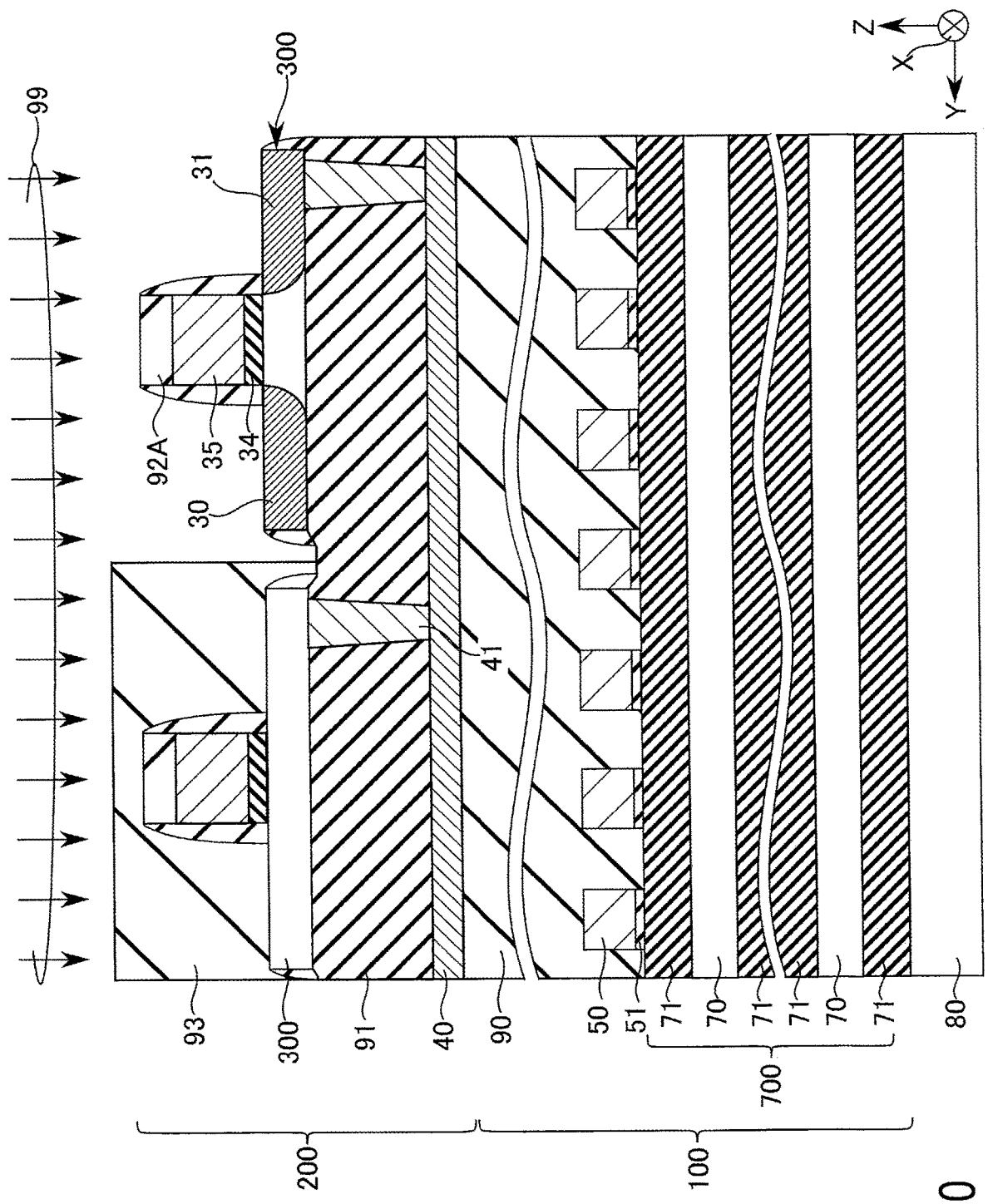
Figure 31:
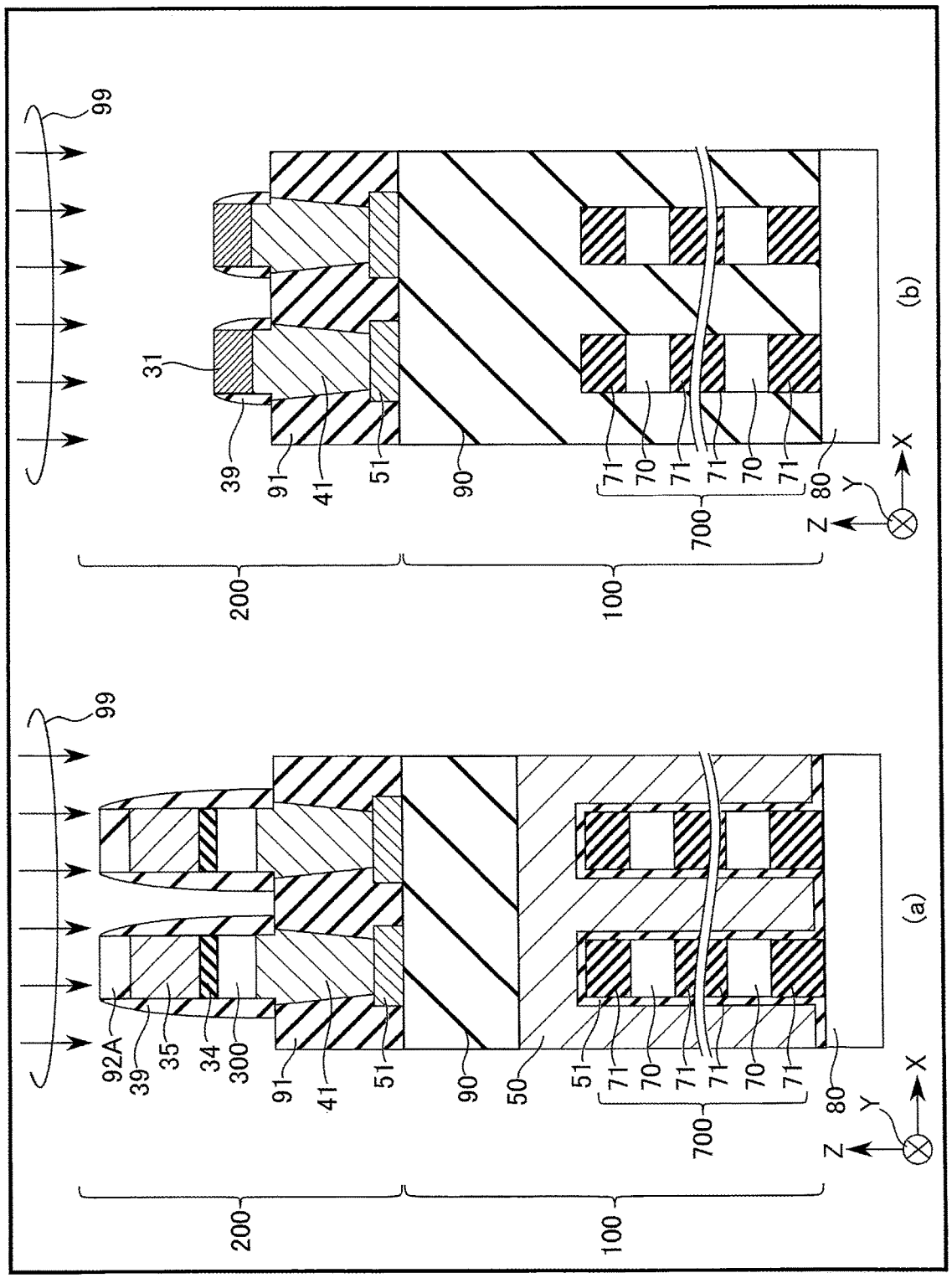

FIGS. 30 and 31 are schematic cross-sectional process diagrams illustrating one step of the method of manufacturing the flash memory of the present embodiment. FIG. 30 is a cross-sectional view in the same region as line A-A in FIG. 27. (a) of FIG. 31 is a cross-sectional view in the same region as a cross section taken along line B-B in FIG. 27. (b) of FIG. 31 is a cross-sectional view in the same region as a cross section taken along line C-C in FIG. 27.

As illustrated in FIGS. 30 and 31, ion implantation into the semiconductor layer 300 is performed using the gate electrode 35 as a mask.

For example, when ions of an n-type dopant are implanted into the semiconductor layer 300, the semiconductor layer 300 in a region into which a p-type dopant is implanted is covered with the mask layer 93. In a region into which the n-type dopant is implanted, the semiconductor layer 300 is exposed. The n-type semiconductor regions (for example, source/drain layers) 30 and 31 are formed in the semiconductor layer 300.

When ions of the p-type dopant are implanted, the semiconductor layer in a region into which the n-type dopant is implanted is covered with the mask layer. In the region into which the p-type dopant is implanted, the semiconductor layer 300 is exposed.

As a result, the n-type source/drain layers 30 and 31 (and p-type source/drain layers) are formed in the semiconductor layer 300.

Thereafter, an insulating layer (not illustrated) is formed on the semiconductor layer 300, the gate insulating layer 34, the gate electrode 35, and the sidewall insulating layer 39. As a result, the insulating layer (not illustrated) is embedded in a space between the semiconductor layers 300 and a space between the gate electrodes 35.

A contact plug (not illustrated) is formed in the formed insulating layer by a known technique. A conductive layer (not illustrated) is formed on the insulating layer and the contact plug by a known technique. The formed contact plug and conductive layer have a pattern/layout corresponding to the configuration of the peripheral circuit to be formed.

Through the above manufacturing steps, the plurality of circuits of the flash memory of the present embodiment are formed in the TFT region 200 above the memory cell array 100.

(e1) Summary

As described above, in the flash memory of the present embodiment, the plurality of transistors TRn and TRp are provided above the memory cell array 100 in the Z direction.

The flash memory 1 of the present embodiment includes the peripheral circuit for controlling the operation of the memory cell array 100 in a space above the memory cell array 100.

As a result, the flash memory 1 of the present embodiment can suppress an increase in chip size as compared with a structure in which the peripheral circuit is disposed on the semiconductor region in the substrate.

When the flash memory has a memory cell array having a three-dimensional structure, the number of interconnects in the memory cell array tends to increase as the number of stacked layers in the memory cell array increases.

In the flash memory of the present embodiment, when the peripheral circuit is provided above the memory cell array, restrictions on a pitch between the interconnects, an interval between the interconnects, an interconnect length, and an interconnect width in a two-dimensional plane parallel to the surface of the substrate can be alleviated.

In the flash memory of the present embodiment, an area for drawing out the interconnect can be reduced.

Therefore, the flash memory of the present embodiment can simplify drawing out of the interconnect between the memory cell array and the peripheral circuit.

The flash memory of the present embodiment can suppress the occurrence of open or short circuit of the interconnect by relaxing the restriction on the interconnect.

As a result, the flash memory of the present embodiment can improve manufacturing yield. Accordingly, the flash memory of the embodiment can suppress an increase in manufacturing cost.

As described above, the memory device of the present embodiment can improve quality.

(2) Second Embodiment

A memory device of a second embodiment will be described with reference to FIGS. 32 to 49.

(a2) Configuration Example

In a flash memory, each memory cell MC can store one or more bits of data based on association between data to be stored and a plurality of possible threshold voltages of the memory cell.

A relationship between the data stored in the memory cell and a threshold voltage distribution of the memory cell MC will be described with reference to FIG. 32.

In this embodiment, a case where the memory cell MC can store 3-bit data will be described. Hereinafter, the 3-bit data is referred to as a lower bit, a middle bit, and an upper bit from the lowest bit. A set of the lower bits of the plurality of memory cells MC belonging to the same cell unit CU is referred to as a lower page (or lower data), a set of the middle bits is referred to as a middle page (or middle data), and a set of the upper bits is referred to as an upper page (or upper data). A memory cell capable of storing the 3-bit data is referred to as a TLC (Triple level cell).

When the memory cell MC can store the 3-bit data, three pages are allocated to one word line WL (one cell unit CU). A "page" may be defined as a portion of a memory space formed in the cell unit CU. Writing and reading of data may be performed for each of the pages or each of the cell units CU.

FIG. 32 is a diagram illustrating data that can be stored in each of the memory cells MC, the threshold voltage distribution, and a voltage used during data reading.

As illustrated in FIG. 32, when the memory cell MC can hold the 3-bit data, the memory cell MC can take eight states according to the threshold voltage. These eight states (also referred to as write states) are referred to as "Er" state, "A" state, "B" state, "C" state, "D" state, "E" state, "F" state, and "G" state in ascending order of threshold voltage.

The threshold voltage of the memory cell MC in the "Er" state is less than a voltage VAR and corresponds to a data erase state. The threshold voltage of the memory cell MC in the "A" state is equal to or more than the voltage VAR and less than a voltage VBR (>VAR). The threshold voltage of the memory cell MC in the "B" state is equal to or more than the voltage VBR and less than a voltage VCR (>VBR). The threshold voltage of the memory cell MC in the "C" state is equal to or more than the voltage VCR and less than a voltage VDR (>VCR). The threshold voltage of the memory cell MC in the "D" state is equal to or more than the voltage VDR and less than a voltage VER (>VDR). The threshold voltage of the memory cell MC in the "E" state is equal to or more than the voltage VER and less than a voltage VFR (>VER). The threshold voltage of the memory cell MC in the "F" state is equal to or more than the voltage VFR and less than a voltage VGR (>VFR). The threshold voltage of the memory cell MC in the "G" state is equal to or more than the voltage VGR and less than a voltage VREAD (>VGR).

Among the eight states distributed in this manner, the "G" state is the state having the highest threshold voltage. Each state has a range of voltage values (threshold voltage distribution) associated with the corresponding data. Hereinafter, the "ER" state is referred to as an erase state. The states from "A" to "G" are referred to as program states.

Hereinafter, each of the voltages VAR to VGR is also referred to as a determination level or a read level. The voltages VAR to VGR are also collectively referred to as the voltages VCGR.

The voltage VREAD is a voltage applied to the word line (non-selected word line) WL not to be read during the read operation. When the voltage VREAD is applied to a gate (word line) of the memory cell MC, the memory cell MC is turned on regardless of the data stored in the memory cell MC.

For verification of data writing (hereinafter, referred to as the program verify), voltages VAV to VGV are provided for each state. The voltage VAV is higher than the read level VAR and equal to or less than the lower limit of the desired threshold voltage distribution of the "A" state. The voltage VBV is higher than the read level VBR and equal to or less than the lower limit of the desired threshold voltage distribution of the "B" state. The voltage VCV is higher than the read level VCR and equal to or less than the lower limit of the desired threshold voltage distribution of the "C" state. The voltage VDV is higher than the read level VDR and equal to or less than the lower limit of the desired threshold voltage distribution of the "D" state. The voltage VEV is higher than the read level VER and equal to or less than the lower limit of the desired threshold voltage distribution of the "E" state. The voltage VFV is higher than the read level VFR and equal to or less than the lower limit of the desired threshold voltage distribution of the "F" state. The voltage VGV is higher than the read level VGR and equal to or less than the lower limit of the desired threshold voltage distribution of the "G" state.

Hereinafter, each of the voltages VAV to VGV is also referred to as the verify level.

The threshold voltage distribution is realized by writing 3-bit (3-page) data including the lower bit, the middle bit, and the upper bit described above to the memory cell MC in the memory cell array 100. An example of the relationship between the state of the threshold voltage and the lower/middle/upper bits is as follows.

"Er" state: "111" (the bits are arranged in order of "upper/middle/lower")
"A" state: "110"
"B" state: "100"
"C" state: "000"
"D" state: "010"
"E" state: "011"
"F" state: "001"
"G" state: "101"

As described above, only one of the three bits changes between data corresponding to two adjacent states in the threshold voltage distributions.

The reading of the lower bit may use a voltage corresponding to a boundary where the value ("0" or "1") of the lower bit changes. The reading of the upper bit may use a voltage corresponding to a boundary where the value of the upper bit changes. The reading of the middle bit may use a voltage corresponding to a boundary where the value of the middle bit changes.

In the example of FIG. 32, reading of the lower page is executed using the voltage VAR for distinguishing between the "Er" state and the "A" state and the voltage VER for distinguishing between the "D" state and the "E" state as read voltages.

The reading of the middle page is performed by using the voltage VBR for distinguishing between the "A" state and the "B" state, the voltage VDR for distinguishing between the "C" state and the "D" state, and the voltage VFR for distinguishing between the "E" state and the "F" state as the read voltages.

The reading of the upper page is performed by using the voltage VCR for distinguishing between the "B" state and the "C" state and the voltage VGR for distinguishing between the "F" state and the "G" state as the read voltages.

The memory cell MC in the erase state is specified by reading using the voltage VAR. Hereinafter, reading (determination) using the voltage VAR is also referred to as AR reading. Similarly, the reading operations using the voltages VBR, VCR, VDR, VER, VFR, and VGR are referred to as BR reading, CR reading, DR reading, ER reading, FR reading, and GR reading, respectively.

In the memory device of the present embodiment, the memory cell. MC may be capable of storing data of two bits or less, or may be capable of storing data of four bits or more. A memory cell capable of storing 1-bit data is referred to as a SLC (Single level cell). A memory cell capable of storing 2-bit data is referred to as a MLC (Multi level cell). A memory cell capable of storing the 4-bit data is referred to as a QLC (Quadruple level cell).

Writing and reading of data are collectively performed on the plurality of memory cells belonging to the cell unit CU.

In the write operation, by applying a program voltage to a selected word line a plurality of times, the threshold voltage of the memory cell is shifted within the range of the threshold voltage distribution associated with the data to be written.

In the write operation, by using the voltages (hereinafter, also referred to as the verify level) VAV, VBV, VCV, VDV, VEV, and VFV for verifying the threshold voltage of the memory cell regarding each state, whether or not the threshold voltage of the memory cell MC exists in the threshold voltage distribution according to the data to be written is verified.

As described above, the data to be written is written to each of the memory cells MC in the selected cell unit CU.

In the present embodiment, the data written to each of the memory cells MC is referred to as the cell data. Write data DAT from a memory controller 2 is a set of a plurality of pieces of cell data.

The flash memory 1 of the present embodiment writes the data to the memory cell MC with the following configuration.

Figure 33:
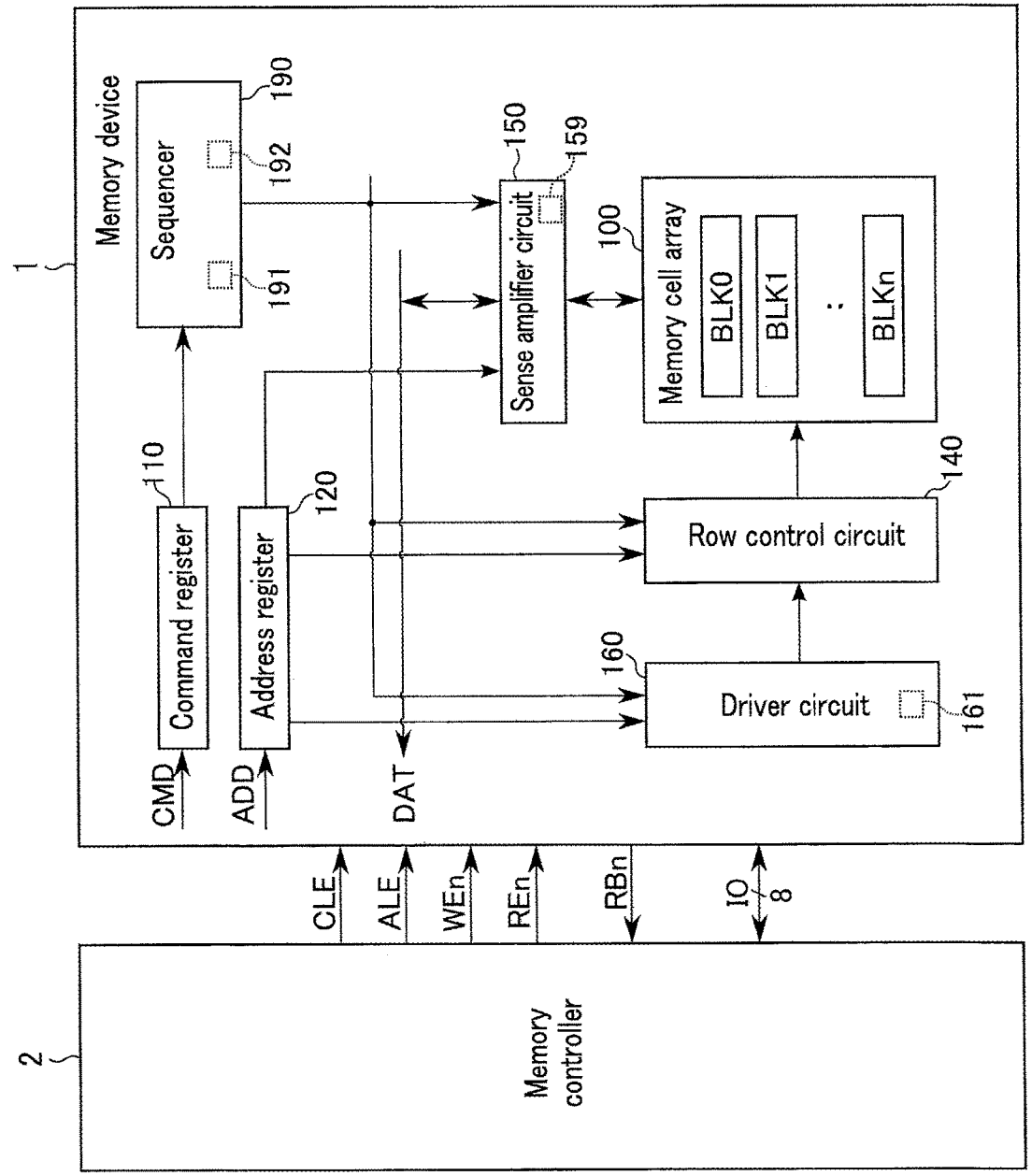
FIG. 33 is a diagram illustrating a configuration example of a memory device of a second embodiment.

FIG. 33 is a diagram illustrating an internal configuration of the flash memory of the present embodiment.

As illustrated in FIG. 33, the flash memory 1 of the present embodiment includes a circuit (function) 191 for evaluating characteristics of the plurality of memory cells MC in the memory cell array 100.

The circuit (hereinafter, referred to as the evaluation circuit) 191 evaluates writing speeds of the plurality of memory cells belonging to an address to be written during the write operation. In order to acquire the writing speed, the evaluation circuit 191 can detect a shift amount of the threshold voltage of the memory cell with respect to the application of the program voltage of a certain magnitude and execute calculation processing on the detection result.

The flash memory 1 of the present embodiment includes a circuit (function) 192 for calculating the voltage value of the program voltage used for the write operation.

The circuit (hereinafter, referred to as the prediction circuit) 192 calculates the voltage values of a plurality of the program voltages based on the data (write state) written to each of the memory cells MC and the writing speed of each of the memory cells MC. Based on the calculation result, the prediction circuit 192 can predict a more suitable voltage value for each of the plurality of program voltages used during the write operation.

For example, the evaluation circuit 191 and the prediction circuit 192 are provided in the sequencer 190. However, the evaluation circuit 191 and the prediction circuit 192 may be provided outside the sequencer 190. The memory controller 2 may include the evaluation circuit 191 and the prediction circuit 192 (or functions thereof).

For example, the sense amplifier 150 includes an information storage circuit (register or latch circuit) 159. The information storage circuit 159 can store information related to an evaluation result (for example, writing speed) of each memory cell by the evaluation circuit 191. Hereinafter, information related to the characteristics of the memory cell such as the writing speed of each memory cell is referred to as characteristic information. The information storage circuit 159 may store information related to the write operation other than the characteristic information.

The sense amplifier 150 includes a plurality of latch circuits. Each latch circuit stores cell data. Each latch circuit can hold a result (for example, a verify result, a read result, and the like) of turning on and off the selected cell with respect to a certain determination voltage.

For example, a driver circuit 160 includes an information storage circuit (register or latch circuit) 161. The information storage circuit 161 can store information related to a prediction result of the voltage value of the program voltage by the prediction circuit 192. Hereinafter, the information related to the voltage value of the program voltage is referred to as voltage information. The information storage circuit 161 may store information related to the write operation other than the voltage information.

The sequencer 190 may include a circuit that stores the characteristic information and the voltage information. In this case, the sequencer 190 controls the operations of the sense amplifier 150 and the driver circuit 160 based on each information during the write operation.

The flash memory 1 of the present embodiment calculates the voltage value of the program voltage used for the write operation based on the cell data of each memory cell, the characteristics of the memory cell, and the like. As a result, the flash memory of the present embodiment can set the voltage value of the program voltage to a more suitable value according to the characteristics of the memory cell.

As a result, the flash memory 1 of the present embodiment can shorten a period of the write operation.

As described above, in the flash memory of the present embodiment, an operation characteristic can be improved.

(b2) Operation Example

An operation example of the flash memory of the present embodiment will be described with reference to FIGS. 34 to 49.

(b2-1) Operation Example 1

An operation example 1 of the flash memory of the present embodiment will be described with reference to FIGS. 34 to 39.

Figure 34:
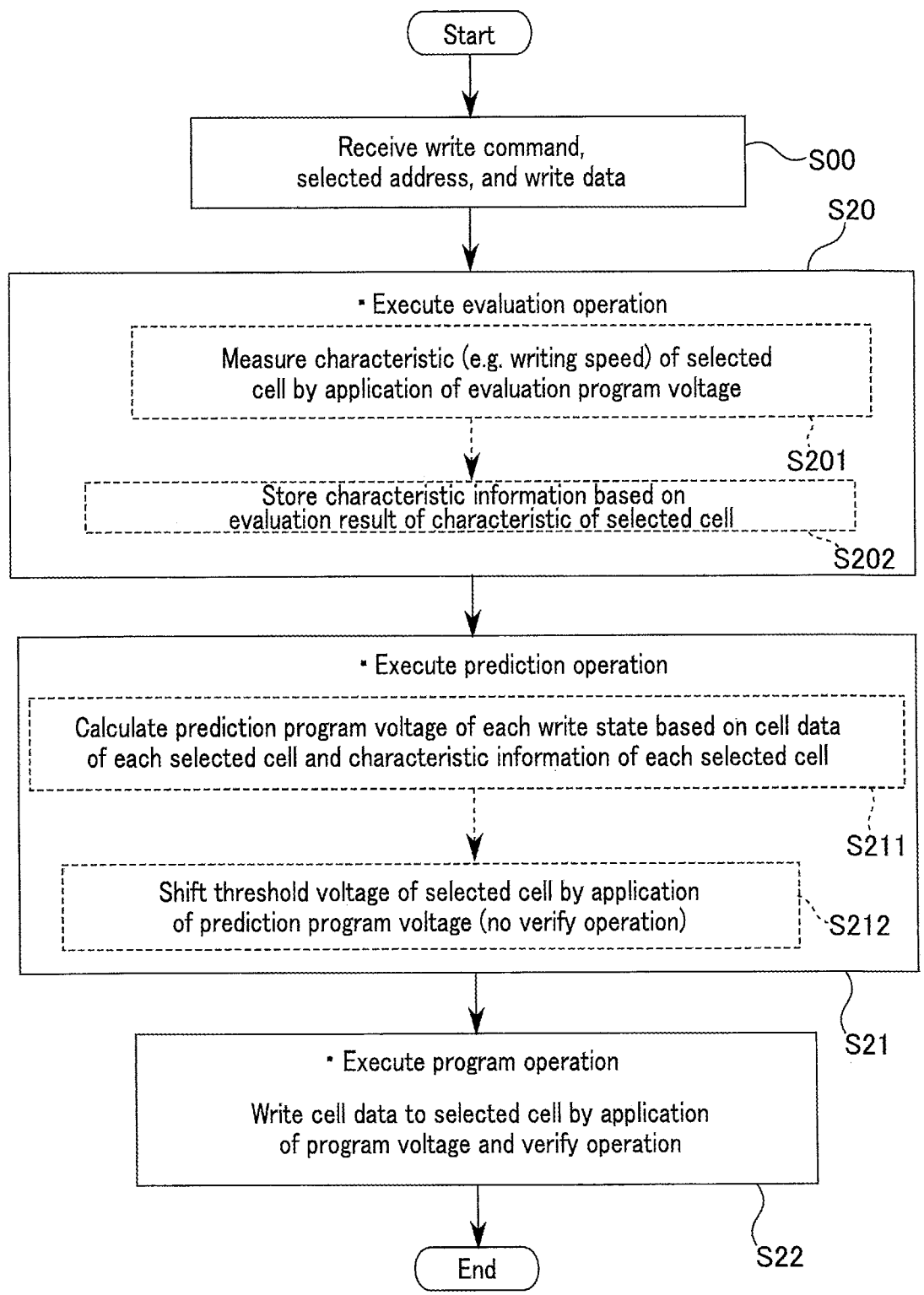
FIG. 34 is a flowchart illustrating an operation example of the memory device of the second embodiment.

FIG. 34 is a flowchart illustrating a sequence (hereinafter, referred to as the write sequence) of the write operation in the flash memory of the present embodiment in the operation example 1.

FIG. 35 is a schematic diagram illustrating a state in the memory cell array of the flash memory during the write operation.

FIG. 36 is a timing chart for explaining application of the voltage to the selected word line in the write sequence of the flash memory of the present embodiment in operation example 1. In FIG. 36, the horizontal axis of the graph corresponds to time, and the vertical axis of the graph corresponds to the voltage value.

FIGS. 37, 38, and 39 are diagrams for explaining the write sequence of the flash memory of the present embodiment.

<S00>

As illustrated in FIG. 34, when a host device (not illustrated) requests a memory system SYS to write data, the memory controller 2 sends a write command CMD, address information ADD, and the write data DAT to the flash memory 1 of the present embodiment.

In step S00, the flash memory 1 of the present embodiment receives the write command, the address information, and the write data from the memory controller 2.

As a result, the flash memory 1 starts the write sequence.

As illustrated in FIG. 35, the memory cell array of the flash memory 1 has, for example, the structures illustrated in FIGS. 2 to 5.

Among a plurality of word lines WL-s and WL-u, the word line (hereinafter, referred to as the selected word line) WL-s based on the address information (selected address) ADD is brought into a selected state. The word line (hereinafter, referred to as the non-selected word line) WL-u other than the selected word line WL-s is brought into a non-selected state.

A drain-side select gate line SGD-s based on the address information ADD is brought into the selected state. A source-side select gate line SGS-s based on the address information ADD is brought into the selected state. The other drain-side and source-side select gate lines (not illustrated) are brought into the non-selected state.

For example, any one of a plurality of string select lines SSL is brought into the selected state based on the address information ADD. As a result, among a plurality of layer stacks 700, the layer stack 700 connected to the string select line SSL in the selected state is selected.

In the example of FIG. 35, a plurality of memory cells MC-s connected to the selected word line WL-s in the selected layer stack 700 are selected. In the selected layer stack 700, the memory cells MC-s to be written are arranged in the Z direction. Hereinafter, the memory cell MC-s connected to the selected word line WL-s is referred to as the selected cell MC-s.

The memory cell MC connected to the non-selected word line WL-u is brought into the non-selected state. Hereinafter, the memory cell connected to the non-selected word line WL-u is referred to as the non-selected cell.

As described above, in the memory cell array 100, the plurality of memory cells MC-s are selected based on the address information.

The write data is stored in the sense amplifier 150. The sense amplifier 150 includes a plurality of latch circuits (not illustrated). The latch circuit is associated with a bit line. During the write sequence, each latch circuit can store the cell data written to the selected cell corresponding to each bit line.

<S20>

In step S20, the flash memory 1 of the present embodiment executes evaluation operation during the write sequence.

The evaluation operation is processing for evaluating write characteristics of the memory cell (selected cell MC-s).

In the present embodiment, the writing speed of the selected cell MC-s with respect to the applied program voltage is measured and evaluated as the write characteristics. The writing speed is an index based on the shift amount of the threshold voltage of the memory cell with respect to the applied program voltage.

As a tendency of the memory cell of the flash memory, the writing speeds of the plurality of selected cells MC-s vary due to a variation in characteristics of the plurality of memory cells in the memory cell array 100. The variation in characteristics of the memory cells is caused by a variation in film thickness of a tunnel insulating film, a variation in shape of the memory cell, and the like.

As a result, even if the same program voltage is applied to the plurality of selected cells MC-s, the threshold voltage distribution of a group (cell unit CU) of the selected cells MC-s spreads over a certain area.

As illustrated in FIG. 36, during the evaluation operation S20, in step S201, a program voltage (hereinafter, referred to as the evaluation program voltage) Vest having a certain voltage value V0 is applied to the selected word line WL-s by the evaluation circuit 191. For example, the voltage value V0 is a voltage value (more specifically, an initial voltage value) for a program of the "A" state.

For example, the evaluation circuit 191 performs control for applying the evaluation program voltage Vest.

As a result, the threshold voltages of the plurality of selected cells MC-s belonging to an address to which data is to be written are shifted in a positive direction according to the writing speed of each of the selected cells MC-s.

FIG. 37 is a diagram illustrating the threshold voltage distribution of the memory cell during the evaluation operation in the write sequence of the flash memory of the present embodiment.

Among the plurality of selected cells MC-s, the memory cell in which the threshold voltage of the memory cell is shifted to a state equal to or higher than the "A" state is set to a programmable state by controlling a potential of a bit line BL.

During the evaluation operation in the write sequence, by the application of the evaluation program voltage Vest, the threshold voltage of the selected cell (hereinafter, also referred to as the programmable cell) set to the programmable state among the plurality of selected cells changes to a value corresponding to the characteristic (writing speed) of each memory cell as illustrated in (a) of FIG. 37.

As a result, a threshold voltage distribution 999 having a certain spread (voltage range) is formed.

The selected cell to be maintained in the erase state is set to a program prohibited state by controlling the potential of the bit line BL. As a result, the change in threshold voltage of the selected cell (hereinafter, also referred to as the program prohibited cell) to be maintained in the erase state is suppressed.

By the application of the evaluation program voltage Vest, the threshold voltage of a certain memory cell becomes a voltage value Vtha, and the threshold voltage of another memory cell becomes a voltage value Vthb. When the voltage value Vtha is higher than the voltage value Vthb, the writing speed of the certain memory cell is higher than the writing speed of another memory cell. When the voltage value Vtha is lower than the voltage value Vthb, the writing speed of the certain memory cell is lower than the writing speed of another memory cell. The plurality of selected cells MC-s are classified into a plurality of groups according to the writing speed.

FIG. 38 is a diagram for explaining an example of classification (grouping) of the selected cell based on the writing speed of the selected cell according to the application of the evaluation program voltage Vest.

As illustrated in FIG. 38, during the evaluation operation, in step S201, based on the threshold voltage of the selected cell (program target cell) after the application of the evaluation program voltage Vest, grouping (hereinafter, also referred to as grouping processing) of the selected cells according to the writing speed is executed.

For example, the evaluation circuit 191 performs the grouping processing according to the writing speed based on the threshold voltage of each selected cell.

As illustrated in (a) of FIGS. 36 and 38, similarly to the read operation, the threshold voltage of the selected cell after the application of the evaluation program voltage Vest is determined by the application of a determination voltage Vgp (Vgp1, Vgp2, Vgp3, Vgp4, Vgp5, Vgp6, Vgp7) to the selected word line WL-s.

For example, when the voltage Vgp1 is applied to the selected word line WL-s, the selected cell having a threshold voltage equal to or less than the voltage Vgp1 is turned on. When the voltage Vgp1 is applied to the selected word line WL-s, the selected cell having a threshold voltage higher than the voltage Vgp1 is turned off. A result of turning on and off the selected cell by the application of the voltage Vgp1 is held in the sense amplifier 150. The selected cell turned on by the application of the voltage Vgp1 is classified into a first group G1 with respect to the writing speed.

When the voltage Vgp2 is applied to the selected word line WL-s, the selected cell having a threshold voltage equal to or less than the voltage Vgp2 is turned on. When the voltage Vgp2 is applied to the selected word line WL-s, the selected cell having a threshold voltage higher than the voltage Vgp2 is turned off. A result of turning on and off the selected cell by the application of the voltage Vgp2 is held in the sense amplifier 150.

The selected cell turned off by the application of the voltage Vgp1 and turned on by the application of the voltage Vgp2 is classified into a second group G2 with respect to the writing speed.

When the voltage Vgp3 is applied to the selected word line WL-s, the selected cell having a threshold voltage equal to or less than the voltage Vgp3 is turned on. When the voltage Vgp3 is applied to the selected word line WL-s, the selected cell having a threshold voltage higher than the voltage Vgp3 is turned off. A result of turning on and off the selected cell by the application of the voltage Vgp3 is held in the sense amplifier 150.

The selected cell turned off by the application of the voltage Vgp2 and turned on by the application of the voltage Vgp3 is classified into a third group G3 with respect to the writing speed.

When the voltage Vgp4 is applied to the selected word line WL-s, the selected cell having a threshold voltage equal to or less than the voltage Vgp4 is turned on. When the voltage Vgp4 is applied to the selected word line WL-s, the selected cell having a threshold voltage higher than the voltage Vgp4 is turned off. A result of turning on and off the selected cell by the application of the voltage Vgp4 is held in the sense amplifier 150.

The selected cell turned off by the application of the voltage Vgp3 and turned on by the application of the voltage Vgp4 is classified into the fourth group G4 with respect to the writing speed.

When the voltage Vgp5 is applied to the selected word line WL-s, the selected cell having a threshold voltage equal to or less than the voltage Vgp5 is turned on. When the voltage Vgp5 is applied to the selected word line WL-s, the selected cell having a threshold voltage higher than the voltage Vgp5 is turned off. A result of turning on and off the selected cell by the application of the voltage Vgp5 is held in the sense amplifier 150.

The selected cell turned off by the application of the voltage Vgp4 and turned on by the application of the voltage Vgp5 is classified into the fifth group G5 with respect to the writing speed.

When the voltage Vgp6 is applied to the selected word line WL-s, the selected cell having a threshold voltage equal to or less than the voltage Vgp6 is turned on. When the voltage Vgp6 is applied to the selected word line WL-s, the selected cell having a threshold voltage higher than the voltage Vgp6 is turned off. A result of turning on and off the selected cell by the application of the voltage Vgp6 is held in the sense amplifier 150.

The selected cell turned off by the application of the voltage Vgp5 and turned on by the application of the voltage Vgp6 is classified into the sixth group G6 with respect to the writing speed.

When the voltage Vgp7 is applied to the selected word line WL-s, the selected cell having a threshold voltage equal to or less than the voltage Vgp7 is turned on. When the voltage Vgp7 is applied to the selected word line WL-s, the selected cell having a threshold voltage higher than the voltage Vgp7 is turned off. A result of turning on and off the selected cell by the application of the voltage Vgp7 is held in the sense amplifier 150.

The selected cell turned off by the application of the voltage Vgp6 and turned on by the application of the voltage Vgp7 is classified into a seventh group G7 with respect to the writing speed.

The selected cell turned off by the application of the voltage Vgp7 is classified into an eighth group G8 with respect to the writing speed.

As described above, in the present embodiment, the plurality of selected cells are classified into the plurality of groups G1 to G8 according to the writing speed based on a magnitude of the threshold voltage (shift amount of the threshold voltage) of the selected cell according to the application of the evaluation program voltage Vest.

The number of groups for classifying the writing speed is not limited to eight. For example, the number of groups for classifying the writing speed may be more than eight (for example, sixteen) or less than eight (for example, four).

As described above, the characteristics of each selected cell are evaluated according to the writing speed by the evaluation operation.

In a step S202, characteristic information based on the evaluation result of the characteristics (the writing speed) of the selected cells is stored in the information storage circuit 159 of the sense amplifier 150 by the evaluation circuit 191.

<S21>

After the evaluation processing, in step S21, the flash memory 1 of the present embodiment executes prediction operation.

The prediction operation is executed based on the result of the evaluation processing (in the present embodiment, the writing speed). The prediction operation includes program voltage prediction processing (S211) and program operation (S212) using the predicted program voltage.

During the prediction operation, in step S211, the flash memory 1 predicts the voltage values of the plurality of program voltages used during the write sequence based on the cell data of each of the selected cells MC-s and the evaluation result (the writing speed of each selected cell).

For example, the prediction circuit 192 executes calculation processing based on the cell data of each of the selected cells MC-s and the group of the writing speeds. As a result, the voltage value of the program voltage (hereinafter, also referred to as the prediction program voltage) used for the program operation (prediction program operation) during the prediction operation is obtained.

FIG. 39 is a diagram for explaining an example of setting of the prediction program voltage based on the write state and the evaluation result of the characteristics of the memory cell.

As illustrated in FIG. 39, a plurality of prediction program voltages Vfcp (Vfcp0, Vfcp1, . . . , Vfcp7, Vfcp8) are used for the prediction program operation.

Each of the prediction program voltages Vfcp has a voltage value (hereinafter, also referred to as the target value) according to a combination of the write state (cell data) and the group of the writing speeds.

As a tendency of the prediction program voltage Vfcp applied to the selected cell, for the selected cell to which the cell data according to a certain write state is written, the voltage value of the prediction program voltage Vfcp applied to the memory cell having a slow writing speed is higher than the voltage value of the prediction program voltage Vfcp applied to the memory cell having a fast writing speed.

For example, the three prediction program voltages Vfcp0, Vfcp1, and Vfcp2 having different voltage values are used for the plurality of selected cells to which the cell data of the "A" state is written according to the writing speed of the selected cell. A voltage value Va of the prediction program voltage Vfcp1 is higher than the voltage value V0 of the prediction program voltage Vfcp0.

The voltage value Va of the prediction program voltage Vfcp1 is lower than a voltage value Vb of the prediction program voltage Vfcp2. For example, the voltage value Va of the prediction program voltage Vfcp0 may be equal to the voltage value V0 of the evaluation program voltage Vest.

For example, with respect to the selected cell to which the cell data of the "A" state is written, the prediction program voltage Vfcp2 is used to shift the threshold voltages of the selected cells (low-speed cells) of the groups G1 and G2, the prediction program voltage Vfcp1 is used to shift the threshold voltages of the selected cells (medium-speed cells) of the groups G3, G4, G5, and G6, and the prediction program voltage Vpgm0 is used to shift the threshold voltages of the selected cells (high-speed cells) of the groups G7 and G8.

For example, in the prediction program operation, the threshold voltage of the selected cell having a fast writing speed among the memory cells to which the cell data of a certain upper state is to be written, and the threshold voltage of the selected cell having a slow writing speed among the memory cells to which the cell data of a lower state than the upper state is to be written are shifted by the common prediction program voltage Vfcp.

As an example, the threshold voltages of the selected cells of the groups G1 and G2 to which the cell data of the "A" state is written and the threshold voltages of the selected cells of the groups G3 to G6 to which the cell data of the "B" state is written are shifted to higher values by the common prediction program voltage Vfcp2. At the same time, the threshold voltages of the selected cells of the groups G7 and G8 to which the cell data of the "C" state is written may be shifted by the prediction program voltage Vfcp2.

As another example, the threshold voltages of the selected cells of the groups G1 and G2 to which the cell data of the "F" state is written and the threshold voltages of the selected cells of the groups G3 to G6 to which the cell data of the "G" state is written are shifted to higher values by the common prediction program voltage Vfcp7.

The threshold voltages of the selected cells of the groups G1 and G2 to which the data of the "G" state is written are shifted by the prediction program voltage Vfcp8. A voltage value Vg of the prediction program voltage Vfcp8 is higher than the voltage values of the other prediction program voltages Vfcp0 to Vfcp7.

As described above, in the prediction program operation, the voltage value of the program voltage Vfcp is predicted based on the write state (cell data) and the writing speed of each selected cell.

Information (for example, setting information table) related to the prediction program voltage of the selected cell of the selected address may be stored in the flash memory 1. The information related to the prediction program voltage of the selected cell of the selected address may be transferred to the memory controller 2 at a certain timing and stored in the memory controller 2.

In FIG. 38, the nine prediction program voltages Vfcp0 to Vfcp8 are illustrated. The number of prediction program voltages Vfcp used for the prediction program operation may be less than nine or may be more than nine.

For example, the plurality of prediction program voltages having different voltage values may be set to correspond to the plurality of write states.

During the prediction operation, in the prediction program operation of step S212, as illustrated in (a) of FIG. 35, the flash memory 1 sequentially applies the plurality of obtained prediction program voltages Vfcp to the selected word line WL-s without performing verify operation (hereinafter, referred to as program verify) related to the threshold voltage of the selected cell (S212).

For example, the prediction circuit 192 performs various controls for applying the prediction program voltage Vfcp.

The prediction program operation includes application of the program voltage one or more times (hereinafter, referred to as the program step) without applying a verify voltage (hereinafter, referred to as the verify step).

In the flash memory 1, the sequencer 190 (for example, the prediction circuit 192) shifts the threshold voltage of the selected cell MC-s in the positive direction by the prediction program operation (application of the prediction program voltage). As a result, the cell data corresponding to each write state is roughly written to each of the plurality of selected cells in the programmable state.

As illustrated in (b) of FIG. 37, the threshold voltage (threshold voltage distribution 999a, 999b, 999c, 999d, 999e, 999f, and 999g) of each of the selected cells MC-s is shifted in the positive direction by the application of the prediction program voltage Vfcp in which the writing speed of each of the selected cells MC-s is considered in the shift amount according to the cell data and the writing speed.

<S22>

After the prediction operation, the flash memory 1 of the present embodiment executes the program operation in step S22.

(c) of FIG. 36 is a schematic diagram for explaining the program operation in the write sequence of the flash memory of the present embodiment. In (b) of FIG. 36, voltages Vpgm and Vvfy applied to the selected word line are illustrated.

In the flash memory 1 of the present embodiment, the sequencer 190 executes application of a plurality of the program voltages Vpgm to the memory cell MC-s connected to the selected word line WL-s with program verify as illustrated in (b) of FIG. 36.

The program operation includes one or more program steps and one or more verify steps. In the following description, for differentiation, the program operation including the program verify is also referred to as fine program operation (or program operation with verify or normal program operation).

The sequencer 190 writes the cell data to each selected cell precisely (in detail) by the fine program operation.

For example, the program voltage Vpgm used for the fine program operation in step S22 is determined based on the voltage value (for example, the voltage value of the prediction program voltage Vfcp) calculated by the prediction operation. For example, the sequencer 190 sets the voltage value of the program voltage Vpgm for the program of each write state (cell data) with reference to the prediction program voltage Vfcp corresponding to each write state. More specifically, the sequencer 190 uses the voltage value of the prediction program voltage Vfcp of each write state as the initial voltage value of the program voltage Vpgm related to each program state.

The sequencer 190 sequentially adds an adjustment voltage (hereinafter, also referred to as step-up voltage) Vstp of a certain value dV to the program voltage Vpgm (Vpgm1, Vpgm2, Vpgm3, Vpgm4, ..., Vpgmx, Vpgmy) corresponding to the prediction program voltage Vfcp for each write loop LP (LP1, LP2, LP3, LP4, ..., LPk-1, LPk), and executes the program step in the fine program operation. Each write loop includes at least one application of the program voltage (program step) and at least one program verify (verify step). k is an integer of 2 or more.

The voltage value dV of a step-up voltage Vstp may be determined based on the cell data and the characteristic information (writing speed) by the prediction operation.

In the example of (b) of FIG. 36, the sequencer 190 applies the program voltage Vpgm1 to the selected word line WL-s in the first write loop LP1 during the fine program operation. For example, a voltage value Vp1 of the program voltage Vpgm1 is equal to the voltage value Va of the prediction program voltage Vfcp for the "A" state.

After the application of the program voltage Vpgm1, the sequencer 190 applies the verify voltage Vvfy to the selected word line WL-s. The verify voltage Vvfy includes one or more verify levels. As a result, the threshold voltage of the selected cell after the application of the program voltage Vpgm1 is verified. As described above, the program operation is executed such that the threshold voltage of each of the selected cells MC-s falls within the threshold voltage distribution corresponding to the cell data.

The sequencer 190 executes the second write loop LP2 after the verify voltage Vvfy in the first write loop LP1.

In the second write loop LP2, the sequencer 190 applies the program voltage Vpgm2 to the selected word line WL-s. For example, the voltage value of the program voltage Vpgm2 is a total voltage value ("Vp1+dV") of the voltage value Vp1 (Va) of the program voltage Vpgm1 and the voltage value dV of the step-up voltage Vstp. After the application of the program voltage Vpgm2, the sequencer 190 applies the verify voltage Vvfy to the selected word line WL-s. As a result, the threshold voltage of the selected cell MC-s with respect to the application of the program voltage Vpgm2 is verified.

As described above, the sequencer 190 executes the plurality of write loops LP by changing the voltage value of the program voltage Vpgm (and the verify level of the verify voltage Vvfy).

For example, in the flash memory 1 of the present embodiment, for example, when the sequencer 190 determines that application of one or more program voltages Vpgm (in this case, the program voltages Vpgm1, Vpgm2, and Vpgm3) using the voltage value of the prediction program voltage Vfcp1 related to the "A" state as a reference value is completed in the third write loop LP3, the sequencer 190 executes application of one or more program voltages Vpgm4 using the voltage value Vb of the prediction program voltage Vfcp2 related to the "B" state as the reference value in the fourth write loop LP4, for example.

The sequencer 190 can determine a change in the prediction program voltage Vfcp, which is a reference value of the program voltage Vpgm, based on the number of executed write loops and/or the voltage value of the program voltage Vpgm used in the current write loop.

As described above, in the present embodiment, the sequencer 190 can change and set the voltage value of the program voltage Vpgm to a value based on the plurality of prediction program voltages obtained by the prediction operation according to a progress (for example, the number of write loops LP) of the fine program operation during the fine program operation.

The sequencer 190 sequentially applies the plurality of program voltages Vpgm based on each of the plurality of prediction program voltages Vfcp.

For example, in the k-lth write loop LPk-1, the sequencer 190 applies the program voltage Vpgmx to the selected word line WL-s. For example, the voltage value Vpx of the program voltage Vpgmx is based on the voltage value Vf of the prediction program voltage related to the "F" state.

For example, in the k-th write loop LPk, the sequencer 190 applies the program voltage Vpgmy to the selected word line WL-s. For example, the voltage value Vpy of the program voltage Vpgmy is based on the voltage value Vf of the prediction program voltage related to the "G" state.

As a result, the threshold voltage of the selected cell shifts in the positive direction, as illustrated in (c) of FIG. 37.

The sequencer 190 determines completion of the fine program operation based on the number of times of application of the program voltage Vpgm (or the verify result).

As a result, the sequencer 190 completes the fine program operation.

During the fine program operation and the prediction program operation in the present embodiment, the selected cell (programmable cell) to which the threshold voltage is shifted by the program voltage for each write state may be set to the programmable state.

During the fine program operation and the prediction program operation in the present embodiment, regarding application of the program voltage corresponding to a certain write state, the selected cell corresponding to the write state and the selected cell corresponding to the higher write state than the write state may be set to the programmable state.

As described above, the flash memory of the present embodiment completes the write sequence including the evaluation operation, the prediction program operation, and the fine program operation.

The flash memory 1 of the present embodiment calculates the voltage values of the plurality of program voltages based on the evaluation result of the writing speed of the selected cell MC-s during the write operation (write sequence). As a result, the flash memory 1 of the present embodiment can apply the plurality of program voltages having more suitable voltage values to the plurality of selected cells MC-s belonging to the selected address.

As a result, the flash memory 1 of the present embodiment can suppress an increase in the number of times of application of the program voltage. For example, the flash memory 1 of the present embodiment can achieve high-speed write operation (for example, shortening of write operation time).

As described above, the flash memory 1 of the present embodiment can execute more efficient write operation. Therefore, the flash memory of the embodiment can improve quality.

(b2-2) Operation Example 2

An example of the write operation of the flash memory of the present embodiment will be described with reference to FIGS. 40 and 41.

Figure 40:
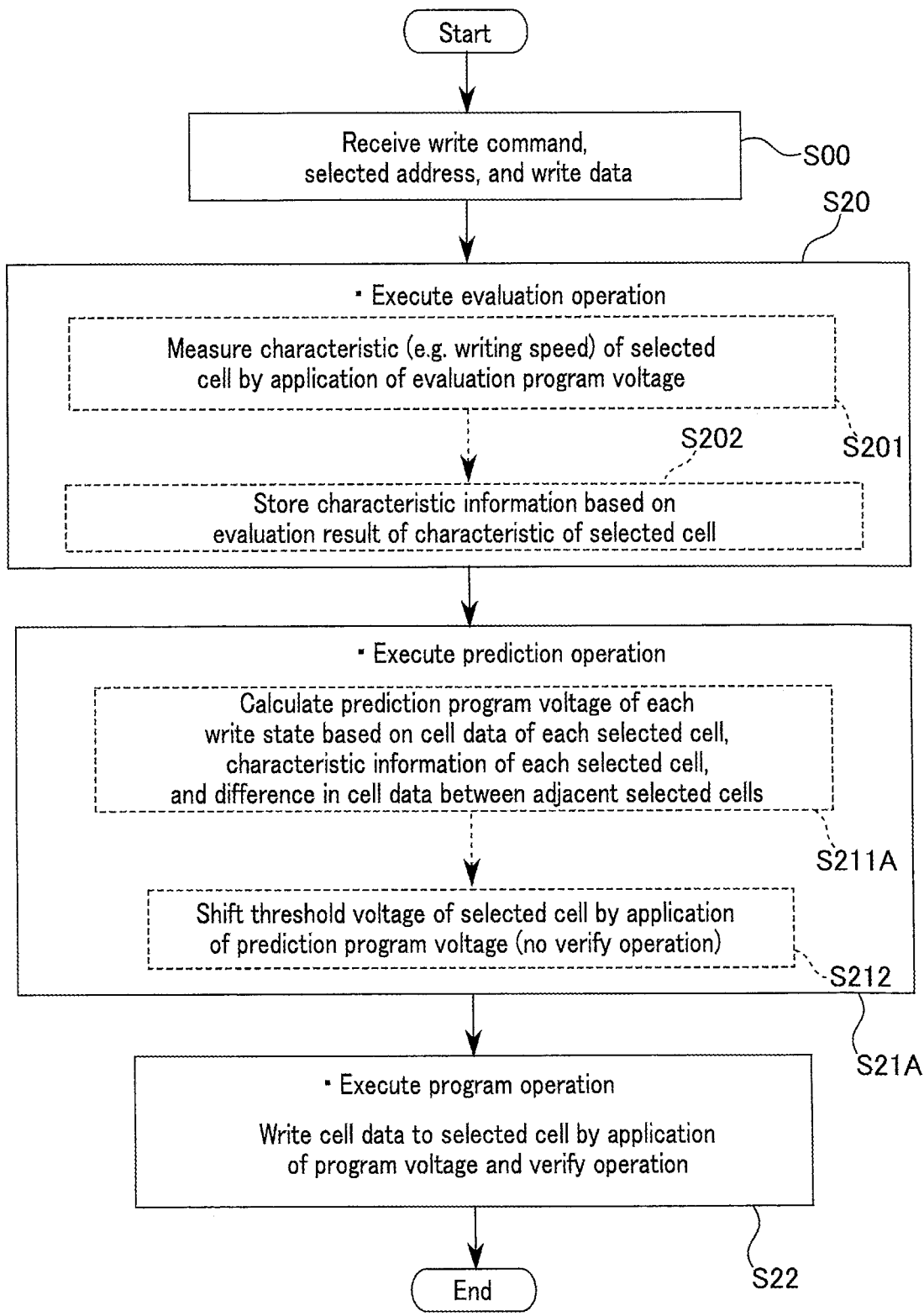
FIG. 40 is a flowchart illustrating the operation example of the memory device of the second embodiment.

FIG. 40 is a flowchart illustrating a processing flow of an operation example 2 of the write operation of the flash memory of the present embodiment.

Figure 41:
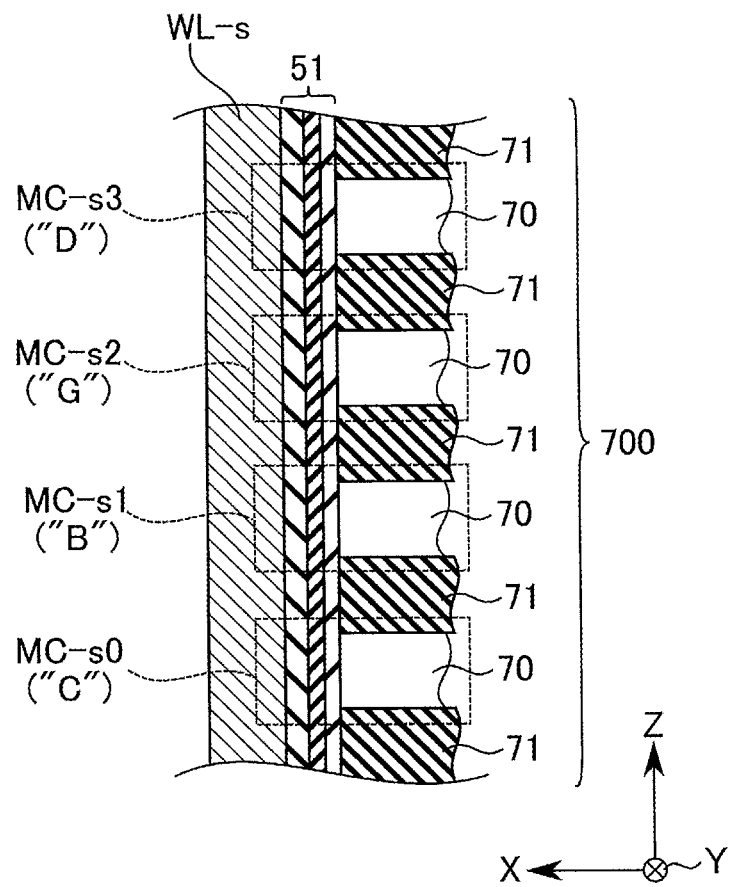
FIG. 41 is a diagram for explaining the operation example of the memory device of the second embodiment.

FIG. 41 is a schematic diagram for explaining the operation example 2 of the write operation of the flash memory of the present embodiment.

In the operation example 2, the prediction operation in step S21A of the processing flow of FIG. 40 is different from the prediction operation of the operation example 1.

In the operation example 2, in step S211A of FIG. 40, the voltage value (target value) of the prediction program voltage Vfcp is predicted using the cell data (write state) of a plurality of the adjacent selected cells in addition to the cell data and the writing speed of each selected cell.

As illustrated in FIG. 41, the selected cells MC-s in the write sequence are arranged in the Z direction. In this case, data writing (application of the program voltage) is simultaneously executed for the plurality of selected cells MC-s arranged in the Z direction.

An influence of interference between the selected cells MC-s may occur during the write operation. Thus, in the present embodiment, the sequencer 190 adjusts the voltage value of the program voltage during the write operation.

The cell data of the plurality of selected cells adjacent to each other in the Z direction can be recognized based on a bit array in the supplied write data. As a result, an interference effect (for example, a magnitude of interference) that can occur between the adjacent selected cells is predicted.

As described above, the sense amplifier 150 includes the plurality of latch circuits (not illustrated). Each latch circuit is associated with any one of the plurality of bit lines BL. The cell data of each selected cell is temporarily stored in the latch circuit.

In the sequencer 190, the prediction circuit 192 can recognize arrangement of the write states in the adjacent selected cells by arithmetic processing on the cell data in the plurality of latch circuits.

As a result, a difference between the write state of one selected cell and the write state of the other selected cell between the adjacent selected cells is calculated.

The difference in cell data (write state) in the adjacent selected cells is reflected in the prediction of the target value of the prediction program voltage Vfcp.

In the example of FIG. 41, the cell data of the "B" state is written to a selected cell MC-s1.

The cell data of the "G" state is written to a selected cell MC-s2. The selected cell MC-s2 is adjacent to the selected cell MC-s1 above the selected cell MC-s1 in the Z direction.

The data of the "C" state is written to a selected cell MC-s0. The selected cell MC-s0 is adjacent to the selected cell MC-s1 below the selected cell MC-s1 in the Z direction.

The data of the "D" state is written to a selected cell MC-s3. The selected cell MC-s3 is adjacent to the selected cell MC-s2 above the selected cell MC-s2 in the Z direction.

The threshold voltage distribution of the "B" state is adjacent to the threshold voltage distribution of the "C" state. Thus, the interference effect generated between the selected cell MC-s1 and the selected cell MC-s0 is relatively small.

As described above, the threshold voltage distribution of the "G" state is a distribution higher by five than the threshold voltage distribution of the "B" state. Thus, the interference effect generated between the selected cell MC-s1 and the selected cell MC-s2 is larger than the interference effect generated between the selected cell MC-s1 and the selected cell MC-s0.

As described above, when an influence of the interference effect is large, the target value (for example, the target value of the prediction program voltage related to the "G" state) of the prediction program voltage Vfcp is adjusted based on the difference between the write states (cell data) of the adjacent selected cells so as to be shifted to a voltage value lower than the target value of the predicted program voltage Vfcp when the influence of the interference effect is small.

As a result, the influence of the interference effect between the selected cells is suppressed.

For example, with respect to the prediction program voltage Vfcp of a certain write state, in the plurality of selected cells MC-s to which the cell data of the write state is written, a difference (in this case, referred to as the difference value) in the write state between a certain selected cell and another selected cell (in this case, referred to as the adjacent cell) adjacent to the certain selected cell is calculated. The target value of the prediction program voltage Vfcp of the write state is adjusted based on calculation results for a plurality of the difference values.

A difference in the write state between the two adjacent selected cells (a difference between the "D" state and the "G" state) such as the selected cell MC-s3 and the selected cell MC-s2 is smaller than a difference in the write state (a difference between the "B" state and the "G" state) between the selected cell MC-s1 and the selected cell MC-s2. Even when the difference in the write state between the adjacent selected cells is small, the voltage value of the prediction program voltage Vfcp can be adjusted according to a magnitude of the difference in the write state between the adjacent selected cells MC-s.

As described above, unless the write states of the adjacent selected cells MC-s are the same, the target value of the prediction program voltage Vfcp is more preferably adjusted.

As described above, the voltage values of the plurality of prediction program voltages in the write sequence are calculated based on the cell data of each of the selected cells MC-s, the writing speed of the selected cell MC-s, and the difference value of the write state (cell data) between the adjacent selected cells MC-s. As a result, the target value of the prediction program voltage Vfcp is predicted.

In step S212, the prediction program operation is executed using the obtained voltage value of the prediction program voltage Vfcp.

After the prediction program operation, the fine program operation is executed in step S22 similarly to the write sequence of the operation example 1.

Through the above operation, the write sequence of the flash memory 1 of the present embodiment is completed.

As in the write sequence described in the present embodiment, when the write states of the adjacent selected cells are reflected in the setting of the target value of the program voltage, a distribution width of each threshold voltage distribution in the prediction program operation is reduced.

As a result, the flash memory 1 of the present embodiment can suppress a write error.

As the distribution width of the threshold voltage distribution during the prediction program operation is reduced, the number of write loops during the fine program operation can be reduced.

(b2-3) Operation Example 3

An example of the write operation of the flash memory of the present embodiment will be described with reference to FIGS. 42 to 44.

Figure 42:
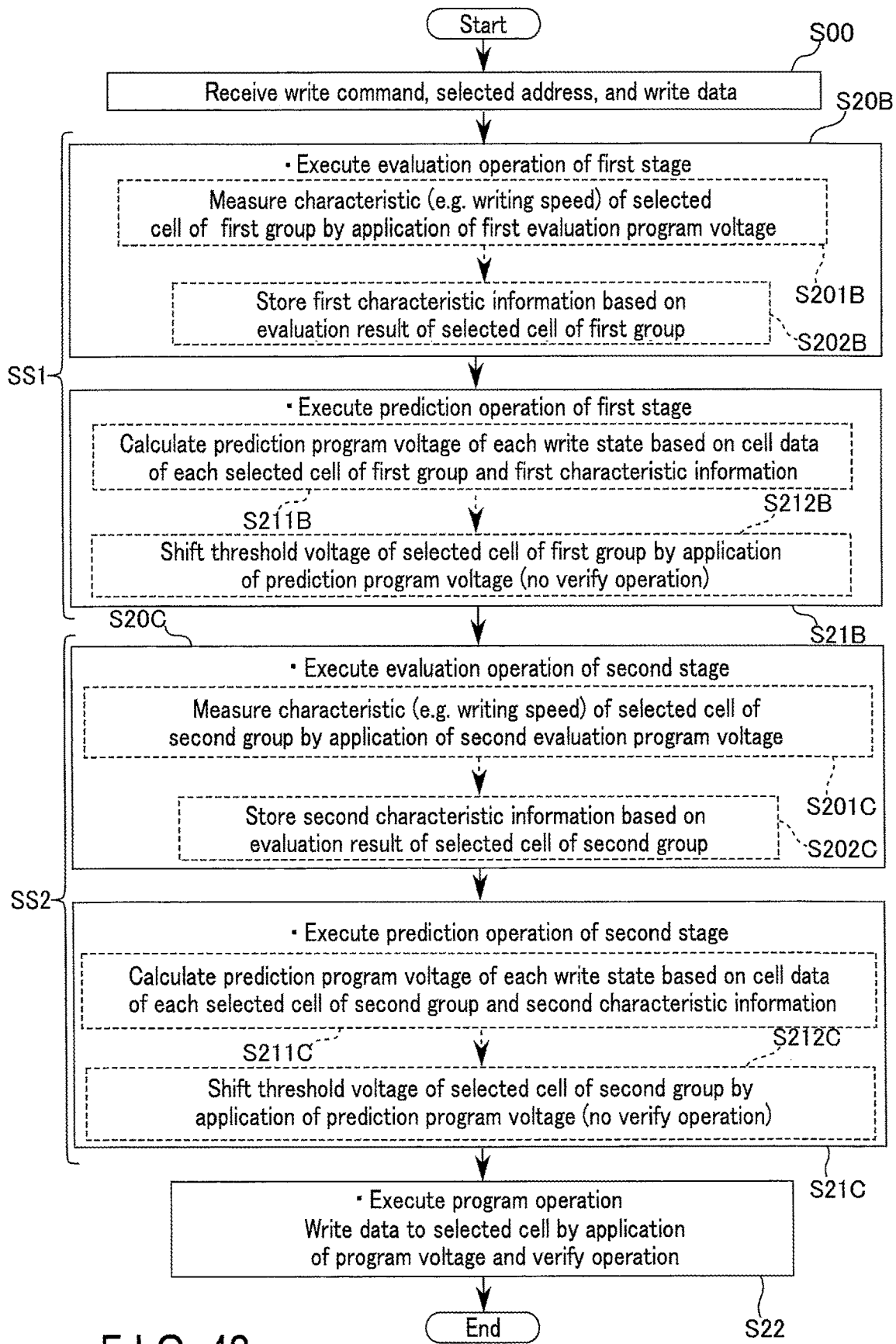
FIG. 42 is a flowchart illustrating the operation example of the memory device of the second embodiment.

FIG. 42 is a flowchart illustrating a processing flow of an example of the write operation of the flash memory of the present embodiment.

Figure 43:
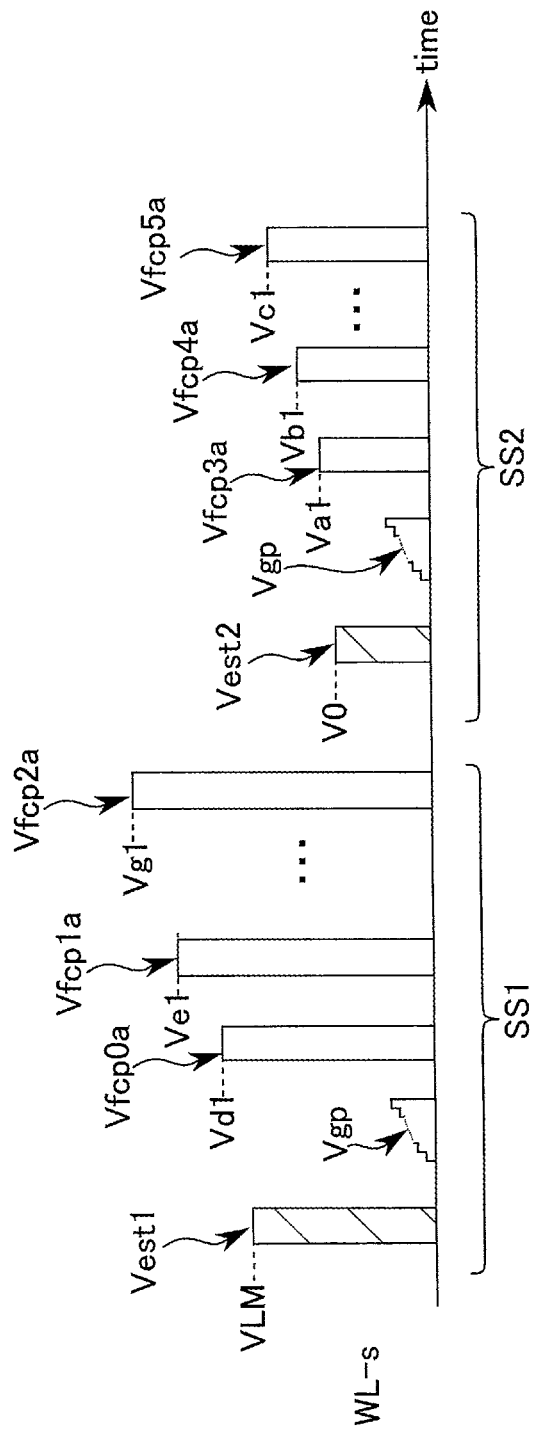
FIGS. 43 and 44 are diagrams for explaining the operation example of the memory device of the second embodiment.

FIG. 43 is a schematic graph for explaining the voltage applied to the memory cell MC (selected word line) in an example of the write operation of the flash memory of the present embodiment. In FIG. 43, the horizontal axis of the graph corresponds to time, and the vertical axis of the graph corresponds to the voltage value.

Figure 44:
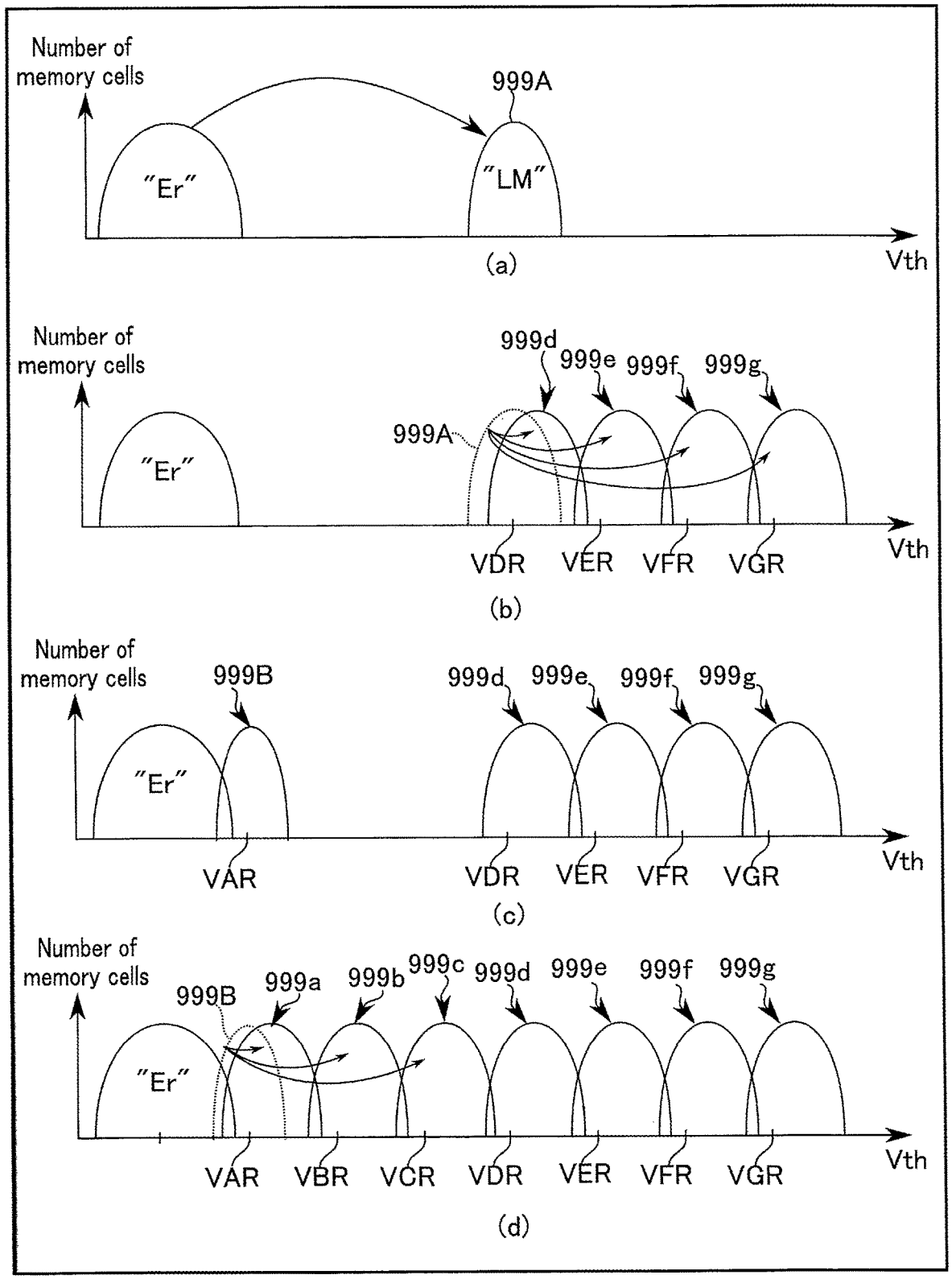

FIG. 44 is a schematic diagram for explaining a change in the threshold voltage of the memory cell in an example of the write operation of the flash memory of the present embodiment.

As illustrated in FIGS. 42 to 44, in the write sequence of the present operation example 3, a plurality of evaluation operations (S20B, S20C) and a plurality of prediction operations (S21B, S21C) are executed.

A set SS (SS1, SS2) including one evaluation operation and one prediction operation is executed as one sequence (hereinafter, also referred to as the writing stage).

The flash memory 1 of the present embodiment executes the write sequence including the two write stages SS1 and SS2.

As in the processing flow of FIG. 42, the first write stage SS1 in the write sequence is executed.

When the memory cell is a TLC, in this operation example, the evaluation operation (S20B) and the prediction operation (S21B) of the first write stage SS1 are executed for the selected cell (the selected cell of the first group) to which the data of the "D", "E", "F", and "G" states are to be written.

<S20B>

In this operation example, the sequencer 190 executes the evaluation operation of the first write stage SS1 for the plurality of selected cells MC-s to which the cell data of any one of the "D" to "G" states is written by the evaluation circuit 191.

As illustrated in FIG. 43, in the evaluation operation in the first write stage SS1, a first evaluation program voltage Vest1 having a certain voltage value is applied to the selected word line WL-s. The threshold voltage of the selected cell MC-s of the first group shifts in the positive direction.

During the evaluation operation of the first write stage SS1, the selected cell (selected cell of the second group) MC-s to which the data of any one of the "A", "B", and "C" states is written is set to the program prohibited state.

As illustrated in (a) of FIG. 44, in the evaluation operation on the selected cell MC-s of the "D" to "G" states belonging to the first group, the threshold voltage of the selected cell of the "D" to "G" states is shifted to the threshold voltage distribution (hereinafter, referred to as the "LM" state) 999A between the upper limit value (upper tail of the distribution) of the threshold voltage distribution of the "C" state (or the "B" state) and the lower limit value (lower tail of the distribution) of the threshold voltage distribution of the "D" state by the first evaluation program voltage Vest1.

Hereinafter, the program operation of shifting the threshold voltage of the memory cell to the "LM" state is also referred to as LM program operation.

The writing speed of the selected cell MC-s of the "D" to "G" states is measured and stored as the characteristic information by the evaluation operation by the LM program operation (S201B and S202B).

<S21B>

As illustrated in FIG. 42, in the prediction operation of the first write stage SS1, the sequencer 190 predicts and calculates the voltage value of the prediction program voltage based on the cell data of each of the selected cells MC-s and the writing speed of each of the selected cells MC-s for the selected cell MC-s belonging to the first group by the prediction circuit 192 (S211B). The difference value of the cell data of the adjacent selected cells MC-s may be further used to calculate the prediction program voltage.

In the prediction operation, the sequencer 190 executes first prediction program operation in the first write stage SS1 by the prediction circuit 192 (S212B).

As illustrated in FIG. 43, a plurality of prediction program voltages Vfcp1a, Vfcp1a, . . . , and Vfcp2a are applied to the selected word line WL-s. The program operation without verify is executed for the plurality of selected cells MC-s of the "LM" state using the prediction program voltage Vfcp having a certain voltage value VLM.

The prediction program voltage Vfcp1a has, for example, a target value Vd1 for the cell data of the "D" state. The prediction program voltage Vfcp1a has, for example, a target value Ve1 for the cell data of the "E" state. The prediction program voltage Vfcp2a has, for example, a target value Vg1 for the cell data of the "G" state.

As a result, as illustrated in (b) of FIG. 44B, in the first group, the threshold voltage of the selected cell MC-s to which the cell data of any one of the "D" to "G" states is to be written is shifted in the positive direction.

As in the example of FIG. 42, in the present operation example 3, the sequencer 190 executes the second write stage SS2 after the first write stage SS1 for the selected cell MC-s of the "D" to "G" states.

The evaluation operation (S20C) and the prediction operation (S21C) of the second write stage SS2 are executed for the selected cell (selected cell of the second group) MC-s to which the cell data of any one of the "A", "B", and "C" states is to be written.

<S20C>

In this operation example, the sequencer 190 executes the evaluation operation of the second write stage SS2 for the plurality of selected cells MC-s to which the cell data of any one of the "A" to "C" states is written by the evaluation circuit 192.

As illustrated in FIG. 43, in the evaluation operation in the second write stage SS2, a second evaluation program voltage Vest2 having a certain voltage value is applied to the selected word line WL-s. The threshold voltage of the selected cell MC-s of the "A" to "C" states shifts. For example, the voltage value of the second evaluation program voltage Vest2 has a voltage value (default value) V0 that shifts the threshold voltage of the selected cell MC-s into the threshold voltage distribution of the "A" state.

For example, during the evaluation operation of the second write stage SS2, the selected cell MC-s to which the cell data of any one of the "D" to "G" states is written is set to the program prohibited state.

As a result, as illustrated in (c) of FIG. 44, in the evaluation operation (S20C) for the selected cells MC-s of the "A" to "C" states, the threshold voltages of the selected cells MC-s of the "A" to "C" states are shifted to about a threshold voltage distribution 999B of the "A" state.

Hereinafter, the program operation of shifting the threshold voltage of the memory cell to the "A" state is referred to as "A" program operation.

By the evaluation operation by the "A" program operation, the writing speed of the selected cell of the "A" to "C" states is measured and stored as the characteristic information (S201C and S202C).

<S21C>

As illustrated in FIG. 42, in the prediction operation of the second write stage SS2, the sequencer 190 predicts and calculates the voltage value of the program voltage based on the cell data of each of the selected cells MC-s and the writing speed of each of the selected cells MC-s for the selected cell MC-s of the "A" to "C" states by the prediction circuit 192 (S211C). The difference value of the cell data of the adjacent selected cells MC-s may be further used to calculate the prediction program voltage.

In the prediction operation, the flash memory 1 executes second prediction program operation in the second write stage SS2 (S212C).

As illustrated in FIG. 43, a plurality of prediction program voltages Vfcp3a, Vfcp4a, and Vfcp5a are applied to the selected word line WL-s. The program operation without verify is executed for the selected cell belonging to the threshold distribution 999B of the "A" state using the prediction program voltage Vfcp.

The prediction program voltage Vfcp3a has, for example, a target value Va1 for the cell data of the "A" state. The prediction program voltage Vfcp4a has, for example, a target value Vb1 for the cell data of the "B" state. The prediction program voltage Vfcp5a has, for example, a target value Vc1 for the cell data of the "C" state.

As a result, as illustrated in (d) of FIG. 44, the threshold voltage of the selected cell of the "A" to "C" states in the second group is shifted in the positive direction.

<S22>

As illustrated in FIG. 42, after the two write stages SS1 and SS2, the sequencer 190 executes the fine program operation for the plurality of selected cells MC-s to which the cell data of the "A" to "G" states are to be written.

In this operation example (and other operation examples), the fine program operation may be executed using the program voltage based on the target value of the prediction program voltage for each write state. By the application of the program voltage, the threshold voltages of the selected cells of a certain write state and a higher write state than the write state may be simultaneously shifted.

Through the above processing, the write sequence of the flash memory 1 of the present embodiment in the operation example 3 is completed.

In the present embodiment, the prediction operation related to the upper write state and the prediction operation related to the lower write state are executed in different sequences (write stages).

As a result, the flash memory 1 of the present embodiment can predict the target value of the program voltage related to the lower write state (in this case, the "A" to "C" states) under a condition including the influence of the interference effect between the selected cells.

As a result, the flash memory 1 of the present embodiment can set a more suitable voltage value of the program voltage.

(b2-4) Operation Example 4

An example of the write operation of the flash memory of the present embodiment will be described with reference to FIGS. 45 to 47.

Figure 45:
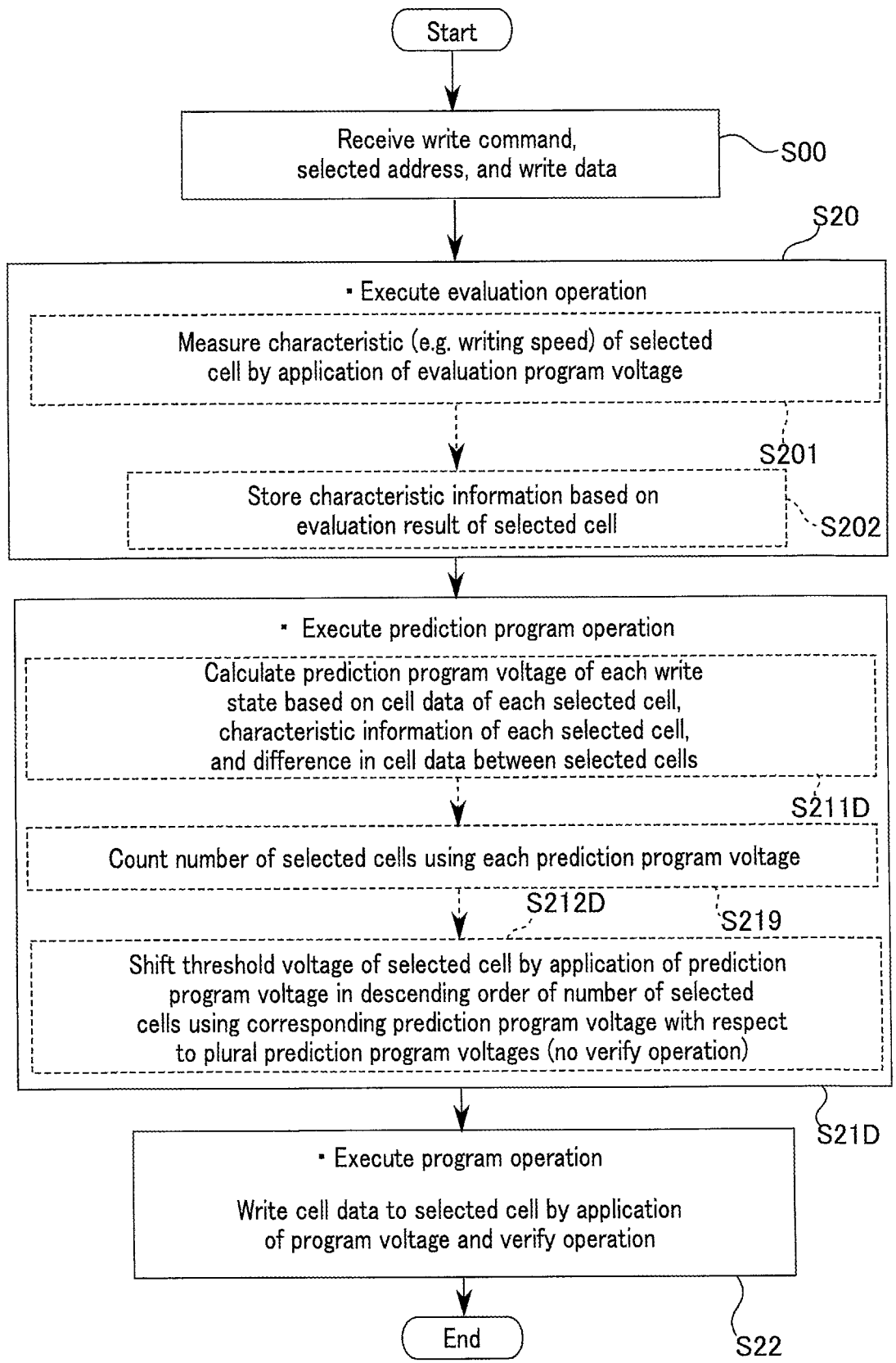
FIG. 45 is a flowchart illustrating the operation example of the memory device of the second embodiment.

FIG. 45 is a flowchart illustrating a processing flow of an example of the write operation of the flash memory of the present embodiment.

Figure 46:
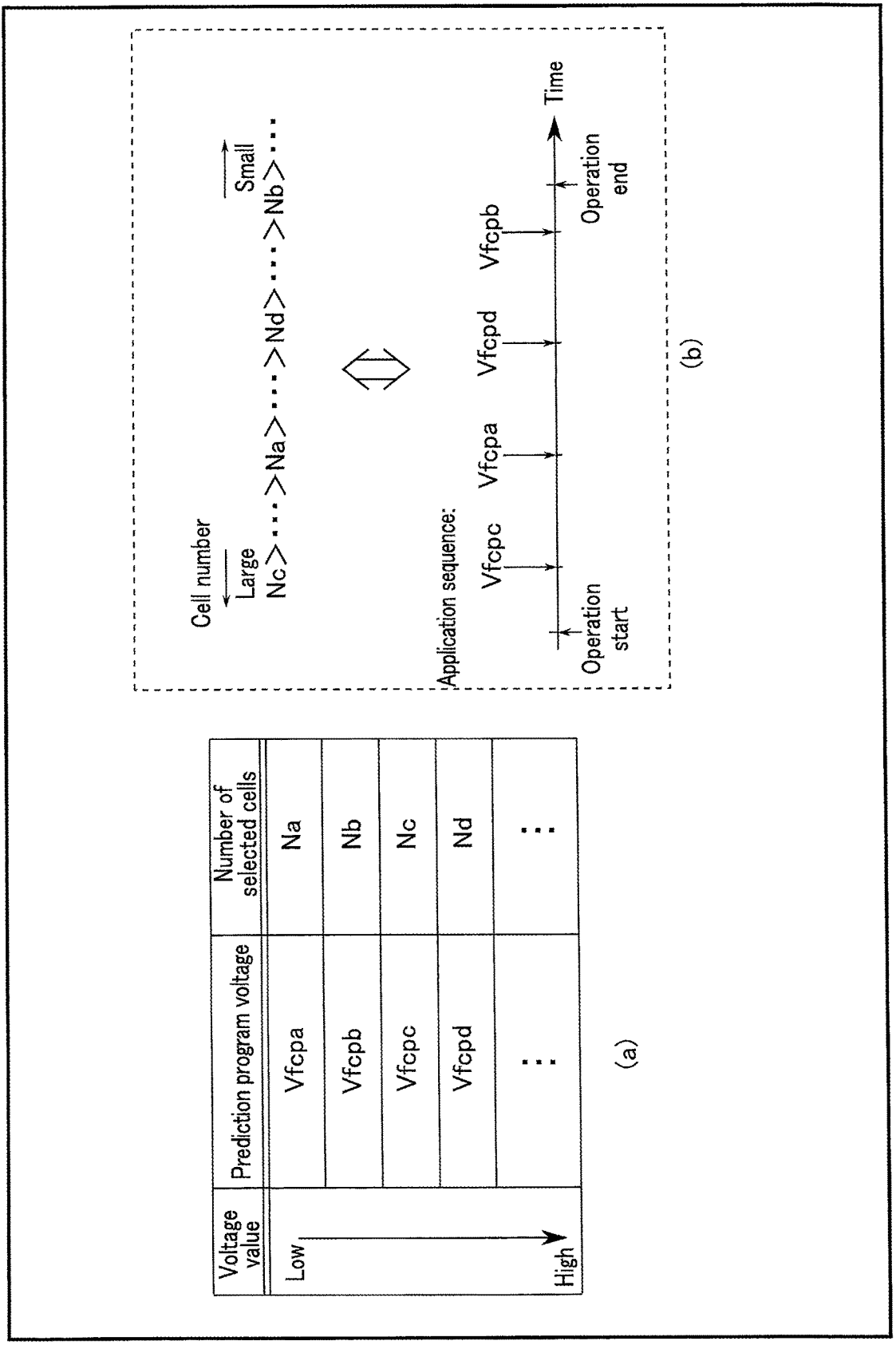
FIGS. 46 and 47 are diagrams for explaining the operation example of the memory device of the second embodiment.

FIG. 46 is a schematic diagram for explaining a change in the threshold voltage of the memory cell in an example of the write operation of the flash memory of the present embodiment.

Figure 47:
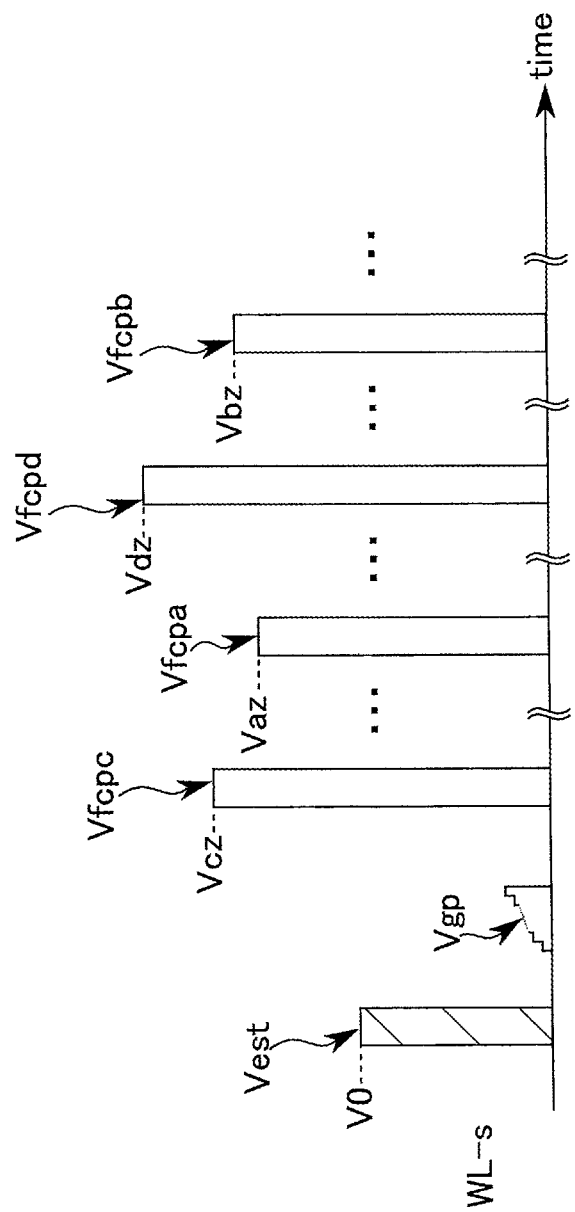

FIG. 47 is a schematic graph for explaining the voltage applied to the memory cell MC (selected word line) in an example of the write operation of the flash memory of the present embodiment. In FIG. 47, the horizontal axis of the graph corresponds to time, and the vertical axis of the graph corresponds to the voltage value.

As described above, the flash memory 1 of the present embodiment holds information related to the write state (cell data) of the selected cell and the target value of the program voltage.

Thus, the flash memory of the present embodiment can recognize the number of selected cells for each program voltage.

In the present operation example 4, in the program operation, the flash memory 1 of the present embodiment applies the plurality of program voltages to the selected word line in an order according to the number of selected cells based on the number of selected cells for each program voltage.

<S21D>

As illustrated in FIG. 45, after the evaluation operation (S20), the sequencer 190 executes the prediction operation by the prediction circuit 192.

Similarly to the above example, the sequencer 190 predicts and calculates the target value of the prediction program voltage Vfcp based on a difference between the write state of each of the selected cells MC-s, the writing speed of each of the selected cells MC-s, and the write state of the adjacent selected cells MC-s (S211D). In this example, the target value of the prediction program voltage Vfcp may be predicted without using the difference in the write state of the adjacent selected cells.

In the present operation example 4, the flash memory 1 of the present embodiment counts the number of selected cells programmed using each of the prediction program voltages Vfcp with respect to the plurality of obtained prediction program voltages Vfcp (Vfcpa, Vfcpb, Vfcpc, Vfcpd, . . . ) (S219).

The sequencer 190 sets an application sequence of the plurality of prediction program voltages based on a magnitude relationship of the number of selected cells using each of the prediction program voltages Vfcp.

FIG. 46 is a diagram illustrating a relationship between the write state and the number of selected cells. In the example of FIG. 46, as illustrated in (a) of FIG. 46, the number of selected cells using the prediction program voltage Vfcpa among the plurality of prediction program voltages is "Na". The number of selected cells using the prediction program voltage Vfcpb is "Nb". The number of selected cells using the prediction program voltage Vfcpc is "Nc". The number of selected cells using the prediction program voltage Vfcpd is "Nd".

As illustrated in (b) of FIG. 46, in the number of selected cells using each prediction program voltage, the cell number Nc is larger than the other cell numbers Na, Nb, and Nd. The cell number Na is smaller than the cell number Nc and larger than the cell numbers Nd and Nb. The cell number Nd is larger than the cell number Nb.

As illustrated in FIGS. 46 and 47, the sequencer 190 applies the plurality of prediction program voltages Vfcp to the selected word line in the order of the prediction program voltage Vfcpc, the prediction program voltage Vfcpa, the prediction program voltage Vfpcd, and the prediction program voltage Vfcpb according to the magnitude relationship of the number of selected cells.

Regarding a magnitude relationship of the voltage values of the prediction program voltages Vfcpa, Vfcpb, Vfcpc, and Vfcpd, a voltage value Vdz of the prediction program voltage Vfcpd is higher than voltage values Vaz, Vbz, and Vcz of the prediction program voltages Vfcpa, Vfcpb, and Vfcpc. The voltage value Vcz of the prediction program voltage Vfcpc is lower than the voltage value Vdz of the prediction program voltage Vfcpd and higher than the voltage values Vaz and Vbz of the prediction program voltages Vfcpa and Vfcpb. The voltage value Vbz of the prediction program voltage Vfcpb is lower than the voltage values Vcz and Vdz of the prediction program voltages Vfcpc and Vfcpd and higher than the voltage value Vaz of the prediction program voltage Vfcpa. The voltage value Vaz of the prediction program voltage Vfcpa is lower than the voltage values Vbz, Vcz, and Vdz of the prediction program voltages Vfcpb, Vfcpc, and Vfcpd.

As illustrated in FIG. 45, the sequencer 190 executes application of the plurality of prediction program voltages without program verify in the order of the number of selected cells using each of the prediction program voltages Vfcp (S212D).

The flash memory 1 applies the prediction program voltage Vfcpc to the selected word line WL-s at a certain timing. After the application of the prediction program voltage Vfcpc, the sequencer 190 applies the prediction program voltage Vfcpa to the selected word line WL-s at a certain timing. After the application of the prediction program voltage Vfcpa, the flash memory 1 applies the prediction program voltage Vfcpd to the selected word line WL-s at a certain timing. After the application of the prediction program voltage Vfcpa, the flash memory 1 applies the prediction program voltage Vfcpb to the selected word line WL-s at a certain timing.

As described above, in the prediction program operation of this operation example, the sequencer 190 applies the plurality of prediction program voltages Vfcp to the selected word line WL-s in the order based on the magnitude relationship of the number of selected cells using each of the prediction program voltages Vfcp, without depending on the order of the magnitude relationship (the level of the write state) of the voltage values of the plurality of prediction program voltages Vfcp.

<S22>

After the prediction operation, the sequencer 190 executes the fine program operation (S22).

For example, similarly to the above operation example, the sequencer 190 sequentially performs application of the program voltage and program verify in the order from the lower write state (in this case, the "A" state) to the upper write state (in this case, the "G" state).

In the fine program operation, similarly to the prediction program operation, the application sequence of the program voltage may be set according to the number of selected cells.

Through the above operation, the write sequence of the flash memory 1 of the present embodiment in the present operation example 4 is completed.

As described above, in the present operation example 4, the flash memory 1 of the present embodiment determines the application sequence of the plurality of prediction program voltages according to the number of selected cells using each prediction program voltage.

As a result, the flash memory 1 of the present embodiment can reduce the number of selected cells in which the threshold voltage of the selected cell whose threshold voltage has been shifted may fluctuate due to the application of the subsequent prediction program voltage.

As a result, in this operation example, the flash memory of the present embodiment can suppress a write error.

(b2-5) Operation Example 5

An example of the write operation of the flash memory of the present embodiment will be described with reference to FIGS. 48 and 49.

Figure 48:
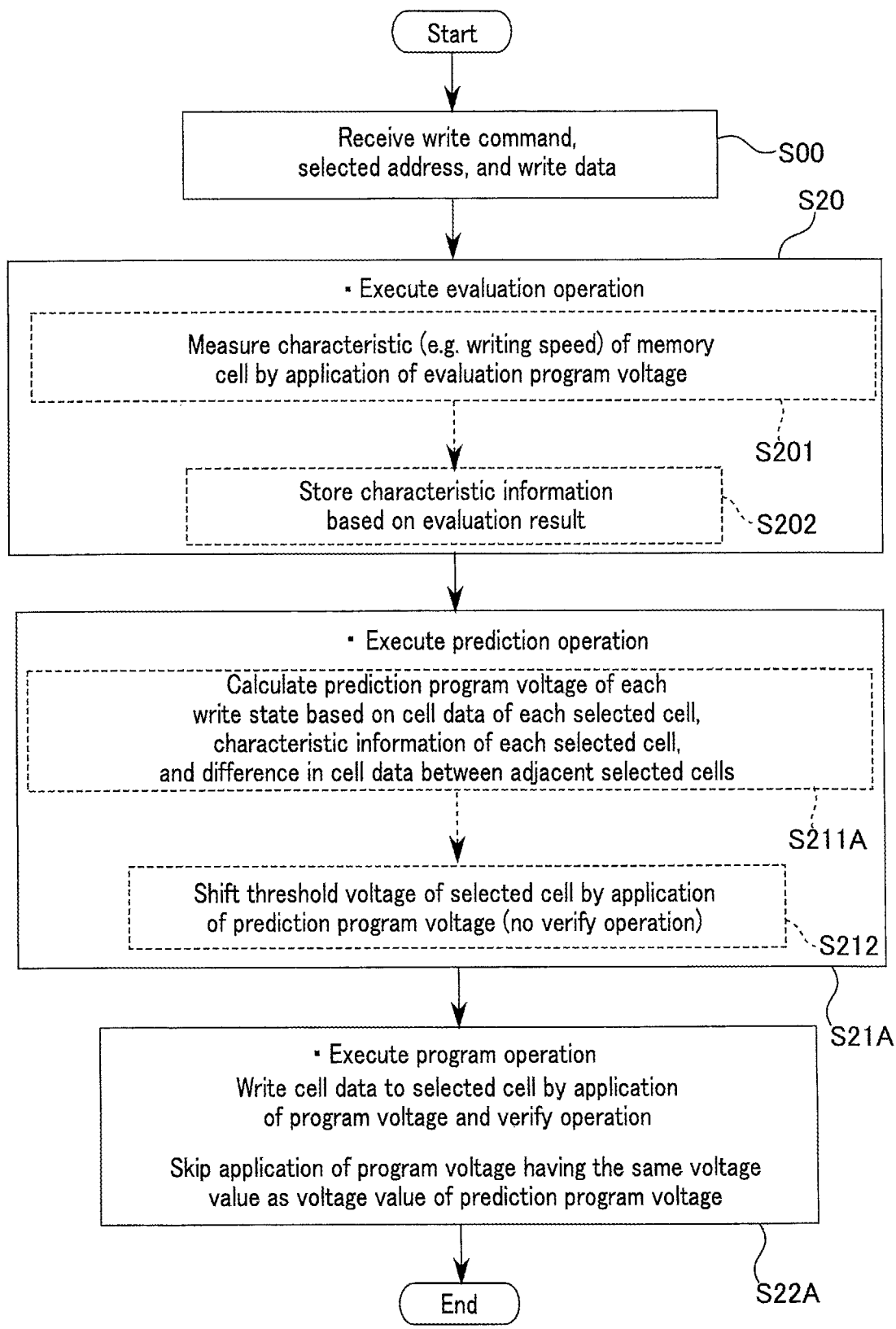
FIG. 48 is a flowchart illustrating the operation example of the memory device of the second embodiment.

FIG. 48 is a flowchart illustrating a processing flow of an example of the write operation of the flash memory of the present embodiment.

Figure 49:
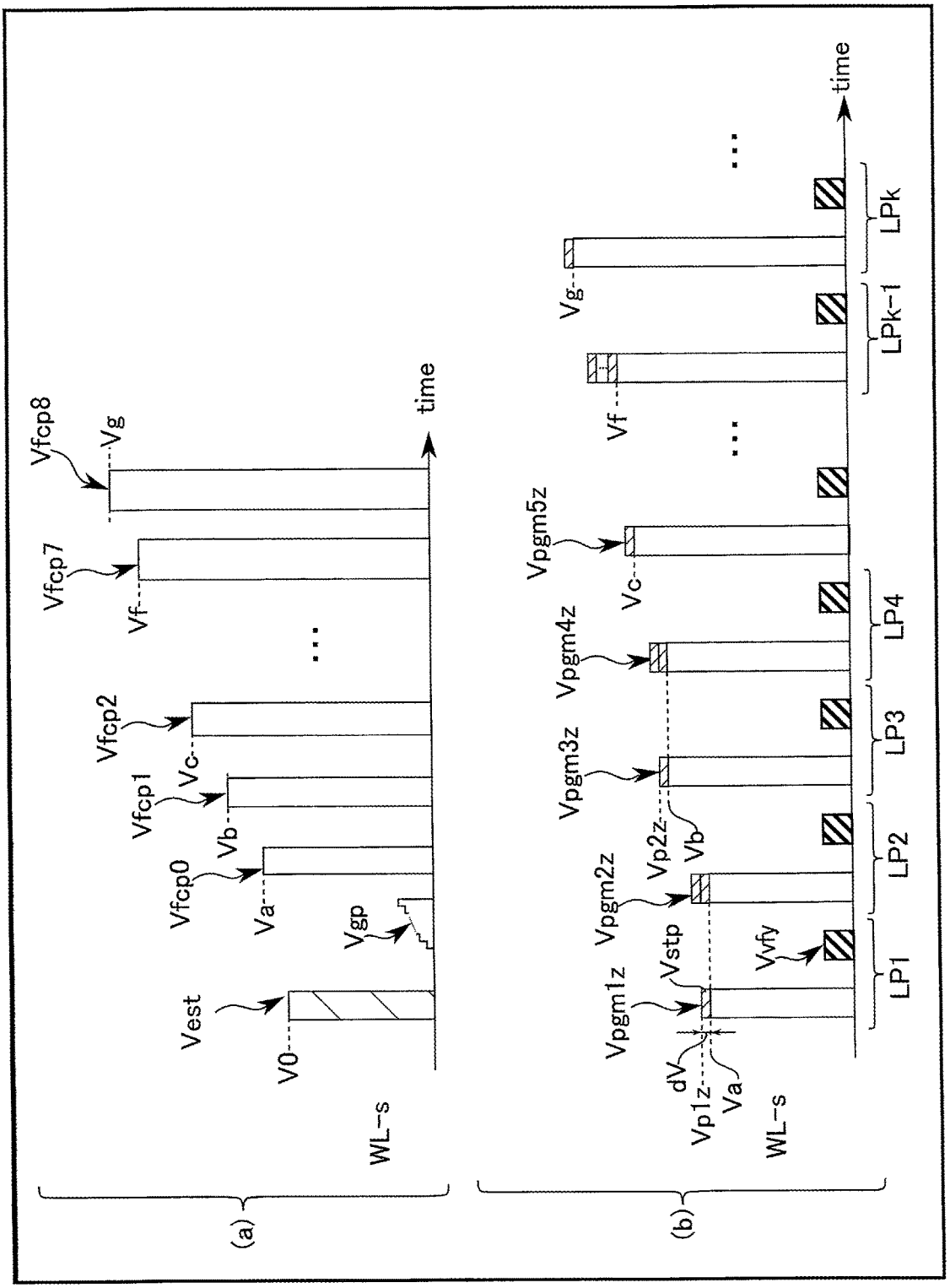
FIG. 49 is a diagram for explaining the operation example of the memory device of the second embodiment.

FIG. 49 is a schematic graph for explaining the voltage applied to the memory cell MC (selected word line) in an example of the write operation of the flash memory of the present embodiment. In FIG. 49, the horizontal axis of the graph corresponds to time, and the vertical axis of the graph corresponds to the voltage value.

<S20>

As illustrated in FIG. 48, in the present operation example 5, the sequencer 190 executes the evaluation operation for the plurality of selected cells MC-s similarly to the above-described operation example.

As a result, the writing speed of the selected cell MC-s is measured (S201).

The sequencer 190 acquires information on the writing speed based on a measurement result by the evaluation circuit 192 (S202).

<S21A>

The sequencer 190 executes the prediction operation similarly to the above-described operation.

The sequencer 190 calculates the target value of the prediction program voltage Vfcp based on the difference between the cell data of each of the selected cells MC-s, the writing speed of each of the selected cells MC-s, and the write state of the adjacent selected cells MC-s.

(S211A)

The sequencer 190 determines the target value of the prediction program voltage Vfcp using a calculation result (S212). In this operation example, the target value of the prediction program voltage Vfcp may be predicted without using the difference in the write state between the adjacent selected cells.

The sequencer 190 applies the plurality of determined prediction program voltages Vfcp to the selected word line WL-s.

As illustrated in (a) of FIG. 49, during the prediction program operation, the prediction program voltages Vfcp0, Vfcp1, Vfcp2, . . . , Vfcp7, Vfcp8, and . . . are applied to the selected word line WL-s.

As a result, the threshold voltage of each of the selected cells MC-s shifts in the positive direction according to the corresponding prediction program voltage.

For example, the prediction program voltage Vfcp0 has the voltage value Va. The prediction program voltage Vfcp1 has the voltage value Vb. The prediction program voltage Vfcp2 has the voltage value Vc. The prediction program voltage Vfcp7 has the voltage value Vf. The prediction program voltage Vfcp8 has the voltage value Vg.

<S22A>

After the prediction operation, the sequencer 190 executes the fine program operation.

In the present operation example 5, the sequencer 190 does not use the voltage value (target value) used during the fine program operation and the prediction program operation.

In the fine program operation, one or more program voltages Vpgm having a voltage value different from the voltage value of one or more prediction program voltages Vfcp used in the prediction program operation are applied to the selected word line WL-s.

However, the voltage value of the program voltage Vpgm is set based on the voltage value calculated by the prediction operation, similarly to the above example.

In the present operation example 5, the program voltage having the same voltage value as the voltage value of the prediction program voltage applied to the selected word line WL-s in the prediction program operation is skipped during the fine program operation.

As illustrated in (b) of FIG. 49, the plurality of program voltages Vpgm are applied to the selected word line WL-s The sequencer 190 applies a program voltage Vpgm1z having a voltage value Vp1z to the selected word line WL-s. The voltage value Vp1z is higher than the voltage value Va. For example, when the voltage value Via is higher by "dV" than the voltage value V0a, the voltage value Vp1z has a value (Va+dV) obtained by adding the voltage value dV to the voltage value Va.

As described above, the sequencer 190 skips the application of the program voltage Vpgm having the voltage value Va by the addition of the step-up voltage Vstp.

The sequencer 190 applies the program voltage Vpgm2z to the selected word line WL-s after applying the program voltage Vpgm1z. The program voltage Vpgm2z is higher than the voltage value Vp1z and lower than the voltage value Vb.

The sequencer 190 applies the program voltage Vpgm3z to the selected word line WL-s after applying the program voltage Vpgm2z. A voltage value Vp2z of the program voltage Vpgm3z is higher than the voltage value Vb. For example, the voltage value Vp2z has a voltage value (Vb+dV) obtained by adding the voltage value dV to the voltage value Vb.

As described above, the sequencer 190 skips the application of the program voltage having the voltage value Vb by the addition of the step-up voltage Vstp.

As described above, the sequencer 190 sequentially executes the application of the program voltage Vpgm and the program verify while skipping the application of the program voltage having the voltage value used during the prediction program operation.

With the above operation, the flash memory of the present embodiment ends the write sequence of the present operation example 5.

As in the present operation example 5, the flash memory of the present embodiment performs the fine program operation without applying the program voltage having the voltage value used in the prediction program operation again.

As a result, the number of program steps (the number of write loops) in the fine program operation is reduced. As a result, the period of the fine program operation is shortened.

Thus, the flash memory of the present embodiment can improve a speed of the write operation.

(c2) Summary

The flash memory of the present embodiment acquires the information on the characteristics (for example, the writing speeds) of the plurality of selected cells in the write operation.

The flash memory of the present embodiment calculates the voltage value suitable for the program voltage based on the cell data of each selected cell and the information on the characteristic of each selected cell.

The flash memory of the present embodiment executes the program operation using the calculated program voltage.

As a result, the flash memory of the present embodiment can shorten the period of the write operation. In addition, the flash memory of the present embodiment can reduce data write errors.

Accordingly, in the flash memory of the present embodiment, the operation characteristic can be improved.

As described above, the memory device of the present embodiment can improve quality.

(3) Modification

The structure of the flash memory that executes data writing described in the present embodiment is not limited to the structure described in the first embodiment. The data writing described in the present embodiment may be applied to writing of data in a flash memory having another structure. For example, the memory cell array may have a structure in which a plurality of memory cells are two-dimensionally arranged on a semiconductor substrate without stacking the plurality of memory cells in the Z direction.

A three-dimensional structure memory cell array may have a structure in which memory cells connected to a common word line are arranged in a direction parallel to a substrate surface.

The examples (structure examples and operation examples) described in the above embodiments may be appropriately combined as long as consistency is satisfied.

(4) Other

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   first and second layer stacks each including a plurality of first semiconductor layers arranged in a first direction perpendicular to a surface of the substrate, the first and second layer stacks arranged in a second direction parallel to the surface of the substrate;
   a plurality of word lines covering the first and second layer stacks;
   a second semiconductor layer provided above the first layer stack in the first direction;
   a third semiconductor layer provided above the second layer stack in the first direction;
   a plurality of memory cells provided between the first semiconductor layers and the word lines, respectively;
   a first transistor provided on the second semiconductor layer; and
   a second transistor provided on the third semiconductor layer, wherein the first and second layer stacks are arranged at a first pitch in the second direction, the first and second semiconductor layers are arranged at a second pitch in the second direction, and the second pitch is equal to the first pitch.

2. The memory device according to claim 1, wherein the first transistor includes a first gate electrode provided above the second semiconductor layer in the first direction, and a dimension of the first gate electrode in the second direction is equal to a dimension of the second semiconductor layer in the second direction.

3. The memory device according to claim 1, further comprising:

a plurality of select gate lines covering the first and second layer stacks; and a decode circuit configured to control the select gate lines, wherein the decode circuit includes the first and second transistors.

4. The memory device according to claim 1, further comprising:

a plurality of first contacts connected to each of the plurality of first semiconductor layers;

a plurality of bit lines respectively connected to the first contacts; and a selection circuit configured to control connection between the first contacts and the bit lines, wherein the selection circuit includes the first and second transistors.

5. The memory device according to claim 1, further comprising:

a plurality of bit lines connected to each of the plurality of first semiconductor layers; and an amplifier circuit configured to amplify signals from the plurality of memory cells, wherein the amplifier circuit includes the first and second transistors.

6. The memory device according to claim 1, further comprising:

a circuit configured to control writing of data to the plurality of memory cells, wherein when the data is written to memory cells connected to a word line, the circuit measures a characteristic of each of the memory cells, calculates a voltage value of each of program voltages to be applied to the word line based on the data and a measurement result of the characteristic, and applies the program voltages to the word line.

7. The memory device according to claim 6, wherein the characteristic is a writing speed of each of the plurality of memory cells.

8. The memory device according to claim 6, wherein the program voltages include a plurality of first program voltages based on the measurement result and a plurality of second program voltages set based on the plurality of first program voltages, when the plurality of first program voltages are applied, the circuit does not execute a verify operation related to threshold voltages of the memory cells, and when the plurality of second program voltages are applied, the circuit executes the verify operation.

9. The memory device according to claim 6, wherein the circuit calculates a voltage value of each of the program voltages based on a difference in the data between adjacent memory cells among the memory cells.

10. The memory device according to claim 6, wherein the data includes first data, second data, and third data, a number of a plurality of first memory cells to which the first data is written among the memory cells is a first number, a number of a plurality of second memory cells to which the second data is written among the memory cells is a second number, a number of a plurality of third memory cells to which the third data is written among the memory cells is a third number, the third number is larger than the second number, the second number is larger than the first number, and based on the first, second, and third numbers, the circuit applies a third program voltage for writing the third data to the plurality of third memory cells to the word line, applies a fourth program voltage for writing the second data to the plurality of second memory cells to the word line after applying the third program voltage, and applies a fifth program voltage for writing the first data to the plurality of first memory cells to the word line after applying the fourth program voltage.

11. The memory device according to claim 6, wherein the memory cells includes a plurality of fourth memory cells of a first group to which data corresponding to any one of a plurality of threshold voltage distributions equal to or more than a first threshold voltage is written, and a plurality of fifth memory cells of a second group to which data corresponding to any one of a plurality of threshold voltage distributions lower than the first threshold voltage is written, and the circuit measures a first characteristic of each of the fourth memory cells, calculates voltage values of a plurality of sixth program voltages applied to the word line, based on the data written to each of the fourth memory cells and a measurement result of the first characteristic, measures a second characteristic of each of the fifth memory cells, and calculates a voltage value of a plurality of seventh program voltages applied to the word line, based on the data written to each of the fifth memory cells and a measurement result of the second characteristic.

12. The memory device according to claim 6, wherein the memory cells are arranged in the first direction, the word line is connected to the memory cells arranged in the first direction, and when the data is written, the memory cells arranged in the first direction and commonly connected to the word line are simultaneously selected.

* * * * *